US011956312B2

(12) United States Patent
Cocagne et al.

(10) Patent No.: US 11,956,312 B2
(45) Date of Patent: Apr. 9, 2024

(54) TESTING A STORAGE UNIT IN A STORAGE NETWORK

(71) Applicant: Pure Storage, Inc., Mountain View, CA (US)

(72) Inventors: Thomas D. Cocagne, Elk Grove Village, IL (US); Jason K. Resch, Warwick, RI (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 18/172,228

(22) Filed: Feb. 21, 2023

(65) Prior Publication Data

US 2023/0208916 A1    Jun. 29, 2023

Related U.S. Application Data

(63) Continuation of application No. 17/651,614, filed on Feb. 18, 2022, now Pat. No. 11,606,431, which is a continuation-in-part of application No. 16/862,166, filed on Apr. 29, 2020, now Pat. No. 11,283,871, which is a continuation of application No.
(Continued)

(51) Int. Cl.
*G06F 15/167* (2006.01)
*G06F 16/182* (2019.01)
*H04L 67/1097* (2022.01)
*H04L 67/5682* (2022.01)
(Continued)

(52) U.S. Cl.
CPC ........ *H04L 67/1097* (2013.01); *G06F 16/182* (2019.01); *H04L 67/5682* (2022.05); *H04L 67/60* (2022.05); *H04L 67/62* (2022.05)

(58) Field of Classification Search
None
See application file for complete search history.

(56) References Cited

U.S. PATENT DOCUMENTS 4,092,732 A   5/1978  Ouchi
5,454,101 A   9/1995  Mackay
(Continued)

OTHER PUBLICATIONS

Chung; An Automatic Data Segmentation Method for 3D Measured Data Points; National Taiwan University; pp. 1-8; 1998.
(Continued)

*Primary Examiner* — Phuoc H Nguyen
(74) *Attorney, Agent, or Firm* — Garlick & Markison; Timothy D. Taylor

(57) ABSTRACT

A method for execution by one or more computing devices of a storage network includes identifying a storage unit of a set of storage units for testing, where a data segment of data is error encoded into a set of encoded data slices that is stored in the set of storage units. The method further includes determining whether a threshold number of favorably performing other storage units of the set of storage units will be available during the testing. When the threshold number of favorably performing other storage units will be available, the method further includes initiating the testing of the storage unit and setting a status of the storage unit to unavailable. When the testing has been completed, the method further includes updating the status of the storage unit to available. The method further includes generating a testing report regarding the testing of the storage unit.

20 Claims, 65 Drawing Sheets

Related U.S. Application Data

16/256,649, filed on Jan. 24, 2019, now Pat. No. 10,673,946, which is a continuation-in-part of application No. 15/805,085, filed on Nov. 6, 2017, now Pat. No. 10,205,783, which is a continuation of application No. 14/721,723, filed on May 26, 2015, now Pat. No. 9,838,478, which is a continuation-in-part of application No. 14/707,943, filed on May 8, 2015, now Pat. No. 9,923,838.

(60) Provisional application No. 62/031,320, filed on Jul. 31, 2014, provisional application No. 62/019,074, filed on Jun. 30, 2014.

(51) Int. Cl.
*H04L 67/60* (2022.01)
*H04L 67/62* (2022.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers |
| 5,802,364 | A | 9/1998 | Senator |
| 5,809,285 | A | 9/1998 | Hilland |
| 5,890,156 | A | 3/1999 | Rekieta |
| 5,987,622 | A | 11/1999 | Lo Verso |
| 5,991,414 | A | 11/1999 | Garay |
| 6,012,159 | A | 1/2000 | Fischer |
| 6,058,454 | A | 5/2000 | Gerlach |
| 6,128,277 | A | 10/2000 | Bruck |
| 6,175,571 | B1 | 1/2001 | Haddock |
| 6,192,472 | B1 | 2/2001 | Garay |
| 6,256,688 | B1 | 7/2001 | Suetaka |
| 6,272,658 | B1 | 8/2001 | Steele |
| 6,301,604 | B1 | 10/2001 | Nojima |
| 6,356,949 | B1 | 3/2002 | Katsandres |
| 6,366,995 | B1 | 4/2002 | Vilkov |
| 6,374,336 | B1 | 4/2002 | Peters |
| 6,415,373 | B1 | 7/2002 | Peters |
| 6,418,539 | B1 | 7/2002 | Walker |
| 6,449,688 | B1 | 9/2002 | Peters |
| 6,567,948 | B2 | 5/2003 | Steele |
| 6,571,282 | B1 | 5/2003 | Bowman-Amuah |
| 6,609,223 | B1 | 8/2003 | Wolfgang |
| 6,651,070 | B1 | 11/2003 | Hirashima |
| 6,718,361 | B1* | 4/2004 | Basani ............ H04L 67/1095 709/201 |
| 6,760,808 | B2 | 7/2004 | Peters |
| 6,785,768 | B2 | 8/2004 | Peters |
| 6,785,783 | B2 | 8/2004 | Buckland |
| 6,826,711 | B2* | 11/2004 | Moulton ............ G06F 11/1076 714/E11.034 |
| 6,879,596 | B1 | 4/2005 | Dooply |
| 7,003,688 | B1* | 2/2006 | Pittelkow ............ G06F 11/2089 714/4.2 |
| 7,024,451 | B2 | 4/2006 | Jorgenson |
| 7,024,609 | B2 | 4/2006 | Wolfgang |
| 7,080,101 | B1 | 7/2006 | Watson |
| 7,103,824 | B2 | 9/2006 | Halford |
| 7,103,915 | B2 | 9/2006 | Redlich |
| 7,111,115 | B2 | 9/2006 | Peters |
| 7,140,044 | B2 | 11/2006 | Redlich |
| 7,146,644 | B2 | 12/2006 | Redlich |
| 7,171,493 | B2 | 1/2007 | Shu |
| 7,222,133 | B1 | 5/2007 | Raipurkar |
| 7,240,236 | B2 | 7/2007 | Cutts |
| 7,272,613 | B2 | 9/2007 | Sim |
| 7,636,724 | B2 | 12/2009 | De La Torre |
| 8,275,744 | B2 | 9/2012 | Baptist |
| 11,347,590 | B1* | 5/2022 | Resch ............ G06F 11/0727 |
| 11,487,620 | B1* | 11/2022 | Volvovski ............ G06F 11/0709 |
| 2002/0062422 | A1 | 5/2002 | Butterworth |
| 2002/0166079 | A1 | 11/2002 | Ulrich |
| 2003/0018927 | A1 | 1/2003 | Gadir |
| 2003/0037261 | A1 | 2/2003 | Meffert |
| 2003/0065617 | A1 | 4/2003 | Watkins |
| 2003/0084020 | A1 | 5/2003 | Shu |
| 2004/0024963 | A1 | 2/2004 | Talagala |
| 2004/0030771 | A1 | 2/2004 | Strassner |
| 2004/0122917 | A1 | 6/2004 | Menon |
| 2004/0215998 | A1 | 10/2004 | Buxton |
| 2004/0228493 | A1 | 11/2004 | Ma |
| 2005/0100022 | A1 | 5/2005 | Ramprashad |
| 2005/0102297 | A1 | 5/2005 | Lloyd |
| 2005/0114594 | A1 | 5/2005 | Corbett |
| 2005/0125593 | A1 | 6/2005 | Karpoff |
| 2005/0131993 | A1 | 6/2005 | Fatula, Jr. |
| 2005/0132070 | A1 | 6/2005 | Redlich |
| 2005/0144382 | A1 | 6/2005 | Schmisseur |
| 2005/0229069 | A1 | 10/2005 | Hassner |
| 2006/0047907 | A1 | 3/2006 | Shiga |
| 2006/0136448 | A1 | 6/2006 | Cialini |
| 2006/0156059 | A1 | 7/2006 | Kitamura |
| 2006/0224603 | A1 | 10/2006 | Correll, Jr. |
| 2007/0079081 | A1 | 4/2007 | Gladwin |
| 2007/0079082 | A1 | 4/2007 | Gladwin |
| 2007/0079083 | A1 | 4/2007 | Gladwin |
| 2007/0088970 | A1 | 4/2007 | Buxton |
| 2007/0174192 | A1 | 7/2007 | Gladwin |
| 2007/0214285 | A1 | 9/2007 | Au |
| 2007/0234110 | A1 | 10/2007 | Soran |
| 2007/0283167 | A1 | 12/2007 | Venters, II |
| 2009/0094251 | A1 | 4/2009 | Gladwin |
| 2009/0094318 | A1 | 4/2009 | Gladwin |
| 2010/0023524 | A1 | 1/2010 | Gladwin |
| 2011/0106972 | A1 | 5/2011 | Grube et al. |
| 2011/0185258 | A1 | 7/2011 | Grube et al. |
| 2012/0089809 | A1 | 4/2012 | Resch |
| 2012/0311068 | A1 | 12/2012 | Gladwin et al. |
| 2013/0110962 | A1 | 5/2013 | Grube |
| 2013/0111166 | A1 | 5/2013 | Resch |
| 2013/0151670 | A1 | 6/2013 | Leggette |
| 2013/0275480 | A1 | 10/2013 | Dhuse |
| 2013/0290482 | A1 | 10/2013 | Leggette |
| 2013/0290703 | A1 | 10/2013 | Resch |
| 2013/0322418 | A1 | 12/2013 | Ho |
| 2014/0115579 | A1 | 4/2014 | Kong |
| 2014/0164551 | A1 | 6/2014 | Resch |
| 2014/0195875 | A1 | 7/2014 | Resch |
| 2014/0245063 | A1 | 8/2014 | Baptist |
| 2014/0330921 | A1 | 11/2014 | Storm |
| 2015/0067421 | A1 | 3/2015 | Baptist |
| 2015/0242272 | A1* | 8/2015 | Resch ............... G06F 3/0619 714/764 |
| 2016/0179618 | A1 | 6/2016 | Resch |
| 2016/0378350 | A1 | 12/2016 | Motwani |
| 2017/0168720 | A1 | 6/2017 | Kazi |
| 2019/0095344 | A1* | 3/2019 | Gladwin ............ G06F 3/067 |
| 2022/0091937 | A1* | 3/2022 | Baptist ............ G06F 3/0619 |
| 2023/0267042 | A1* | 8/2023 | Shirley, Jr. ........... G06F 3/0619 714/764 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

(56) References Cited

OTHER PUBLICATIONS

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4151; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Technical Specification Road Map; IETF Network Working Group; RFC 4510; Jun. 2006; pp. 1-8.

\* cited by examiner

DST allocation info 242: data partition info 320; data ID; No. of partitions; Addr. info for each partition; format conversion indication

| | | task execution info 322 | | | intermediate result info 324 | | |
|---|---|---|---|---|---|---|---|
| task 326 | task ordering 328 | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1_4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 & 1_5 | R1-1_1 - R1-1_z &<br>R1-5_1 - R1-5_z | 1_2, 2_2, 3_2, 4_2, & 5_2 | R1-6 | DST unit 2 | DST unit 2 | DST units 2-6 |
| 1_7 | after 1_2 & 1_5 | R1-2_1 - R1-2_z &<br>R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

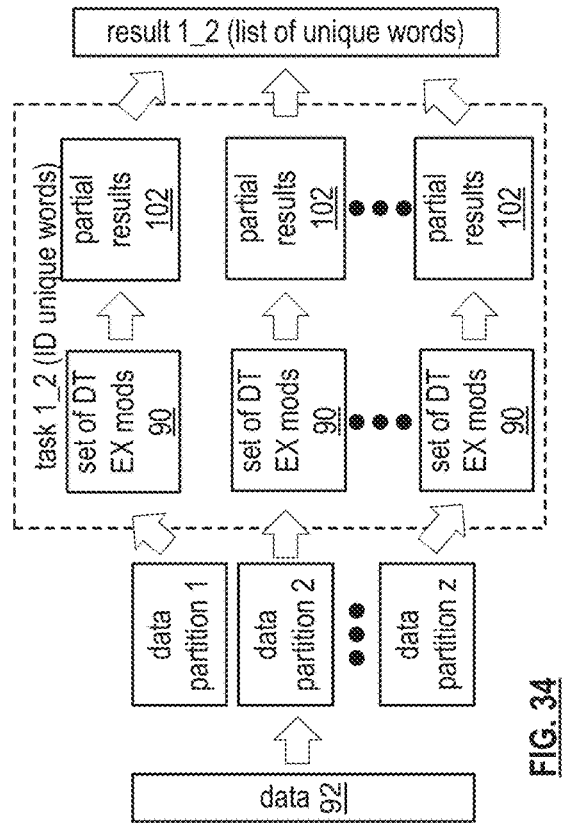
FIG. 34
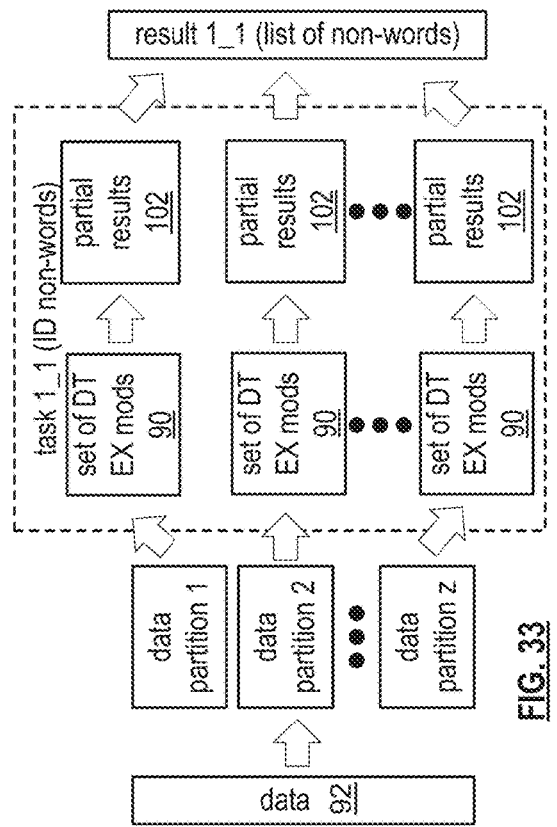
FIG. 33
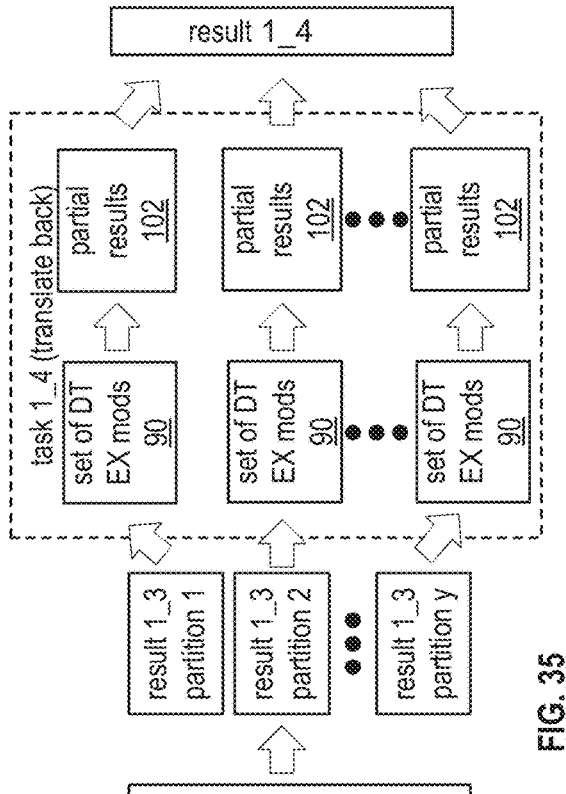
FIG. 35
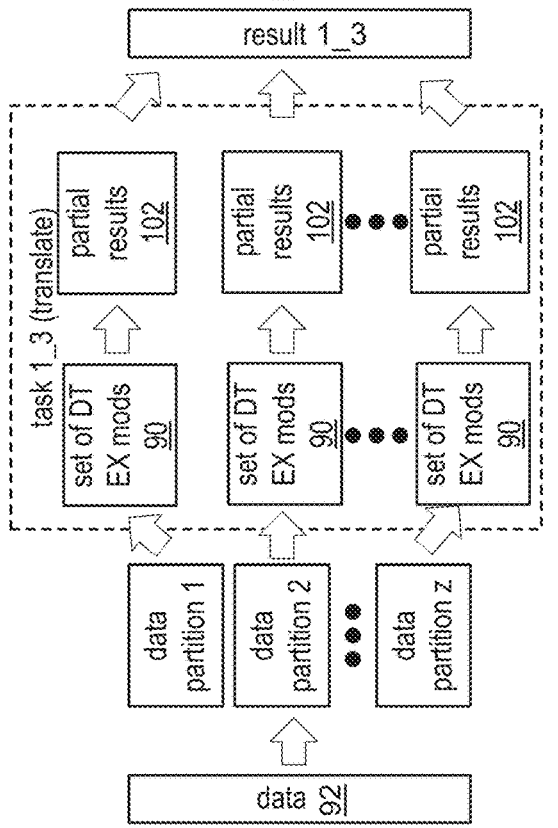

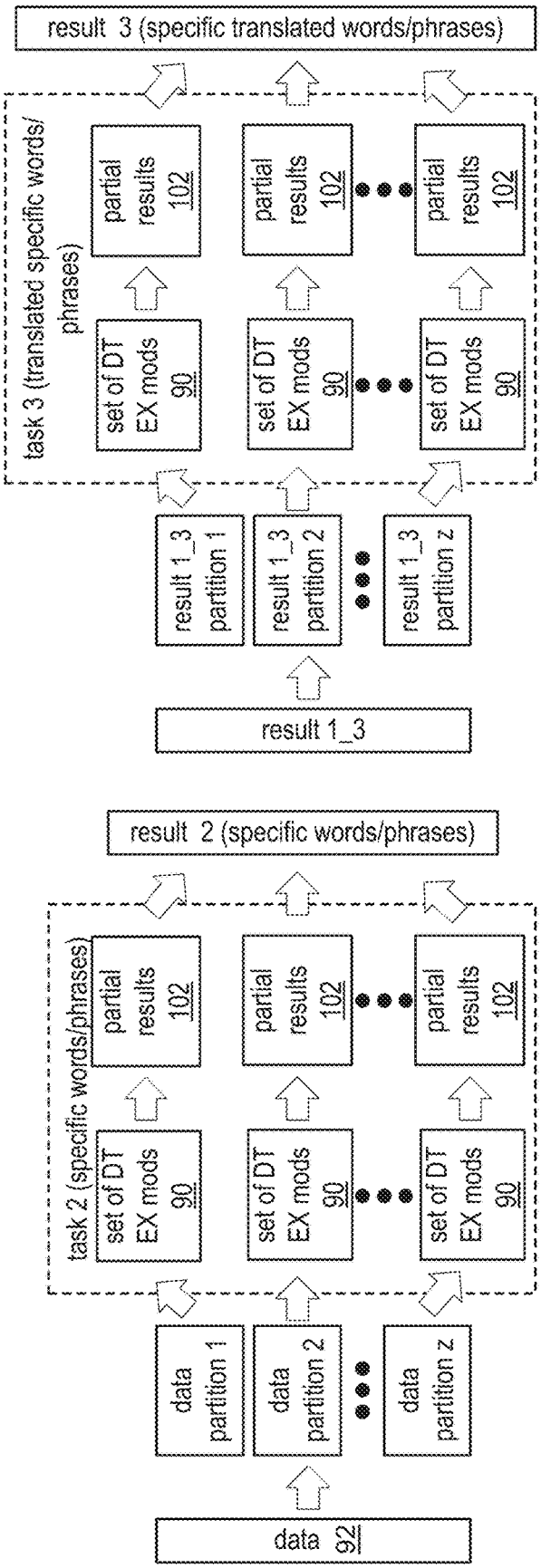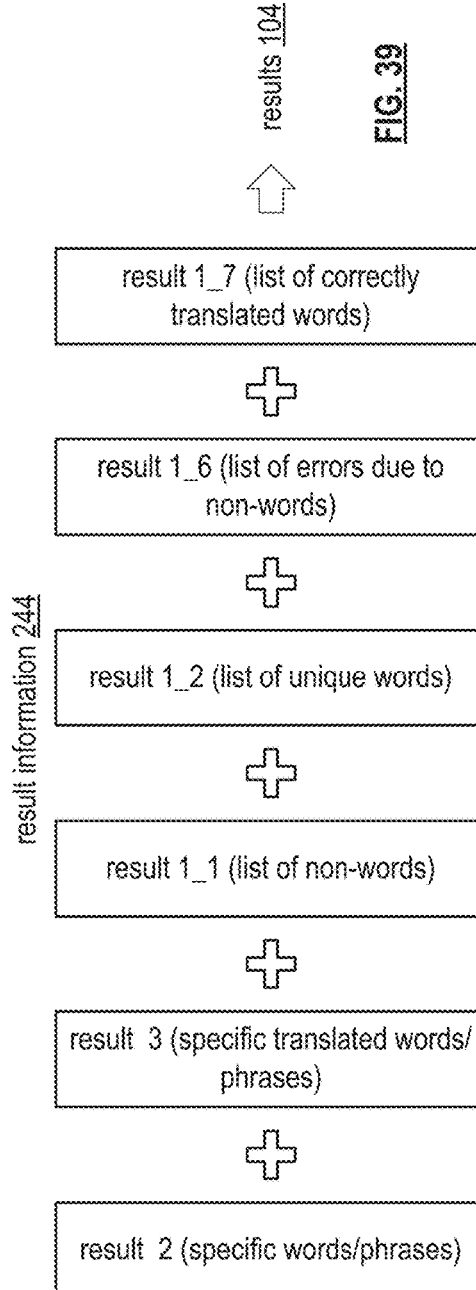

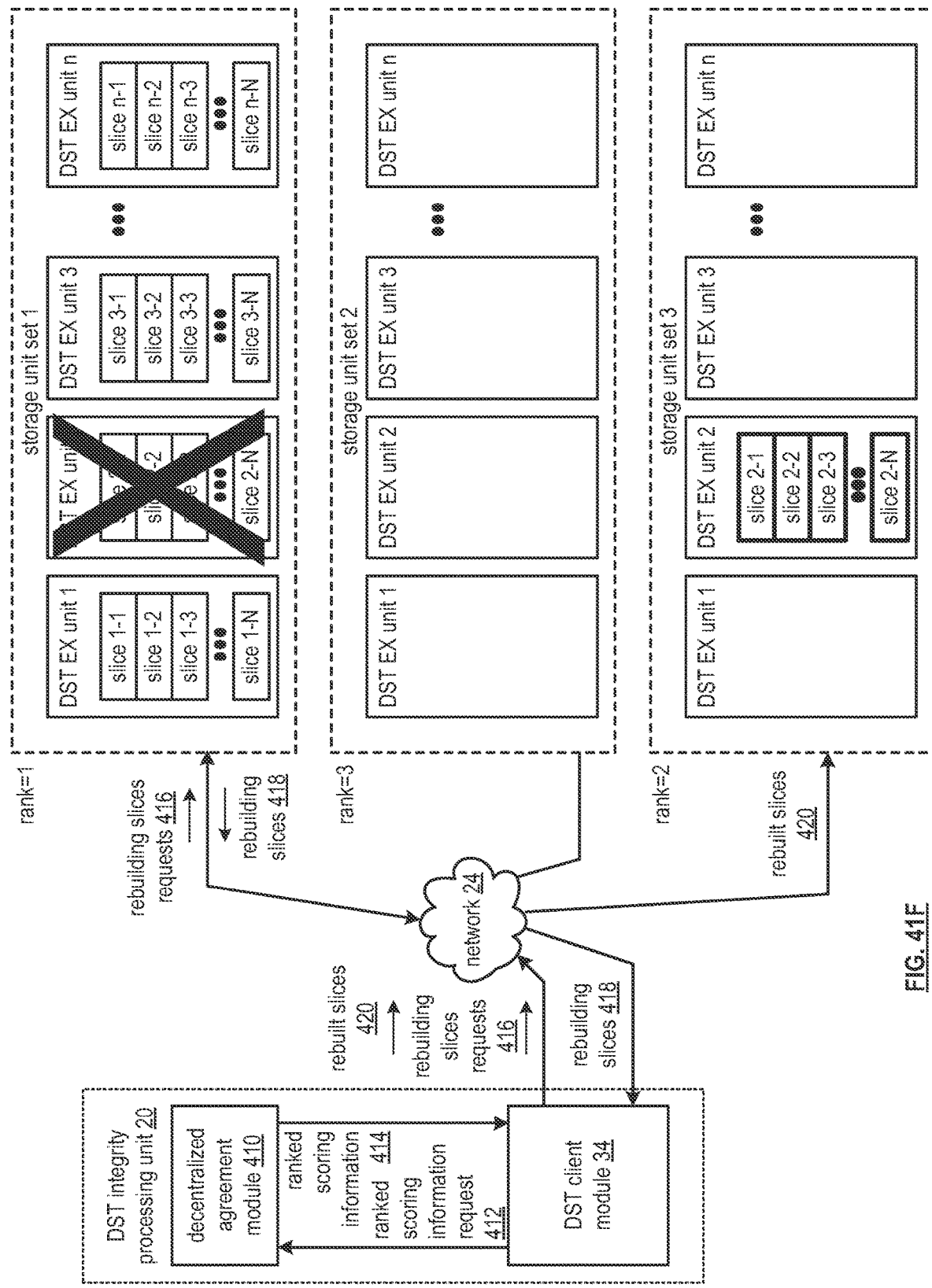

TESTING A STORAGE UNIT IN A STORAGE NETWORK

CROSS REFERENCE TO RELATED PATENTS

The present U.S. Utility Patent application claims priority pursuant to 35 U.S.C. § 120 as a continuation of U.S. Utility Application No. 17/651,614, entitled "MAINTAINING FAILURE INDEPENDENCE FOR STORAGE OF A SET OF ENCODED DATA SLICES", filed Feb. 18, 2022, which is a continuation-in-part of U.S. Utility application Ser. No. 16/862,166, entitled "PROCESSING DATA ACCESS REQUESTS FOR DIFFERENT TYPES OF DATA USING A DECENTRALIZED AGREEMENT PROTOCOL", filed Apr. 29, 2020, issued as U.S. Pat. No. 11,283,871 on Mar. 22, 2022, which is a continuation of U.S. Utility application Ser. No. 16/256,649, entitled "USING SEPARATE WEIGHTING SCORES FOR DIFFERENT TYPES OF DATA IN A DECENTRALIZED AGREEMENT PROTOCOL", filed Jan. 24, 2019, issued as U.S. Pat. No. 10,673,946 on Jun. 2, 2020, which is a continuation-in-part of U.S. Utility application Ser. No. 15/805,085, entitled "IDENTIFYING A TASK EXECUTION RESOURCE OF A DISPERSED STORAGE NETWORK", filed Nov. 6, 2017, issued as U.S. Pat. No. 10,205,783 on Feb. 12, 2019, which is a continuation of U.S. Utility application Ser. No. 14/721,723, entitled "IDENTIFYING A TASK EXECUTION RESOURCE OF A DISPERSED STORAGE NETWORK", filed May 26, 2015, issued as U.S. Pat. No. 9,838,478 on Dec. 5, 2017, which claims priority pursuant to U.S.C. § 119(e) to U.S. Provisional Application No. 62/031,320, entitled "REBUILDING DATA IN A DISPERSED STORAGE NETWORK", filed Jul. 31, 2014, all of which are hereby incorporated herein by reference in their entirety and made part of the present U.S. Utility Patent Application for all purposes.

U.S. Utility patent application Ser. No. 14/721,723 also claims priority pursuant to 35 U. S. C. § 120 as a continuation-in-part of U.S. Utility application Ser. No. 14/707,943, entitled "ACCESSING A DISPERSED STORAGE NETWORK", filed May 8, 2015, issued as U.S. Pat. No. 9,923,838 on Mar. 20, 2018, which claims priority pursuant to 35 U.S.C. § 119(e) to U.S. Provisional Application No. 62/019,074, entitled "UTILIZING A DECENTRALIZED AGREEMENT PROTOCOL IN A DISPERSED STORAGE NETWORK", filed Jun. 30, 2014, both of which are hereby incorporated herein by reference in their entirety and made part of the present U.S. Utility Patent Application for all purposes.

STATEMENT REGARDING FEDERALLY SPONSORED RESEARCH OR DEVELOPMENT—NOT APPLICABLE

INCORPORATION-BY-REFERENCE OF MATERIAL SUBMITTED ON A COMPACT DISC—NOT APPLICABLE

BACKGROUND OF THE INVENTION

Technical Field of the Invention

This invention relates generally to computer networks and more particularly to testing storage units of a storage network.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers. In addition to cloud computing, a computer may use "cloud storage" as part of its memory system. As is known, cloud storage enables a user, via its computer, to store files, applications, etc., on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

Figure 41A:
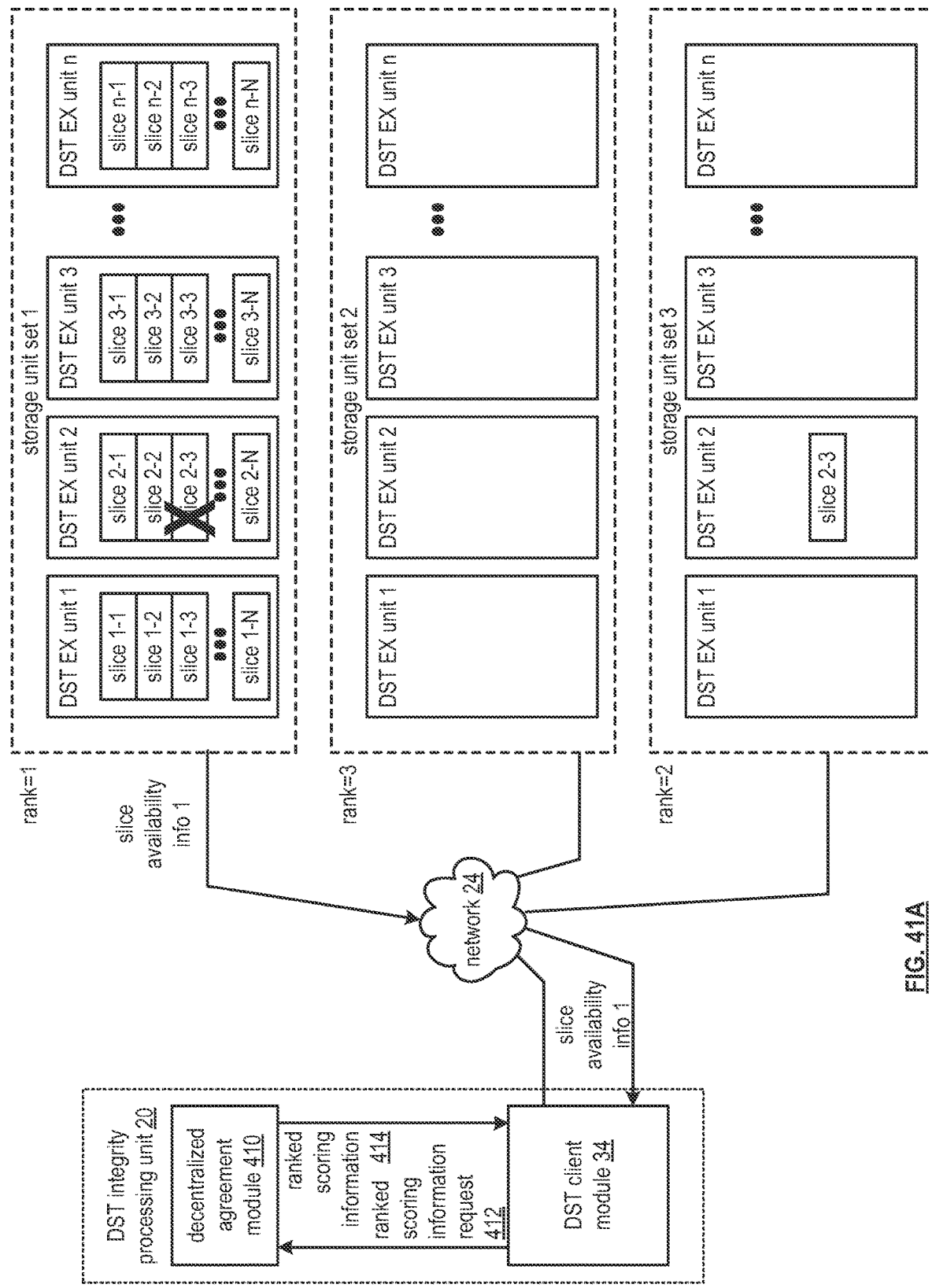
Figure 41B:
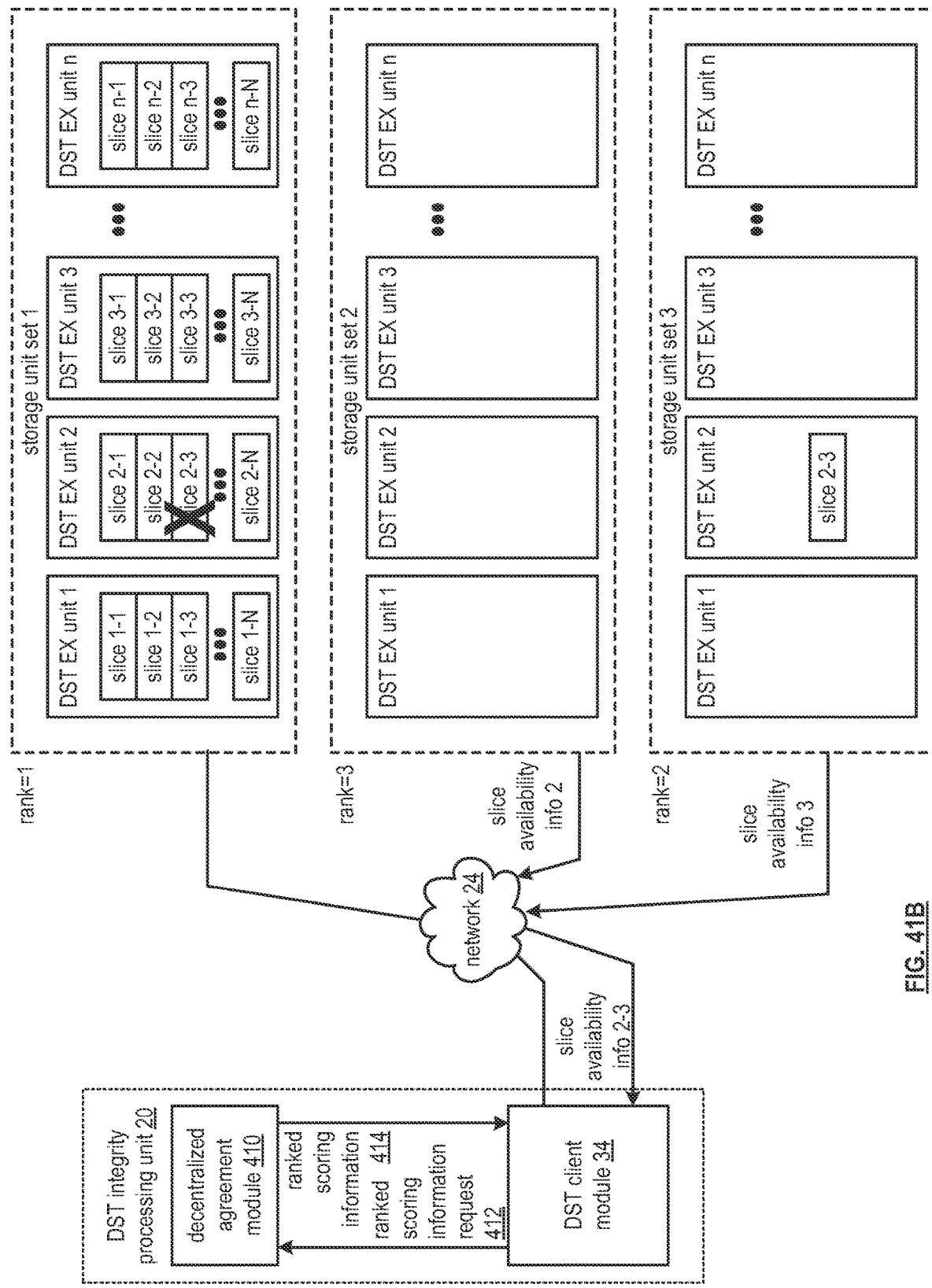
Figure 41C:
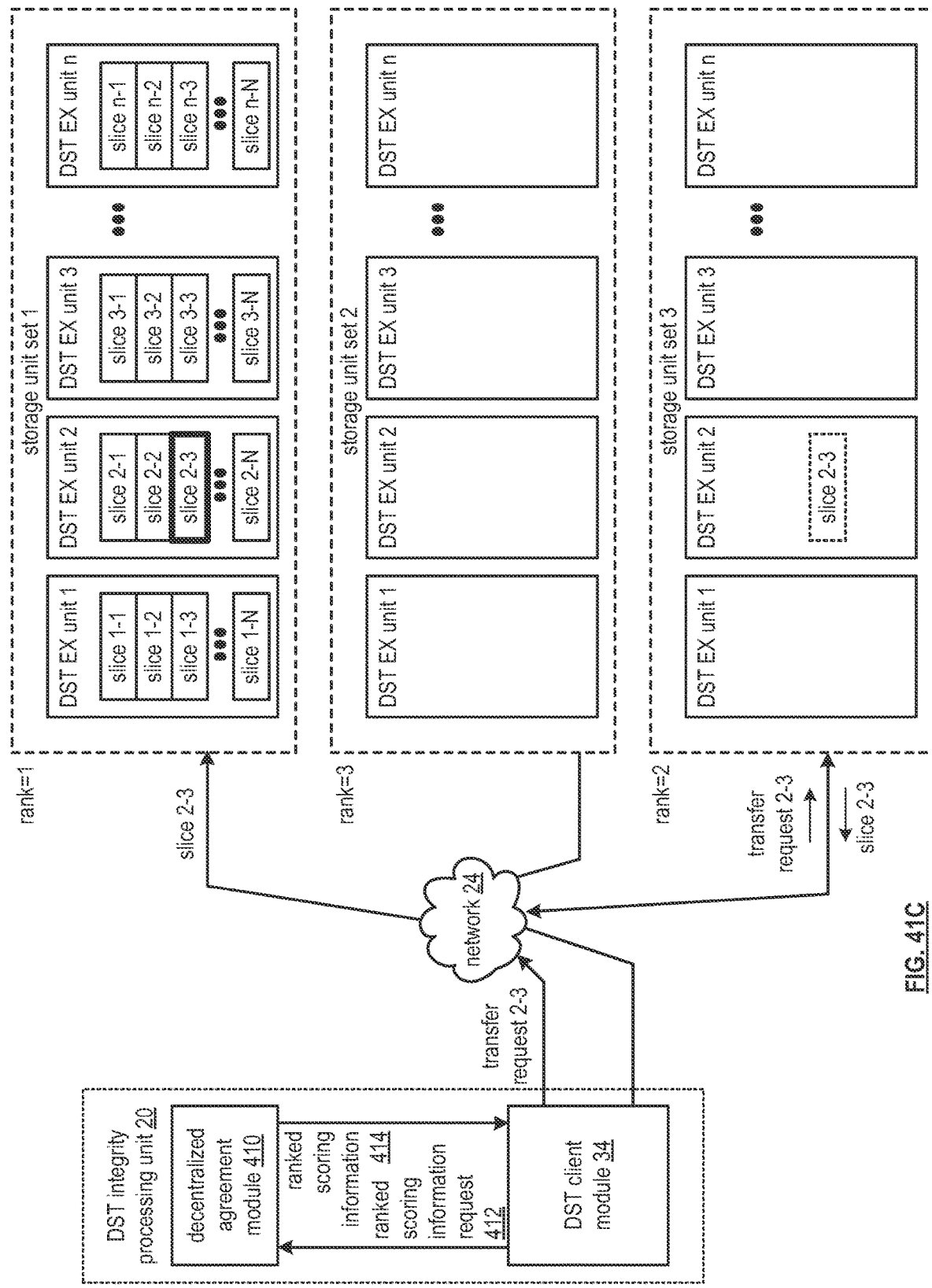
Figure 41D:
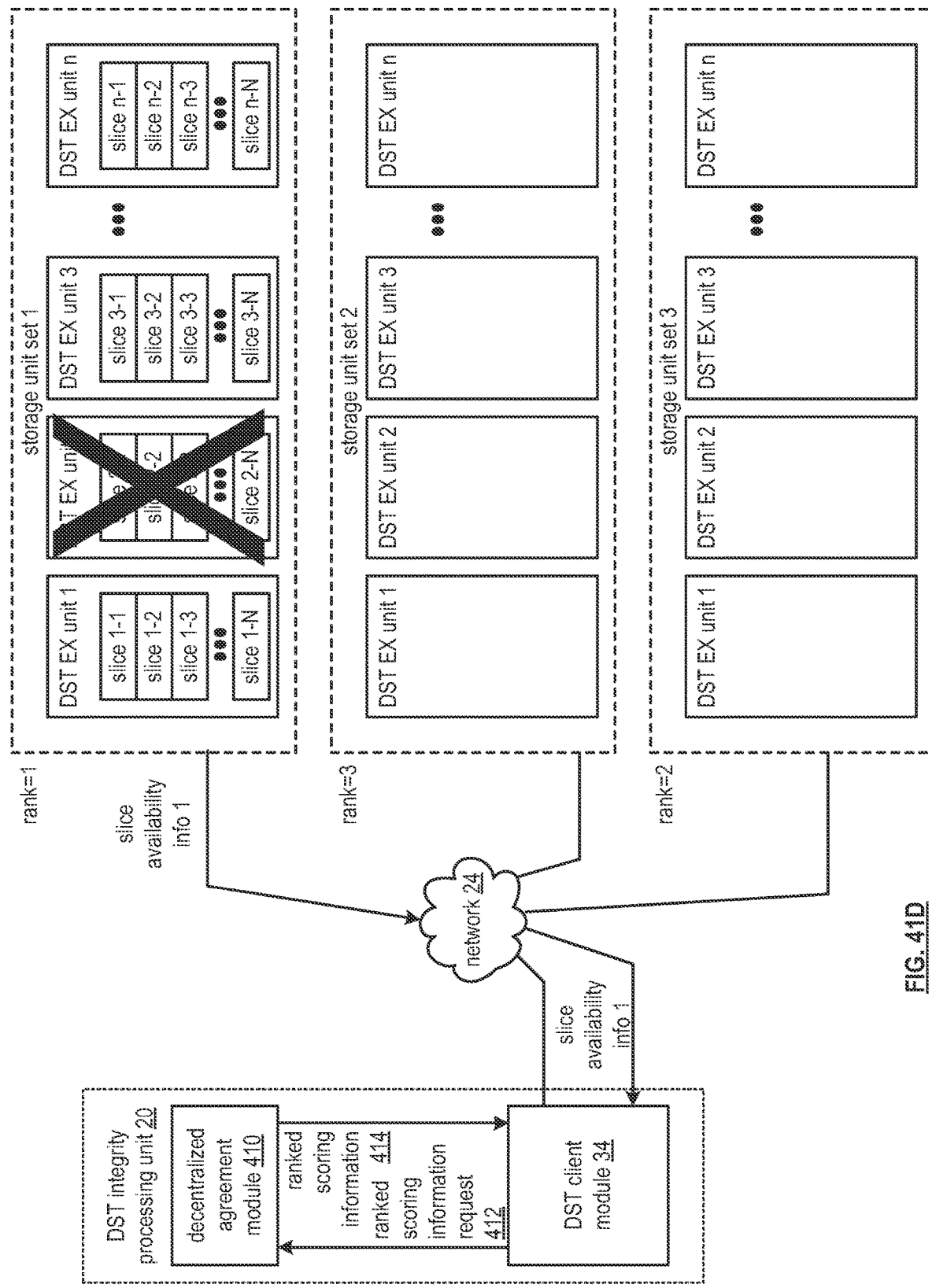
Figure 41E:
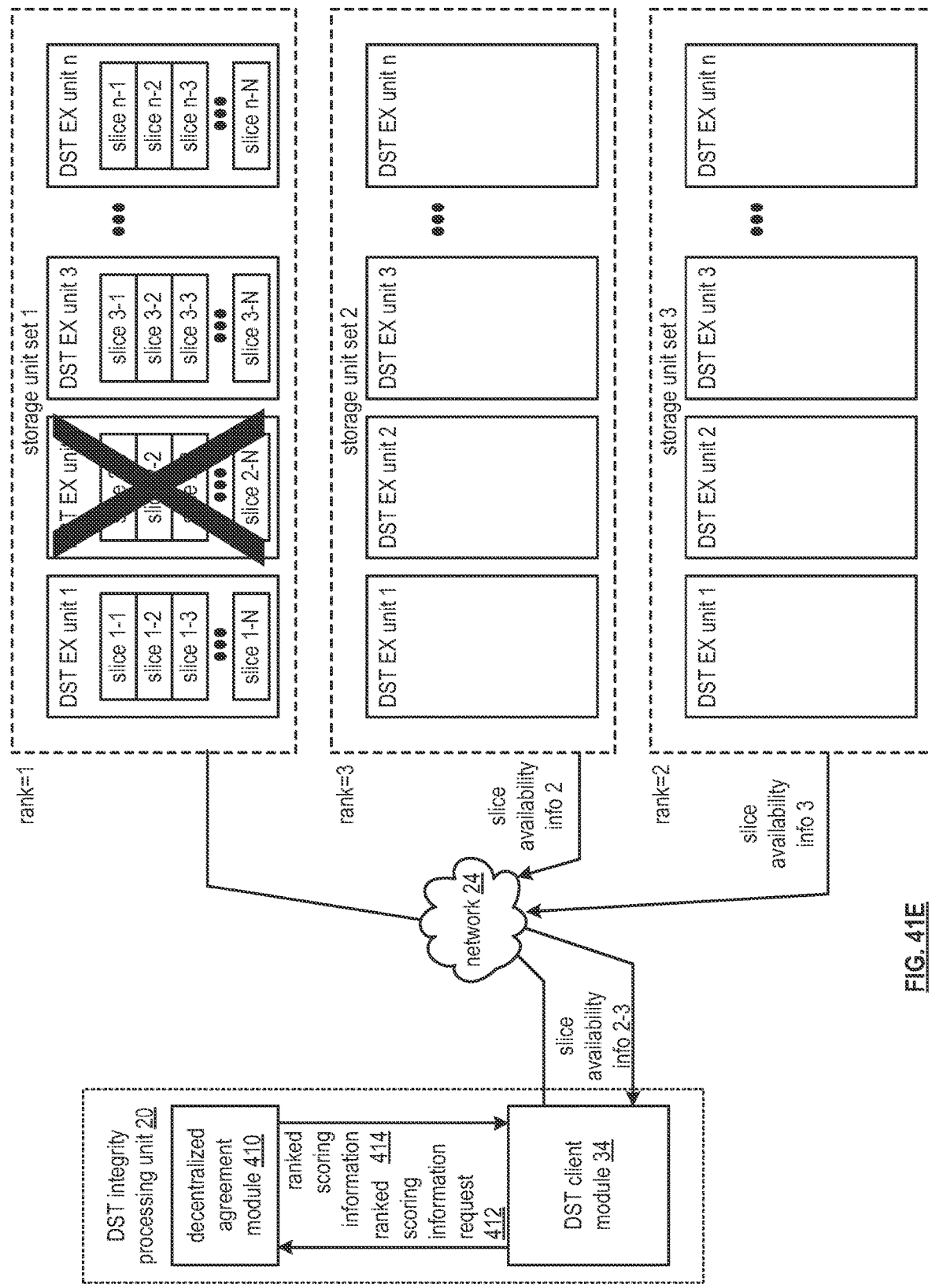
Figure 41G:
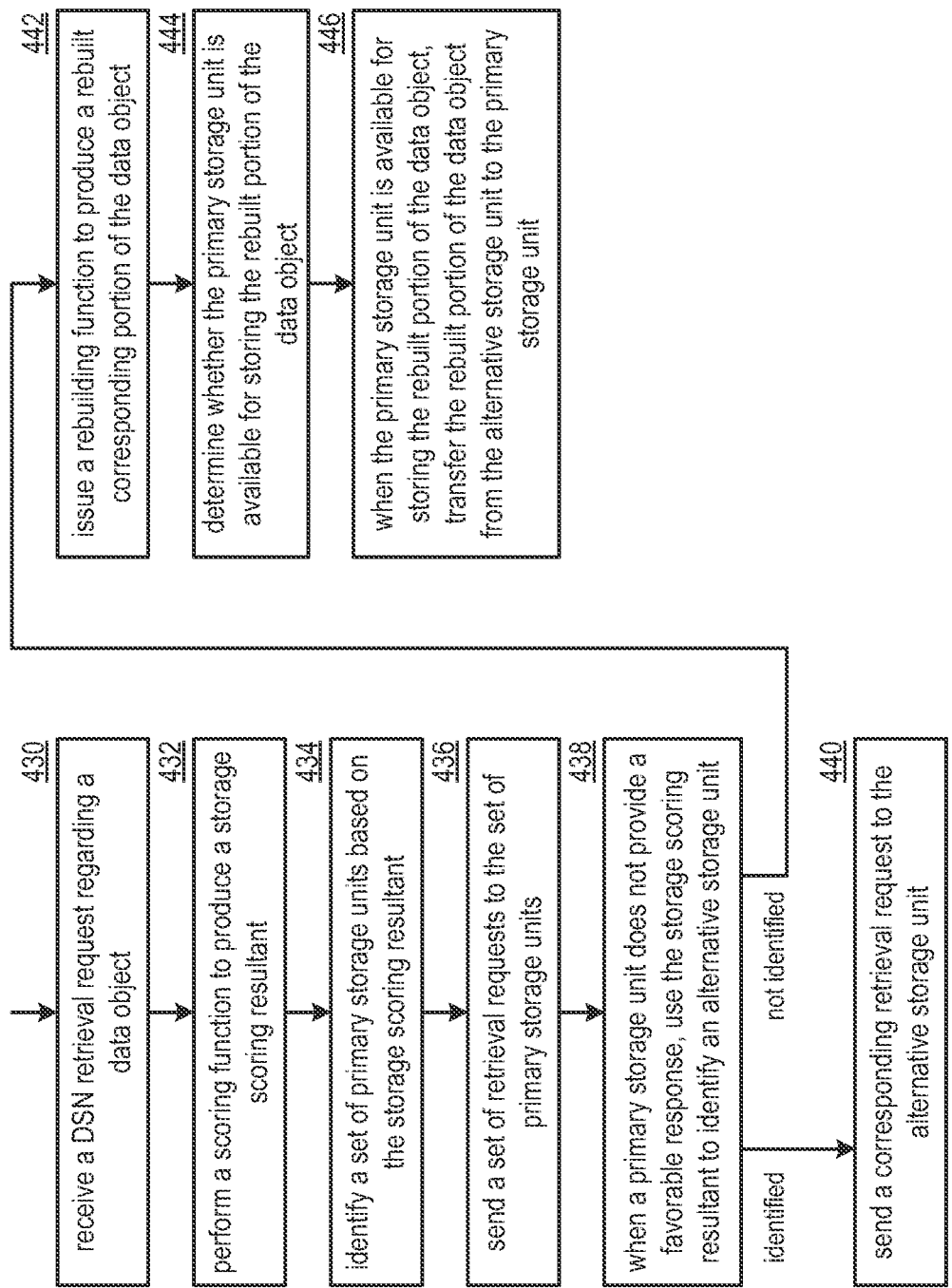
Figure 42A:
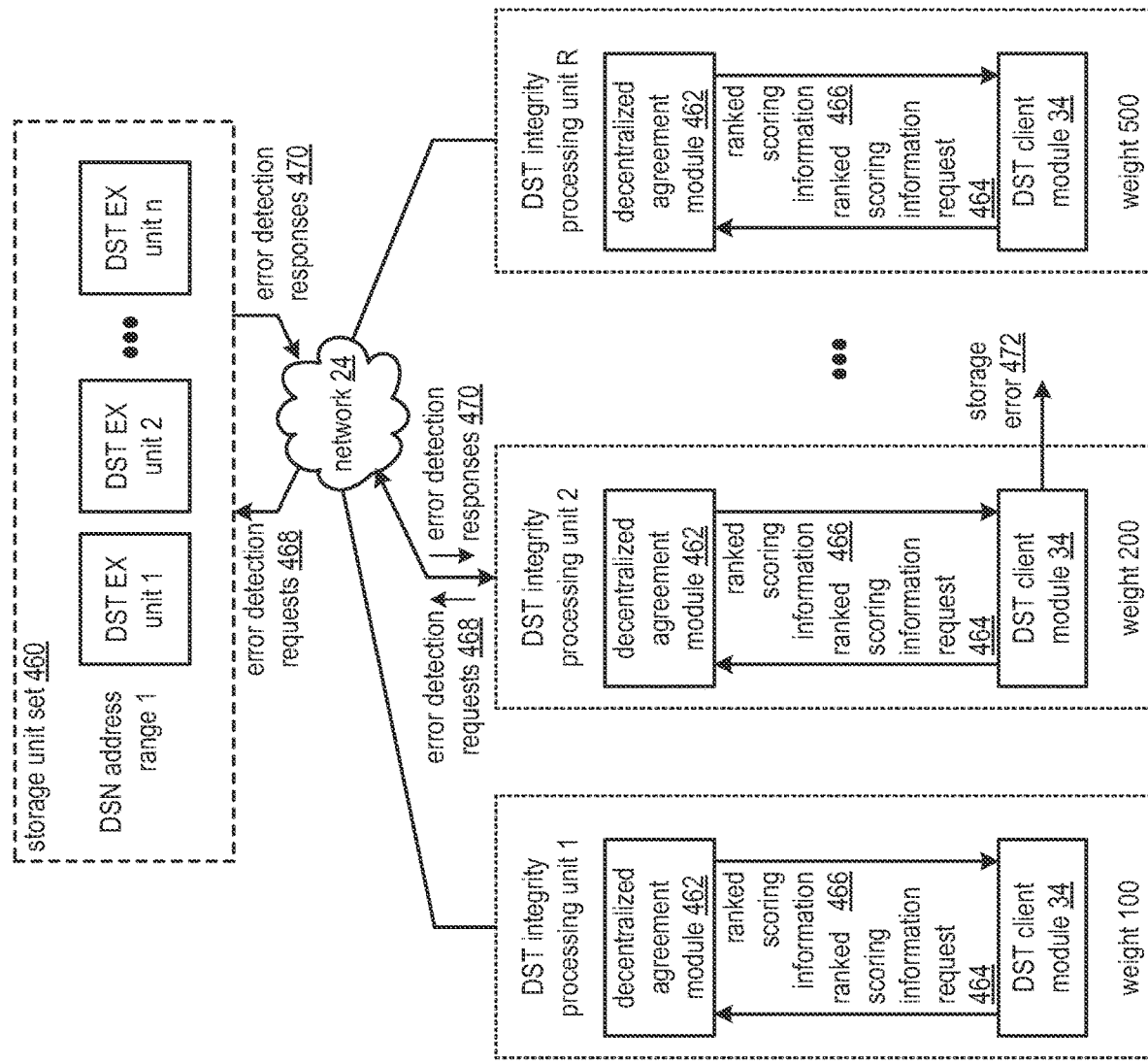
Figure 42B:
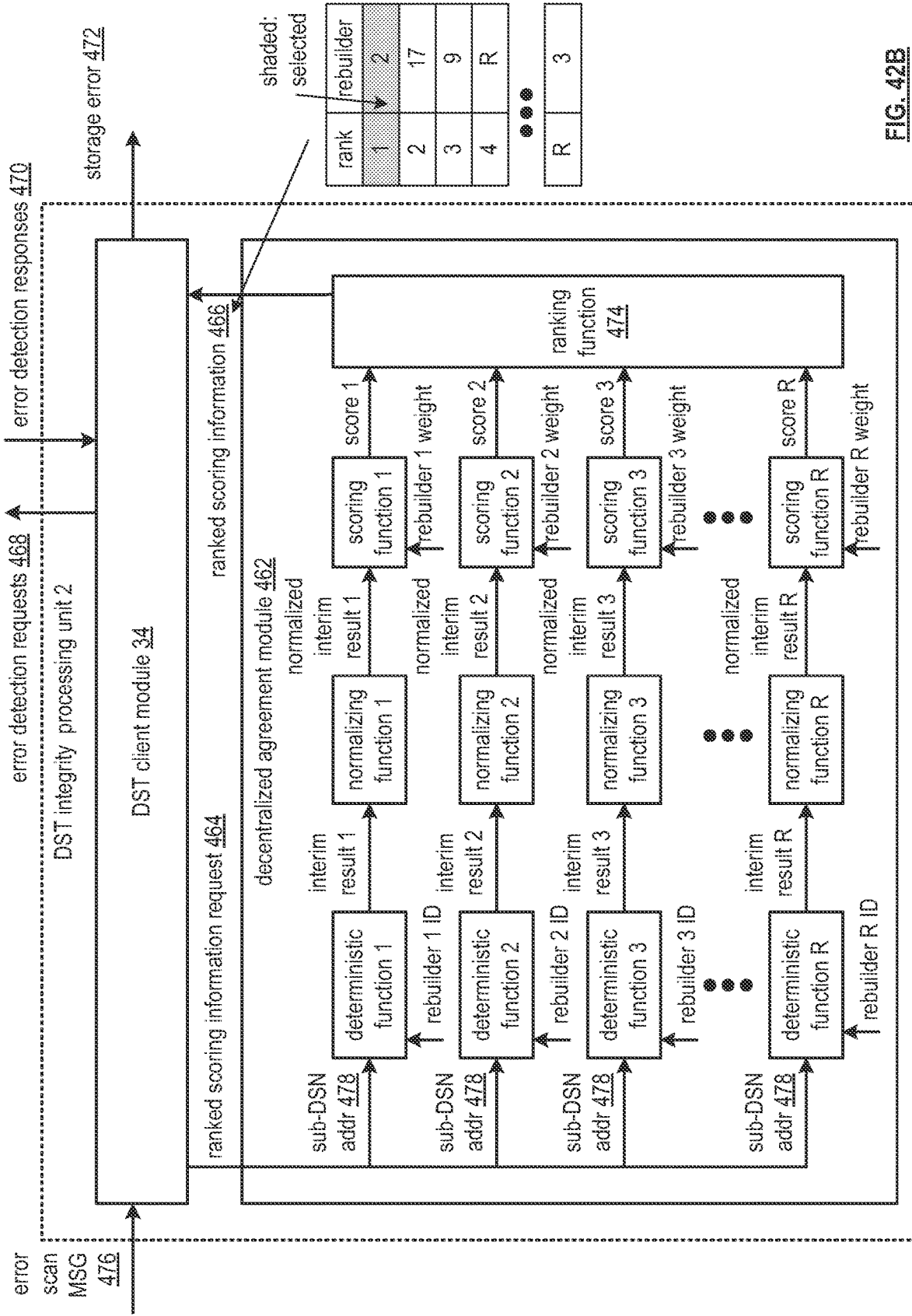
Figure 42C:
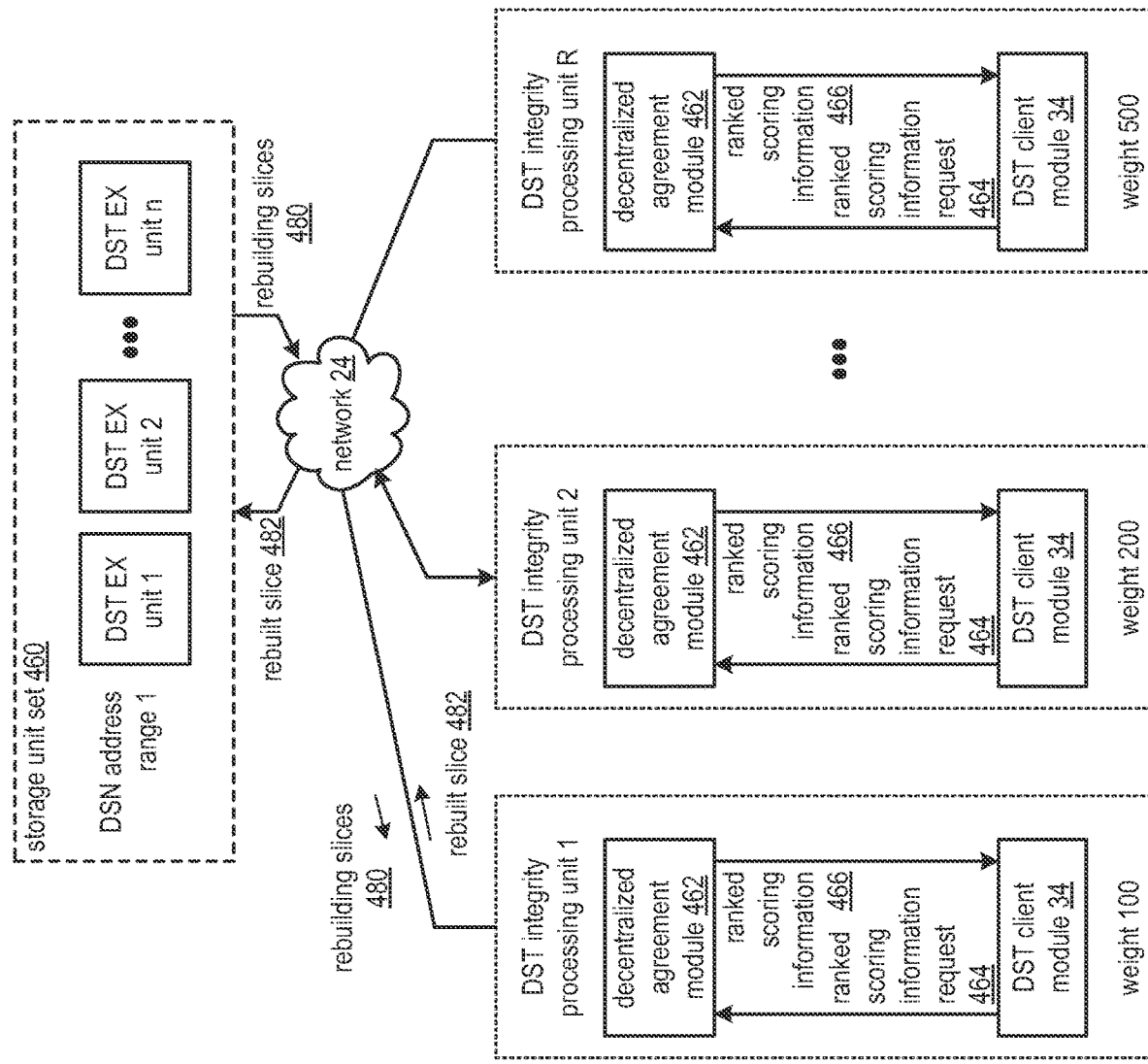
Figure 42D:
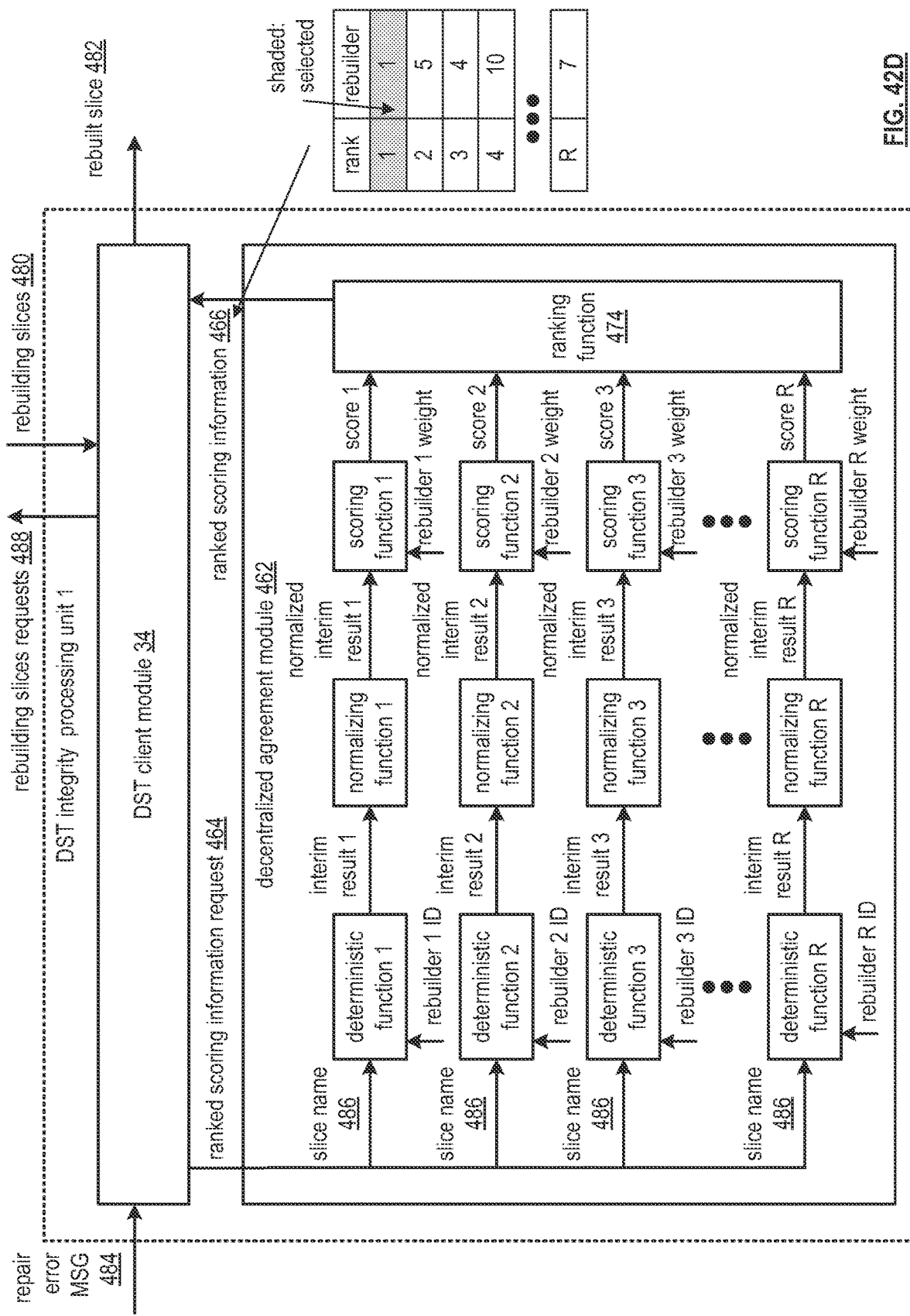
Figure 42E:
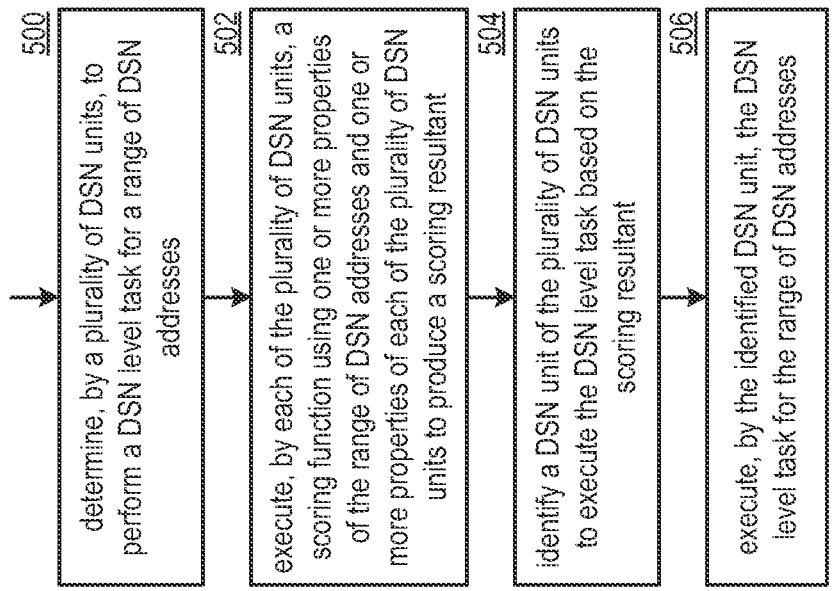
Figure 43A:
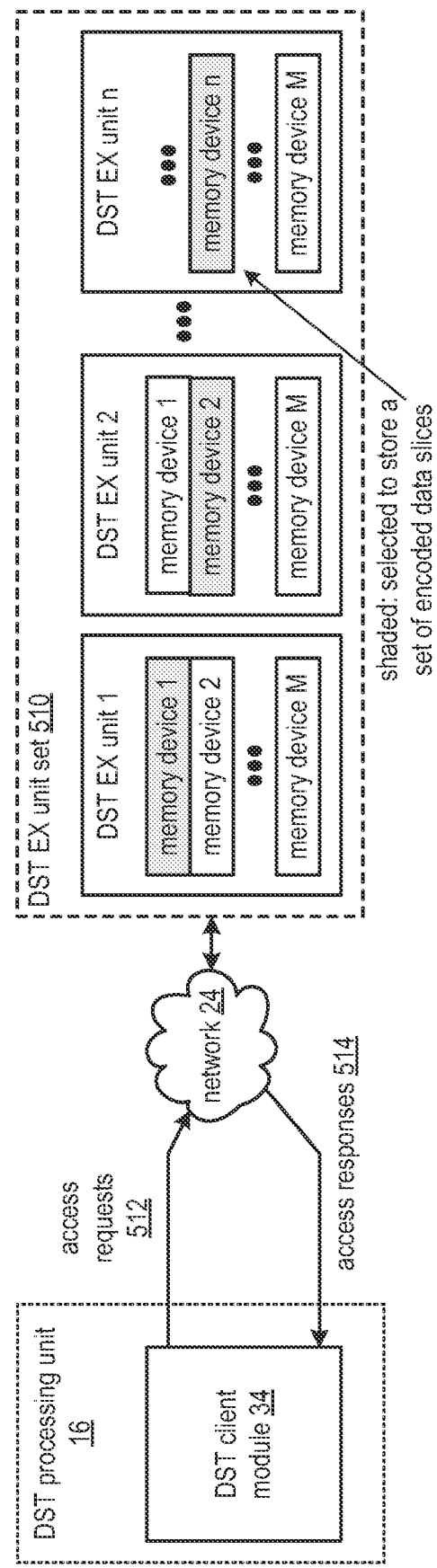
Figure 43B:
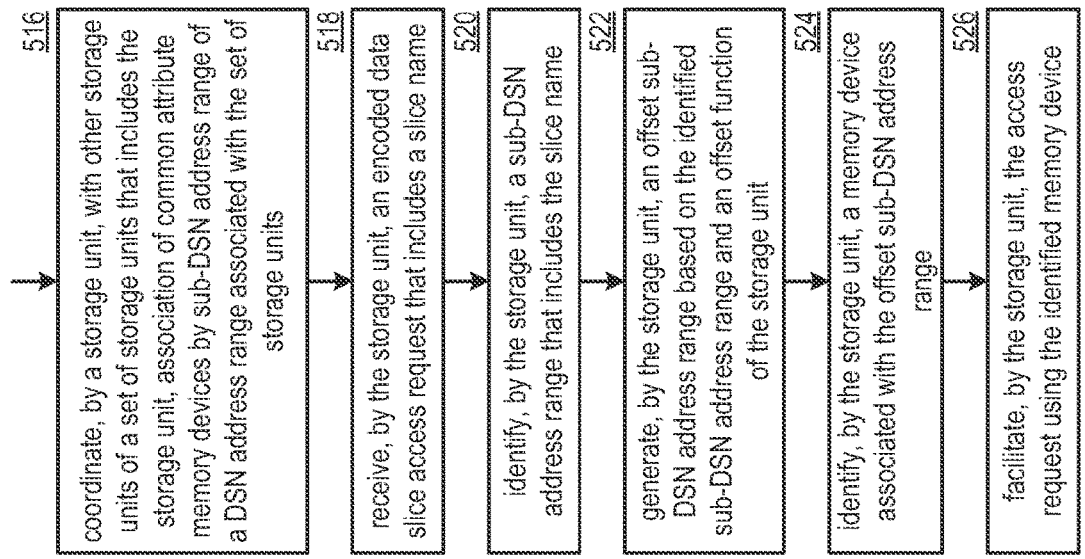
Figure 44A:
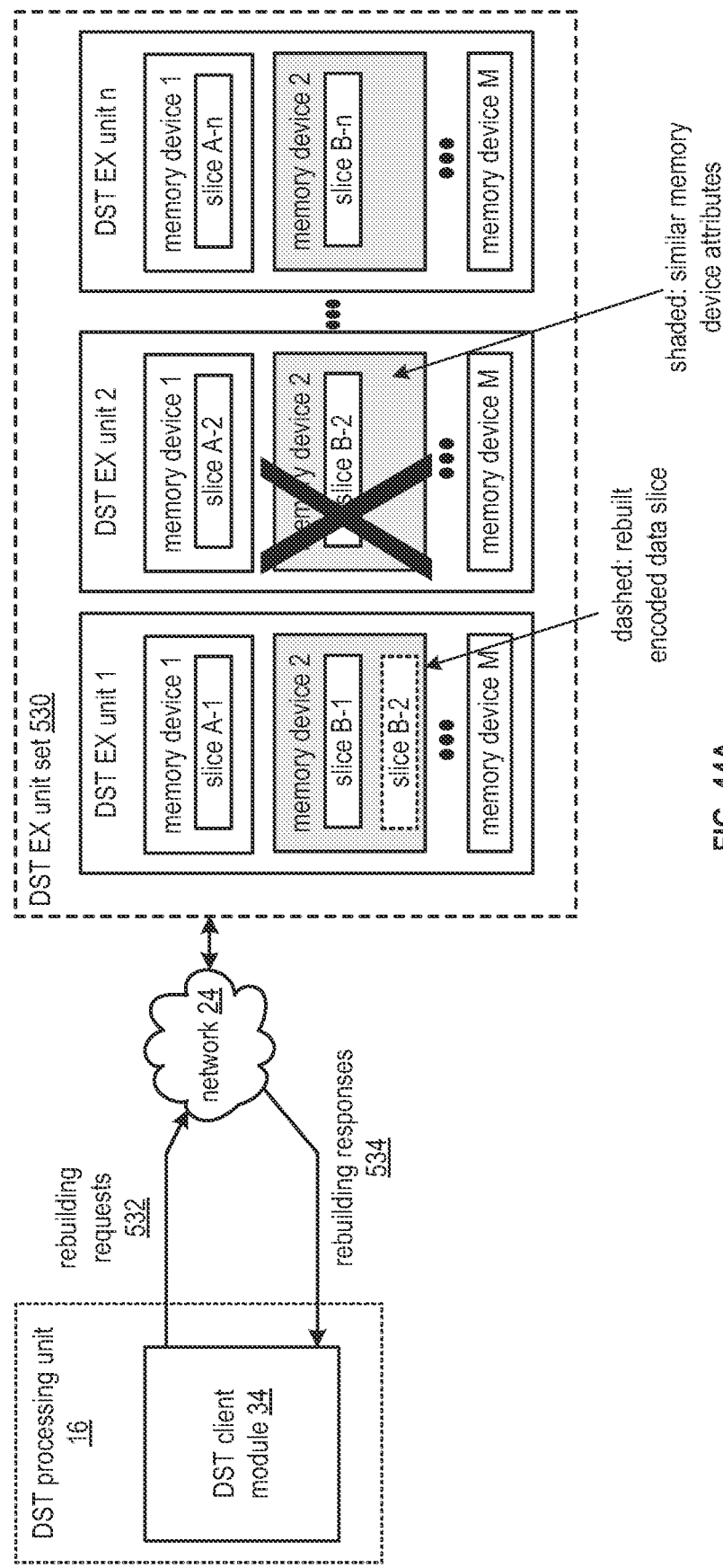
Figure 44B:
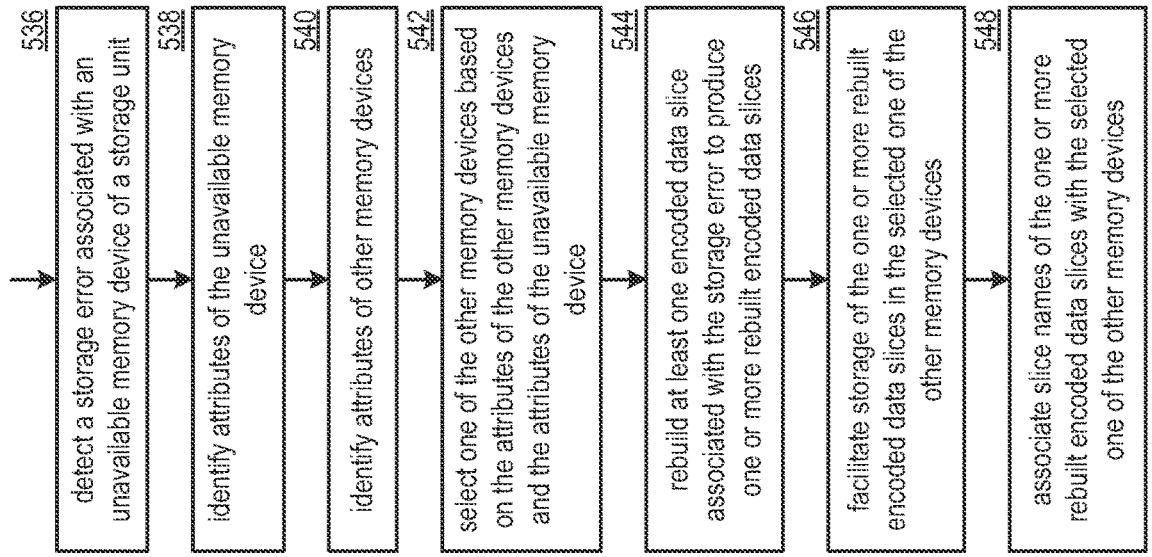
Figure 45A:
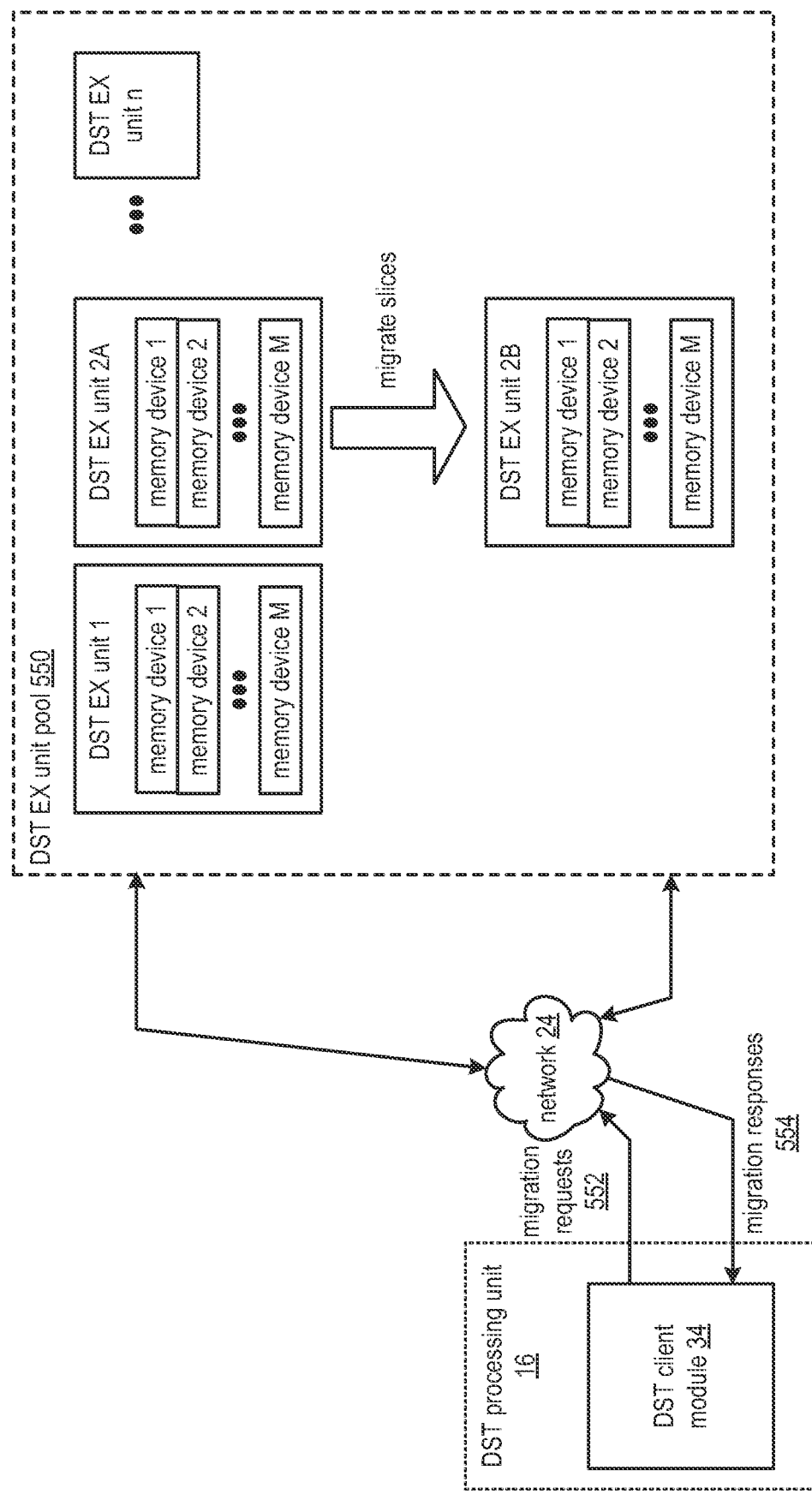
Figure 45B:
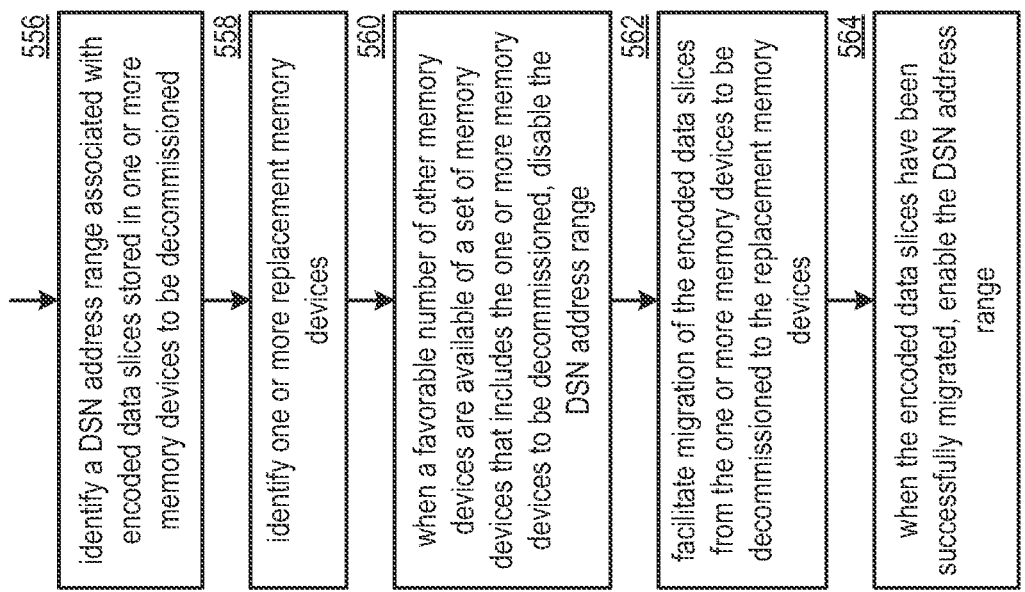
Figure 46A:
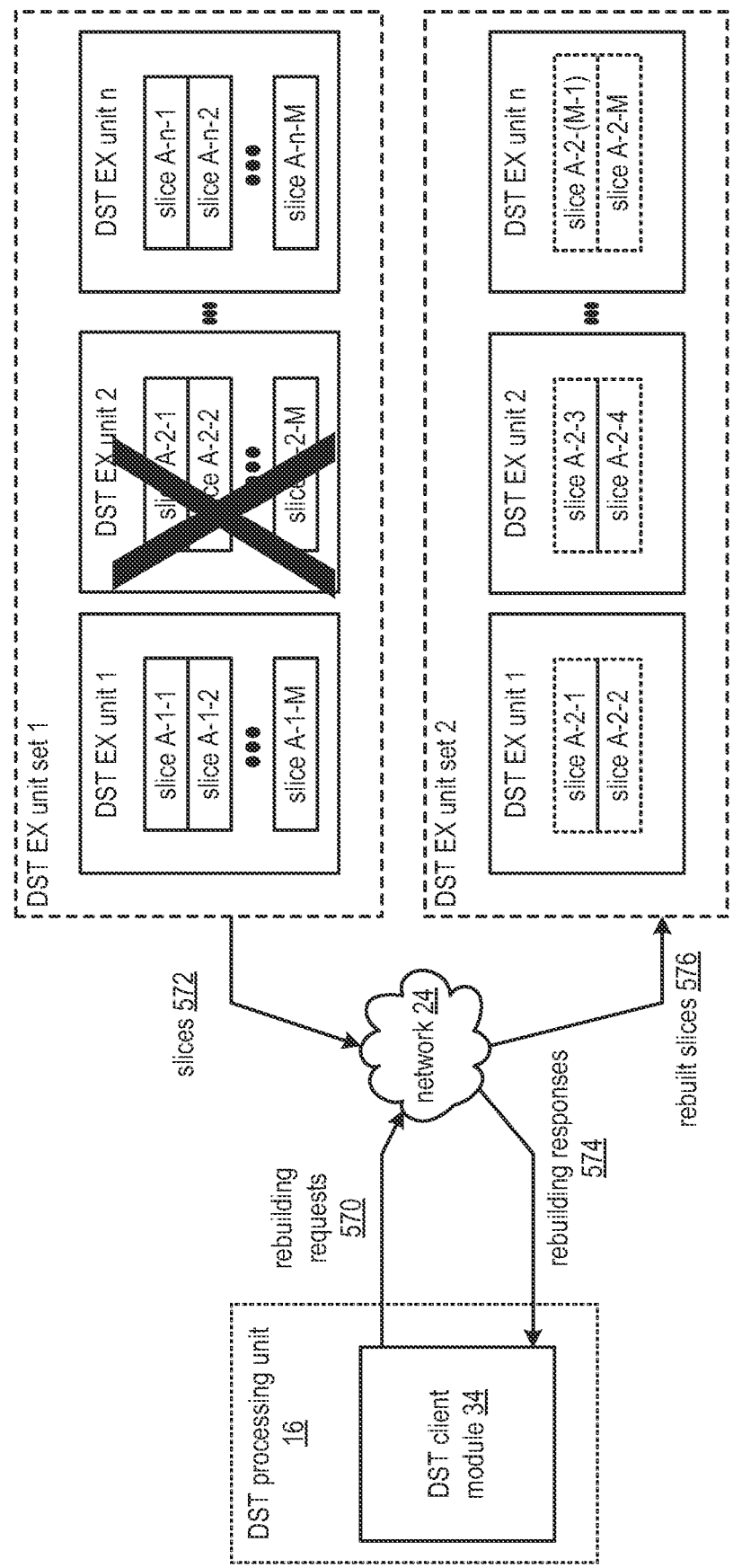
Figure 46B:
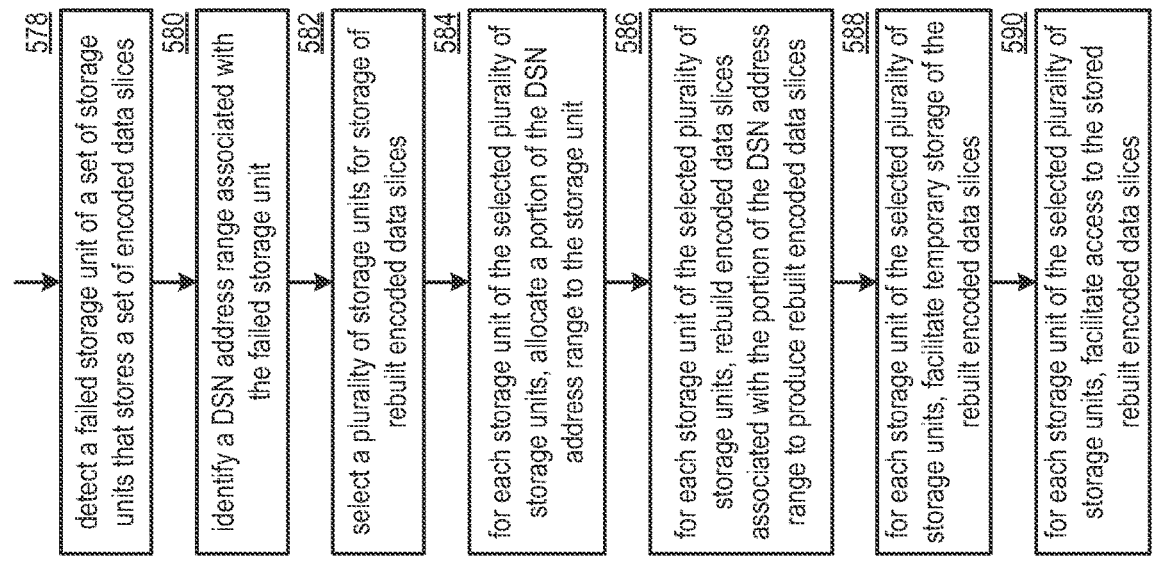
Figure 47A:
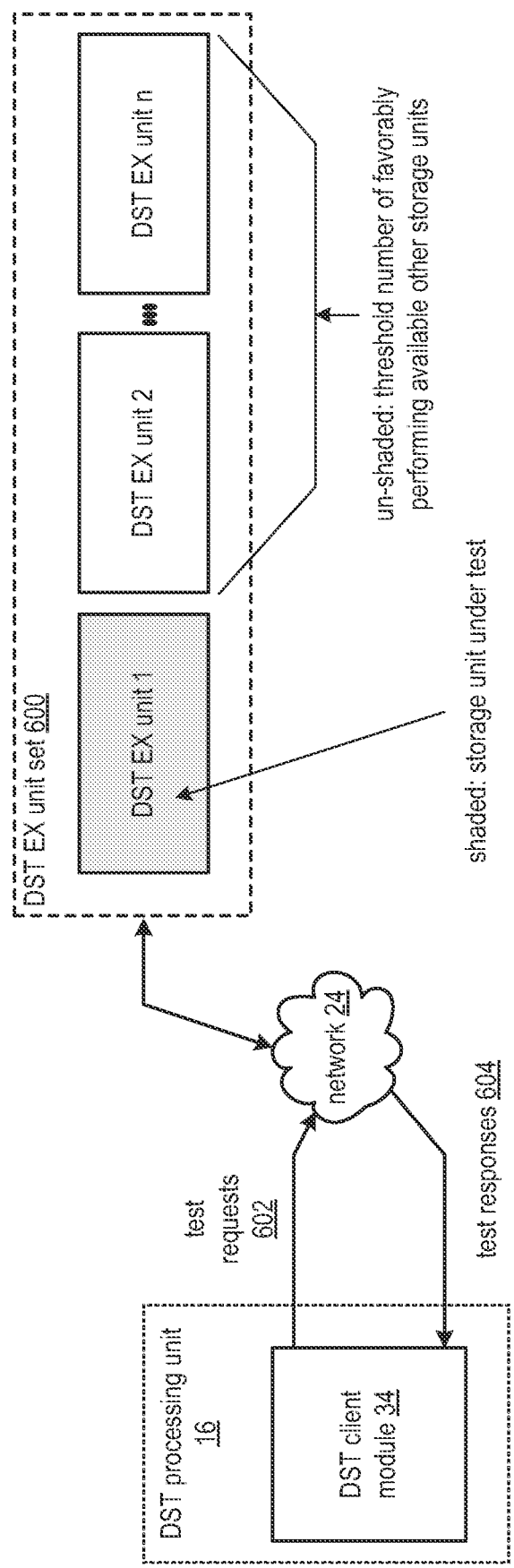
Figure 47B:
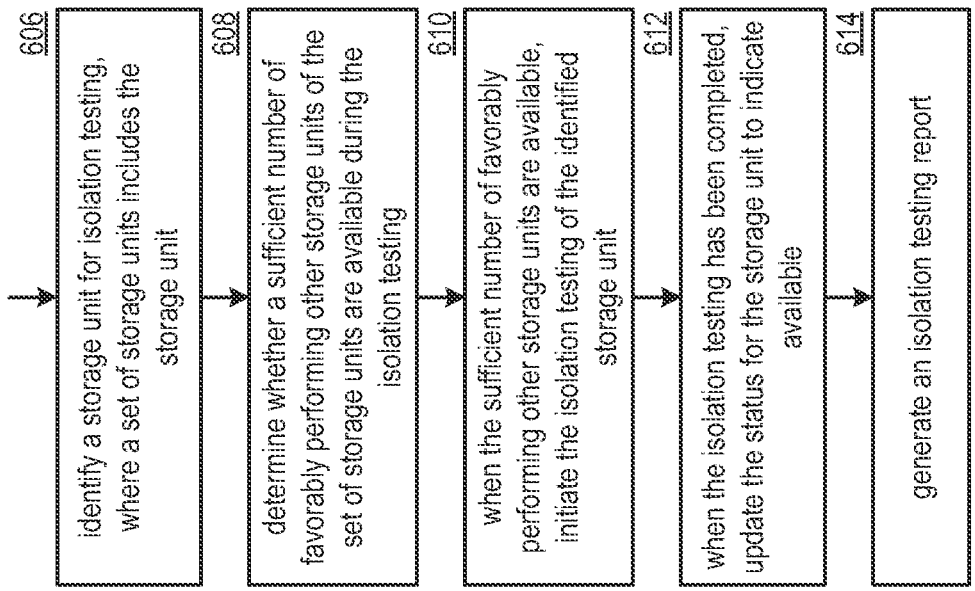
Figure 48A:
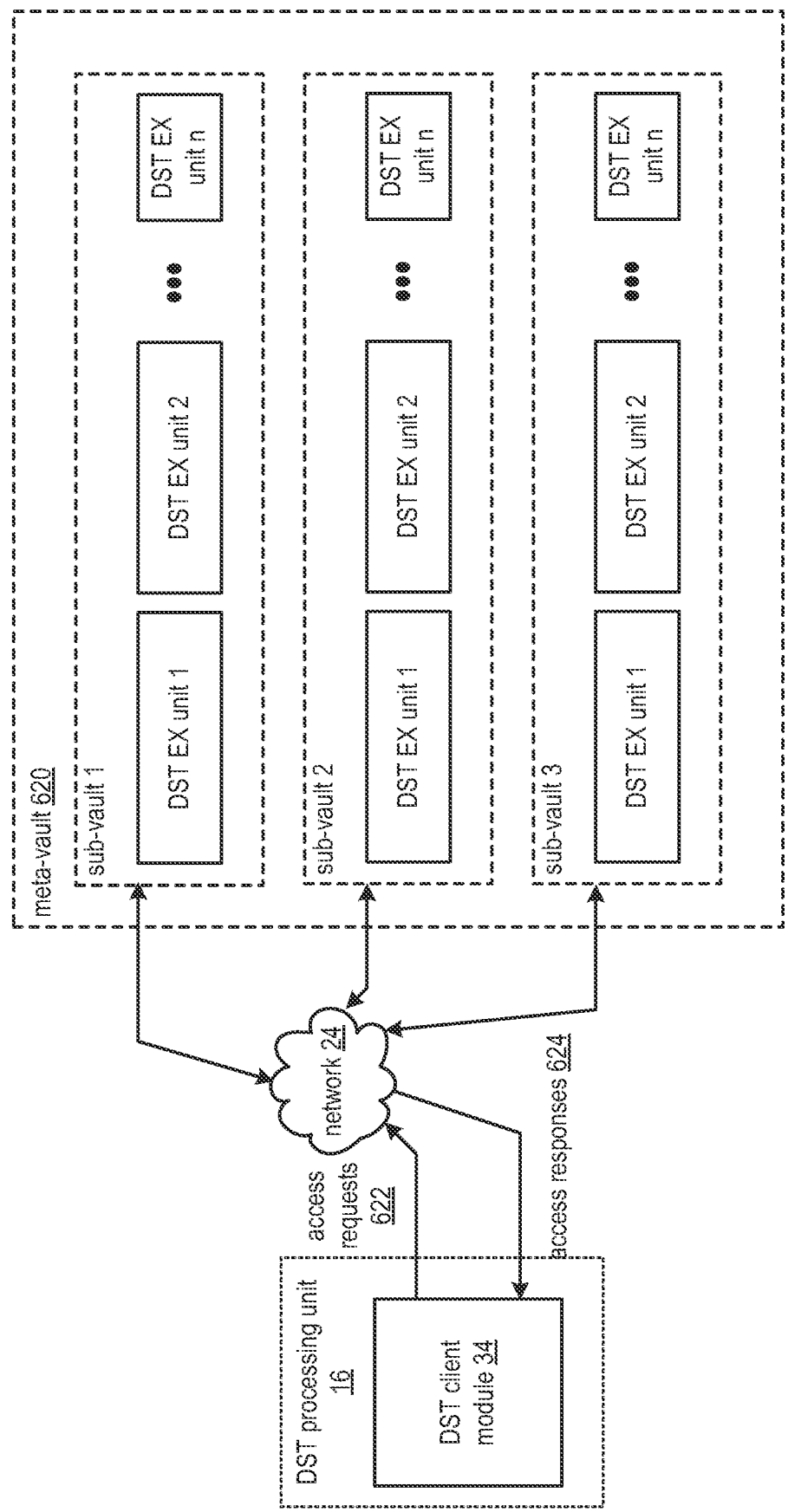
Figure 48B:
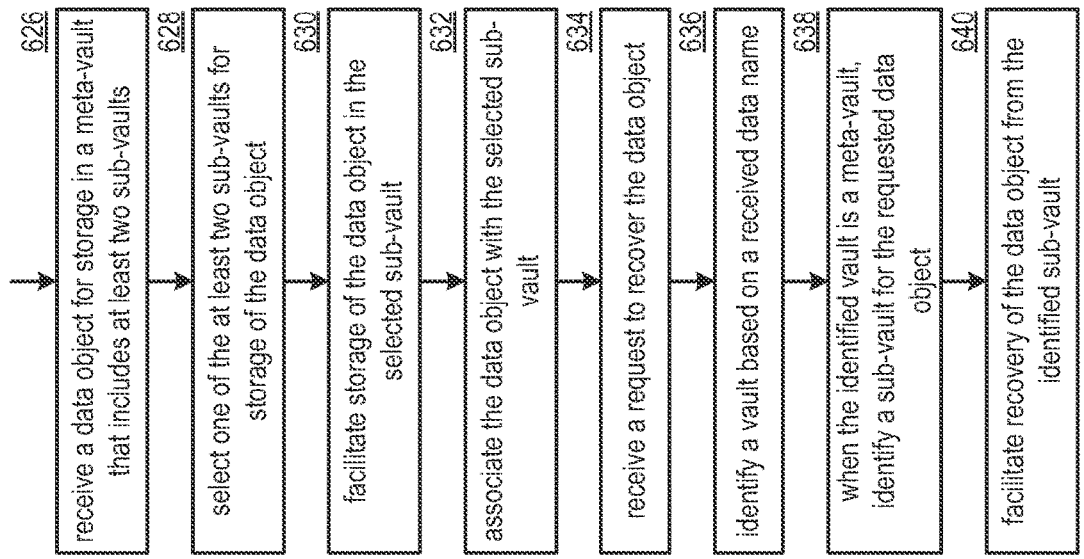
Figure 49A:
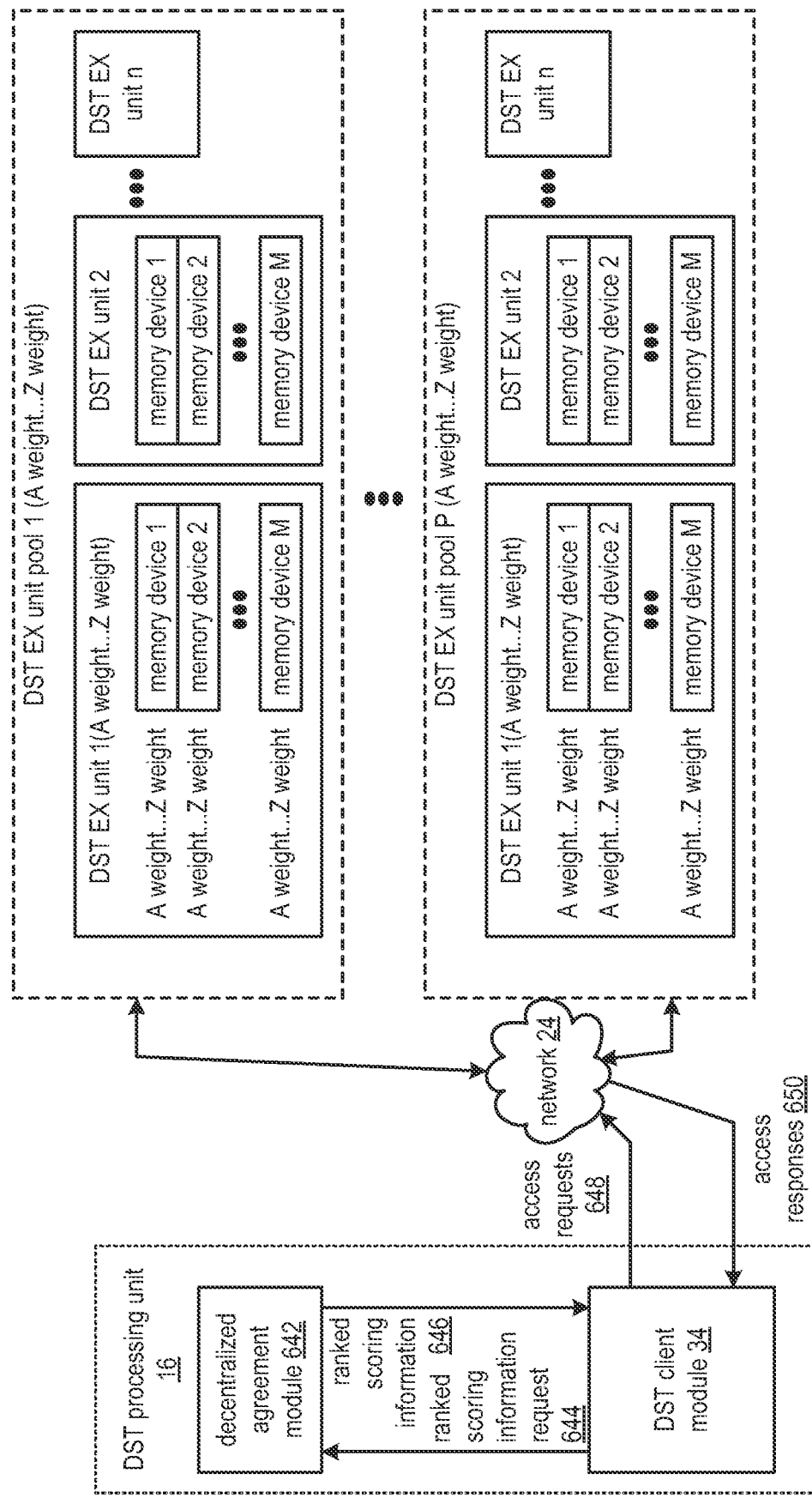
Figure 49B:
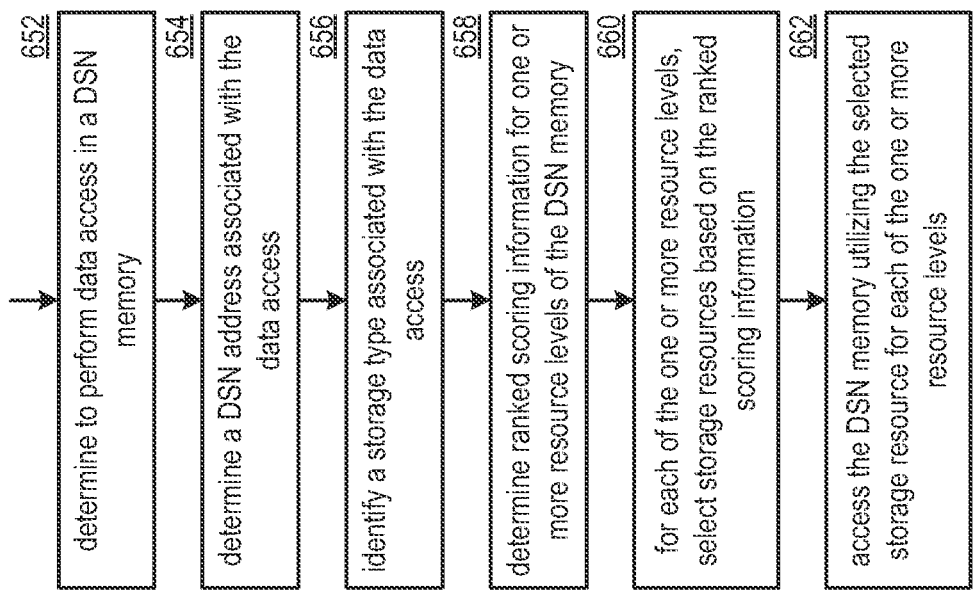

FIGS. 41A-F are a schematic block diagram of another embodiment of a dispersed storage network (DSN) in accordance with the present invention;

FIG. 41G is a flowchart illustrating an example of recovering an encoded data slice in accordance with the present invention;

FIGS. 42A and 42C are a schematic block diagram of another embodiment of a dispersed storage network (DSN) in accordance with the present invention;

FIGS. 42B and 42D are a schematic block diagram of another embodiment of a distributed storage and task (DST) integrity processing unit in accordance with the present invention;

FIG. 42E is a flowchart illustrating an example of identifying a task execution resource in accordance with the present invention;

FIG. 43A is a schematic block diagram of another embodiment of a dispersed storage network (DSN) in accordance with the present invention;

FIG. 43B is a flowchart illustrating an example of selecting a memory device in accordance with the present invention;

FIG. 44A is a schematic block diagram of another embodiment of a dispersed storage network (DSN) in accordance with the present invention;

FIG. 44B is a flowchart illustrating another example of selecting the memory device in accordance with the present invention;

FIG. 45A is a schematic block diagram of another embodiment of a dispersed storage network (DSN) in accordance with the present invention;

FIG. 45B is a flowchart illustrating an example of migrating encoded data slices in accordance with the present invention;

FIG. 46A is a schematic block diagram of another embodiment of a dispersed storage network (DSN) in accordance with the present invention;

FIG. 46B is a flowchart illustrating an example of temporarily storing rebuilt encoded data slices in accordance with the present invention;

FIG. 47A is a schematic block diagram of another embodiment of a dispersed storage network (DSN) in accordance with the present invention;

FIG. 47B is a flowchart illustrating an example of testing a storage unit in accordance with the present invention;

FIG. 48A is a schematic block diagram of another embodiment of a dispersed storage network (DSN) in accordance with the present invention;

FIG. 48B is a flowchart illustrating an example of utilizing a vault structure in a dispersed storage network (DSN) in accordance with the present invention;

FIG. 49A is a schematic block diagram of another embodiment of a dispersed storage network (DSN) in accordance with the present invention; and FIG. 49B is a flowchart illustrating an example of selecting storage resources in accordance with the present invention.

DETAILED DESCRIPTION OF THE INVENTION

Figure 1:
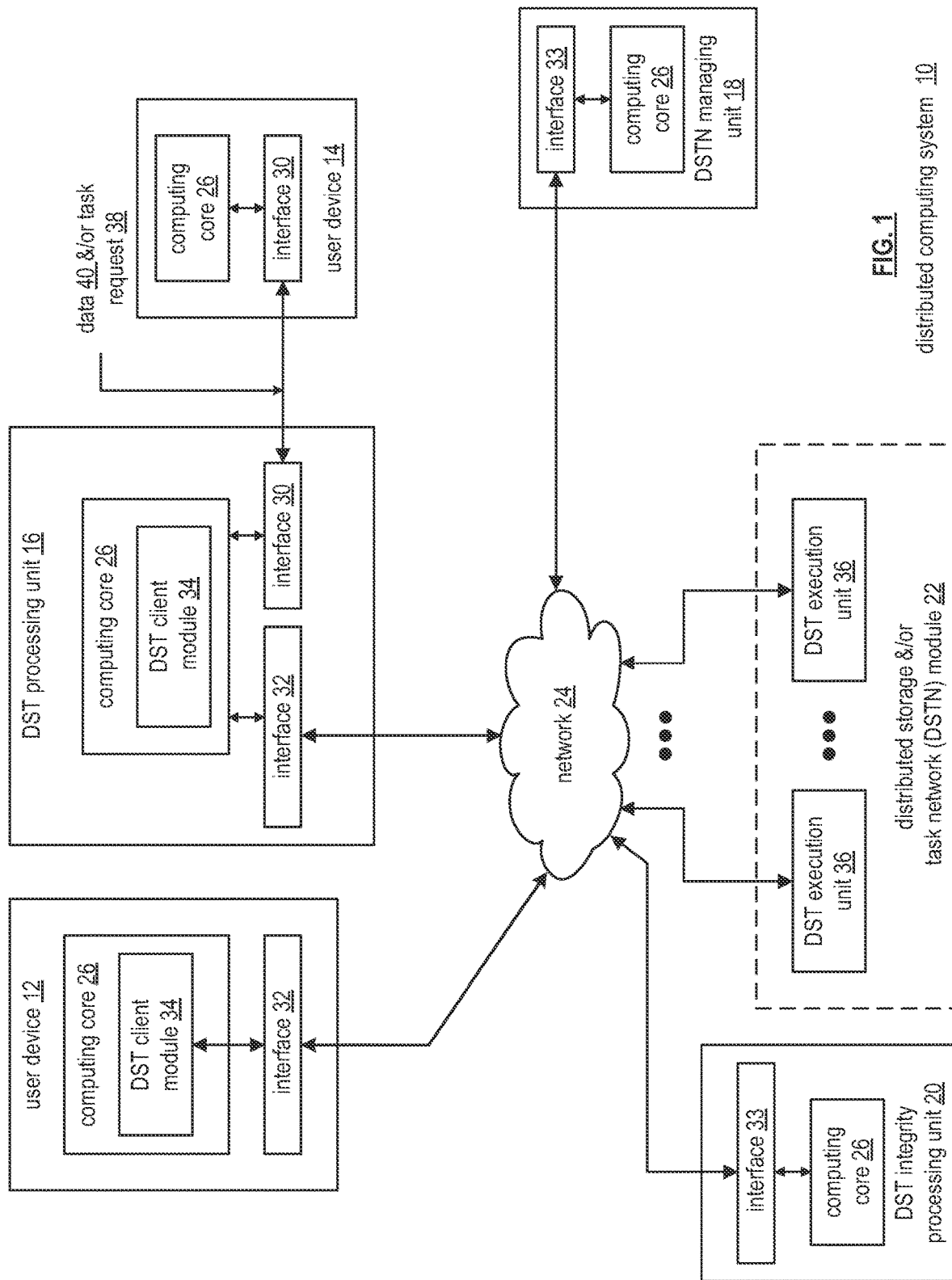
FIG. 1 is a schematic block diagram of an embodiment of a distributed computing system in accordance with the present invention.

FIG. 1 is a schematic block diagram of an embodiment of a distributed computing system that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interfaces 30 support a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
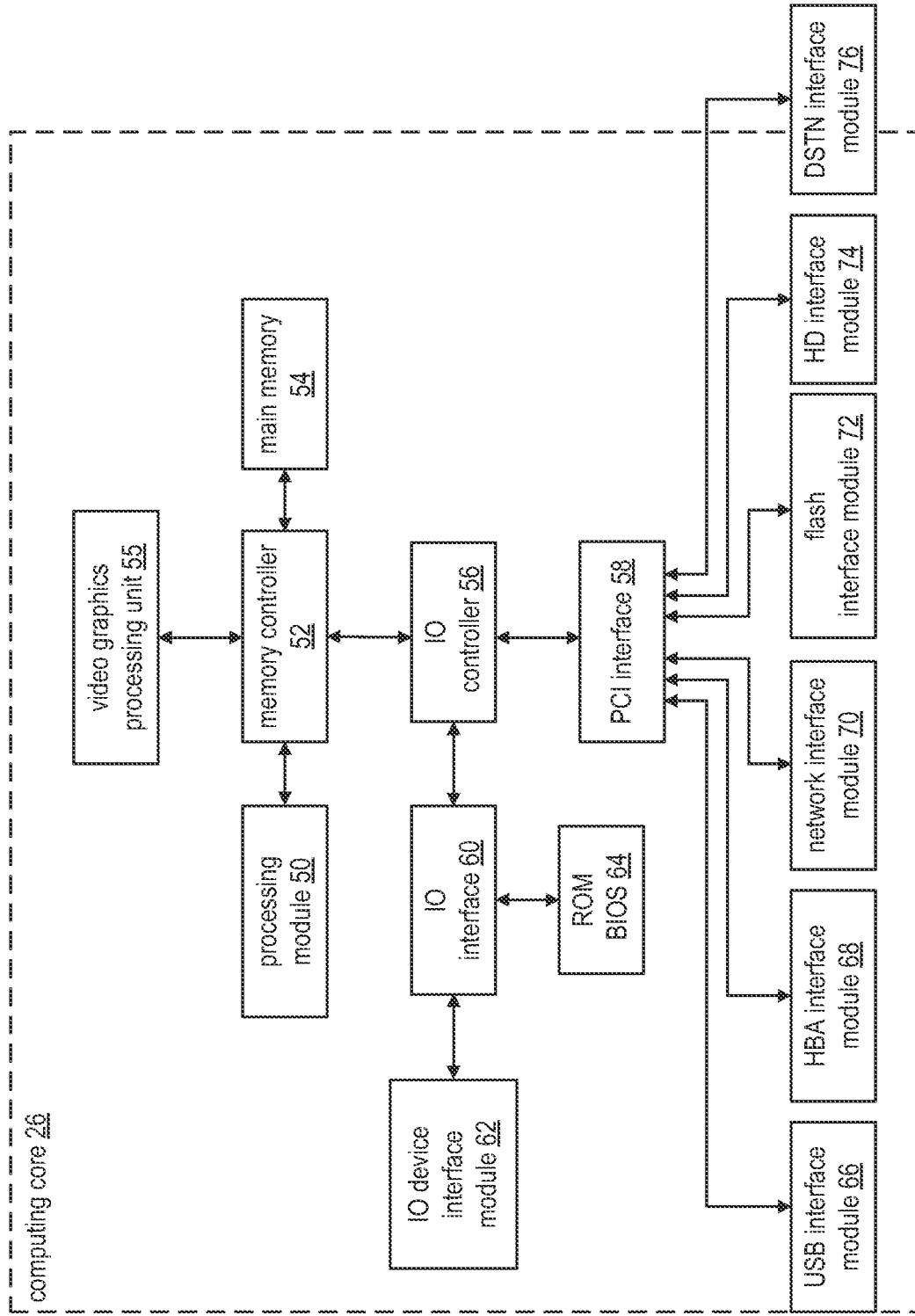
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
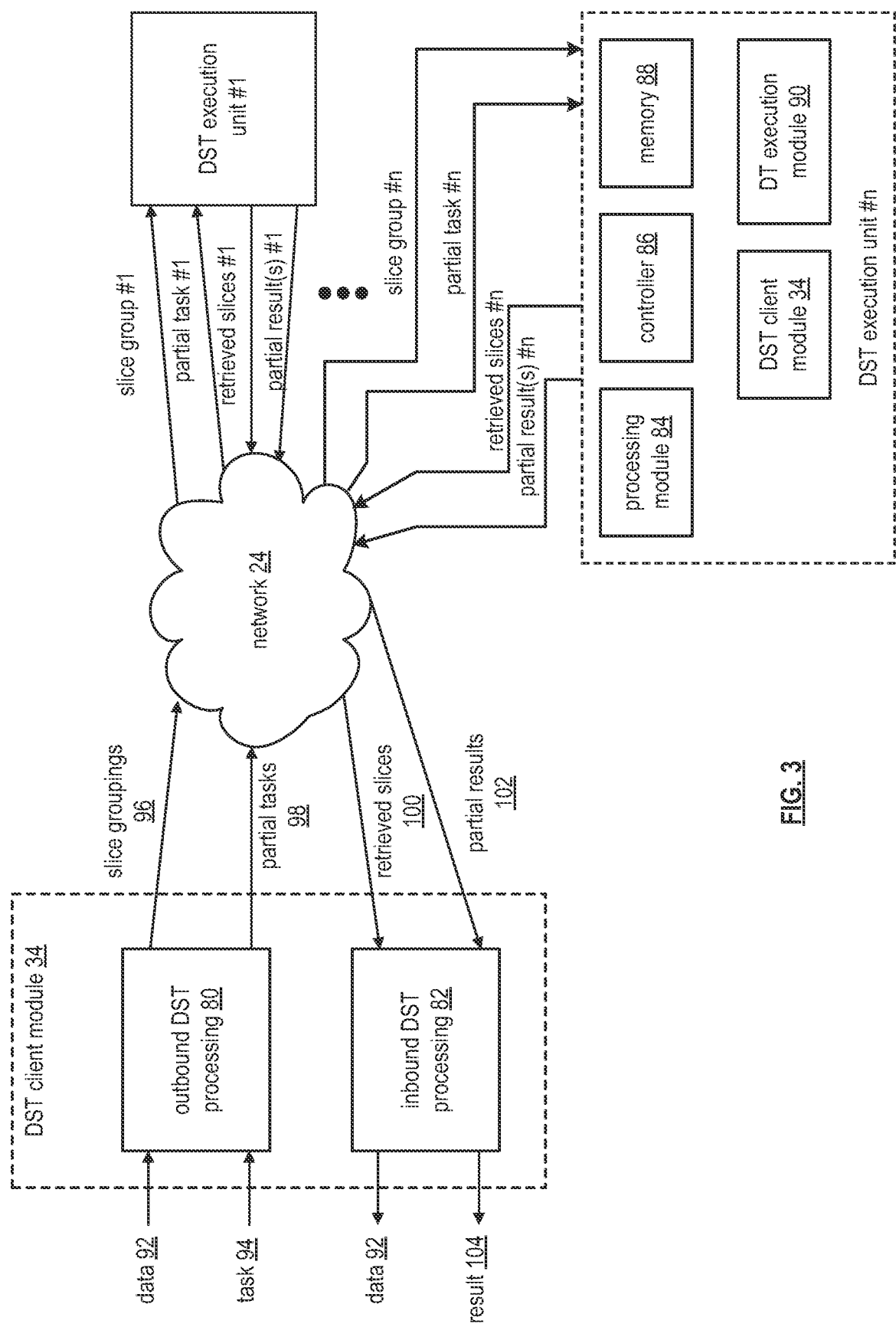
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-*n* that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-*n* includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1.

The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
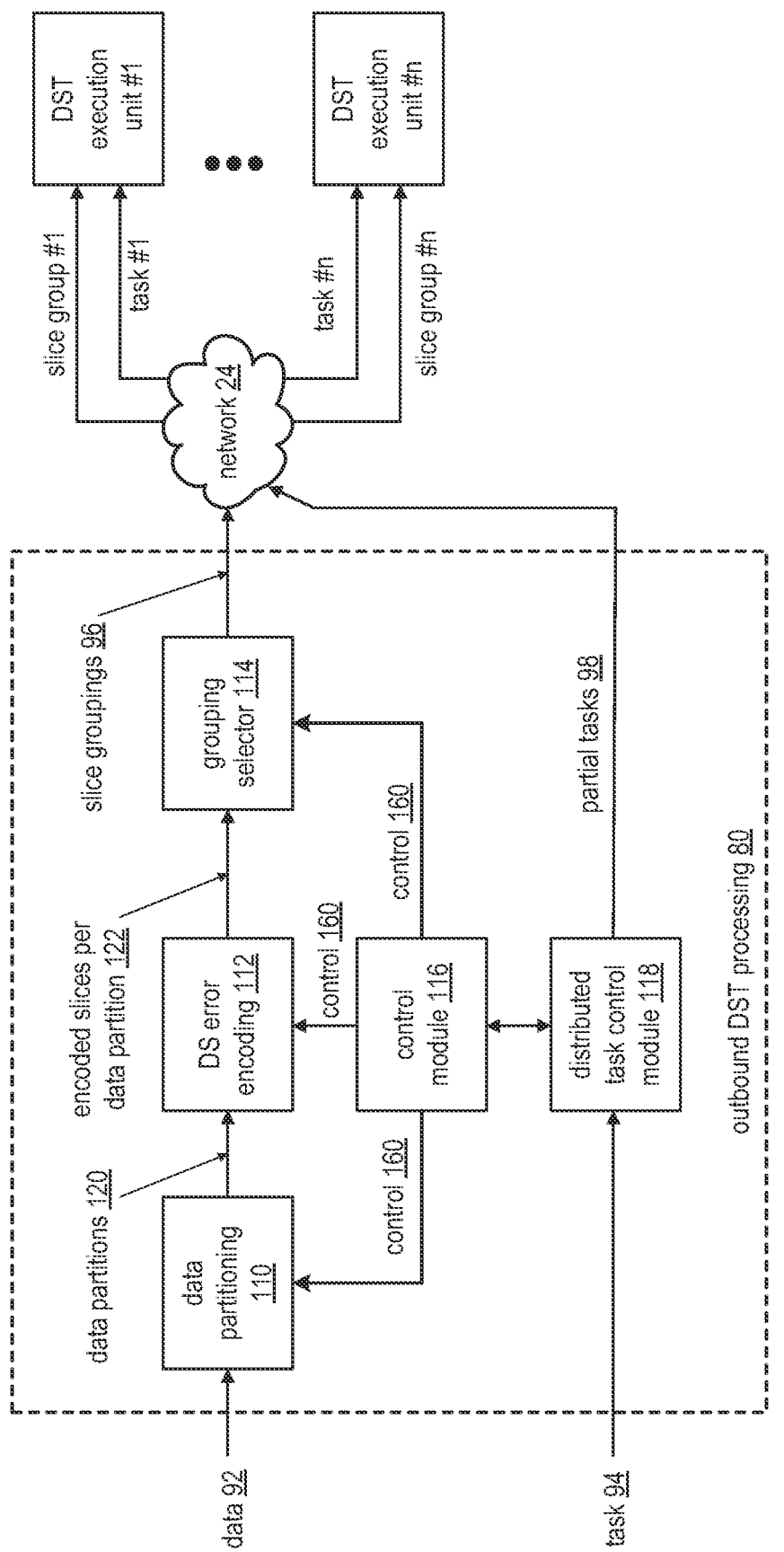
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94.

For example, if five DST execution units 36 are identified for the particular task 94, the group selecting module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phase and a second set of partial tasks for finding and counting the second phrase. The distributed task control module 118 sends respective first and/or second partial tasks 98 to each DST execution unit 36.

Figure 5:
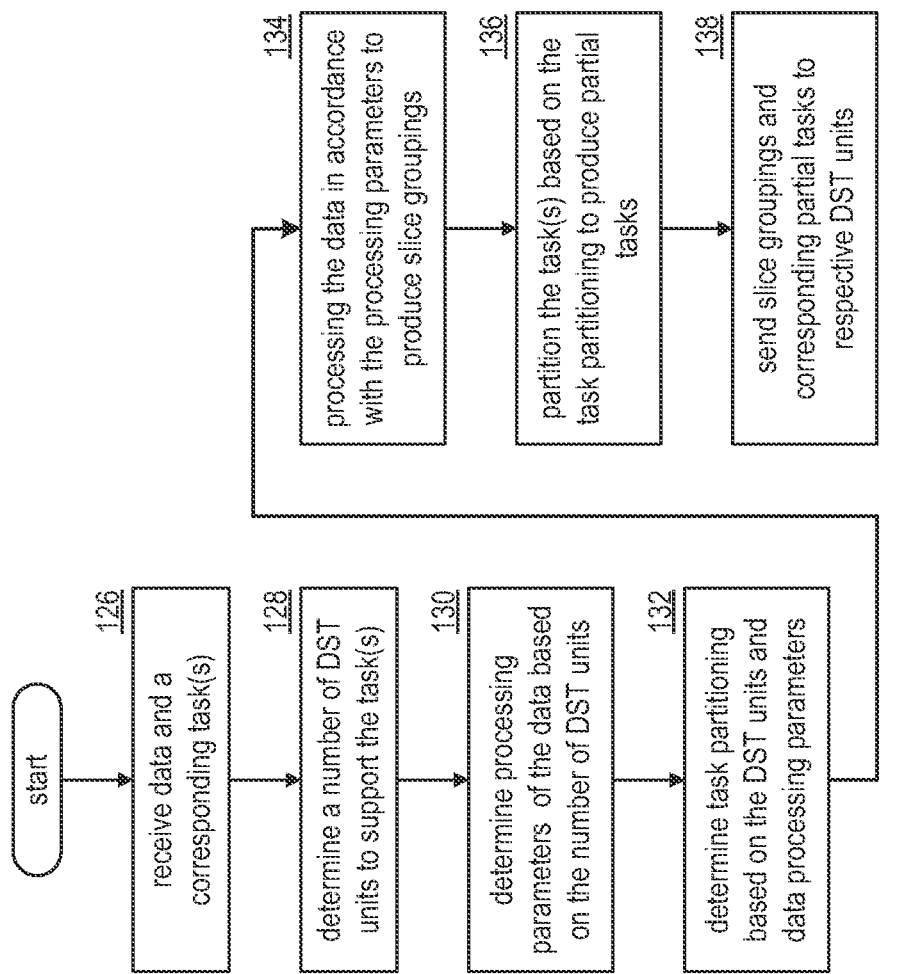
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or and the other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
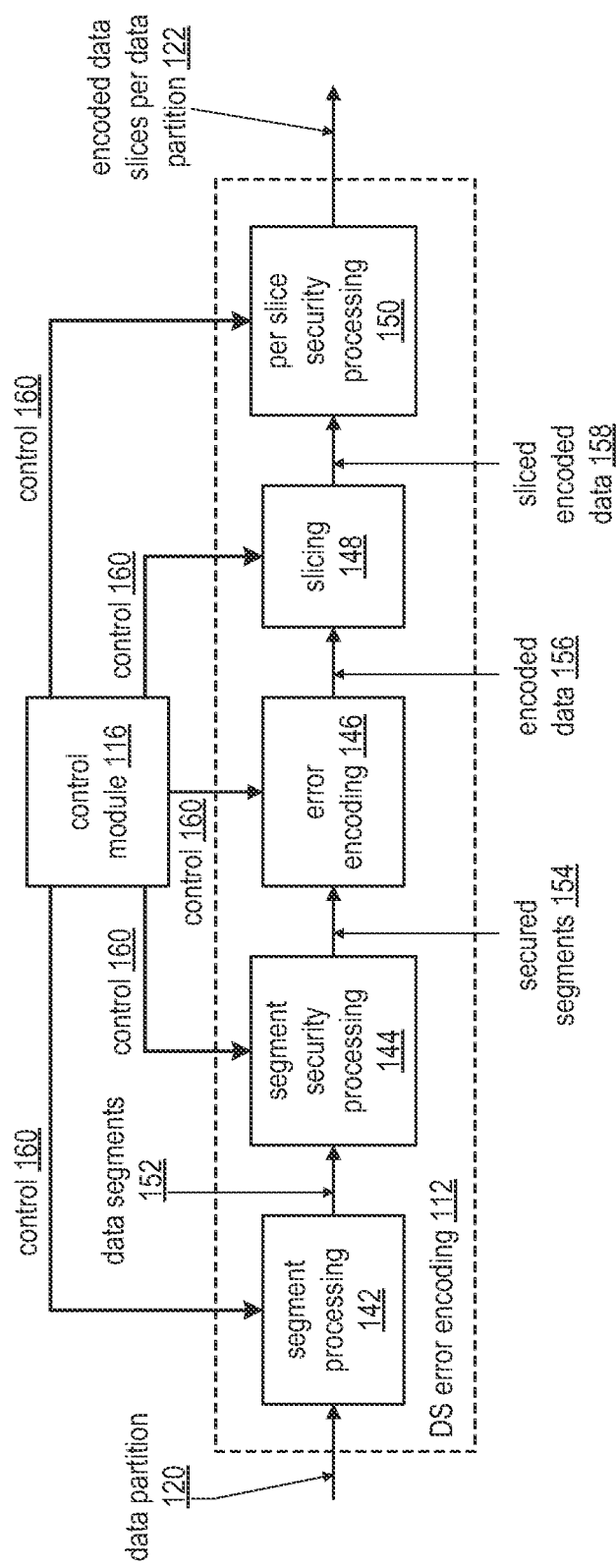
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc.

For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
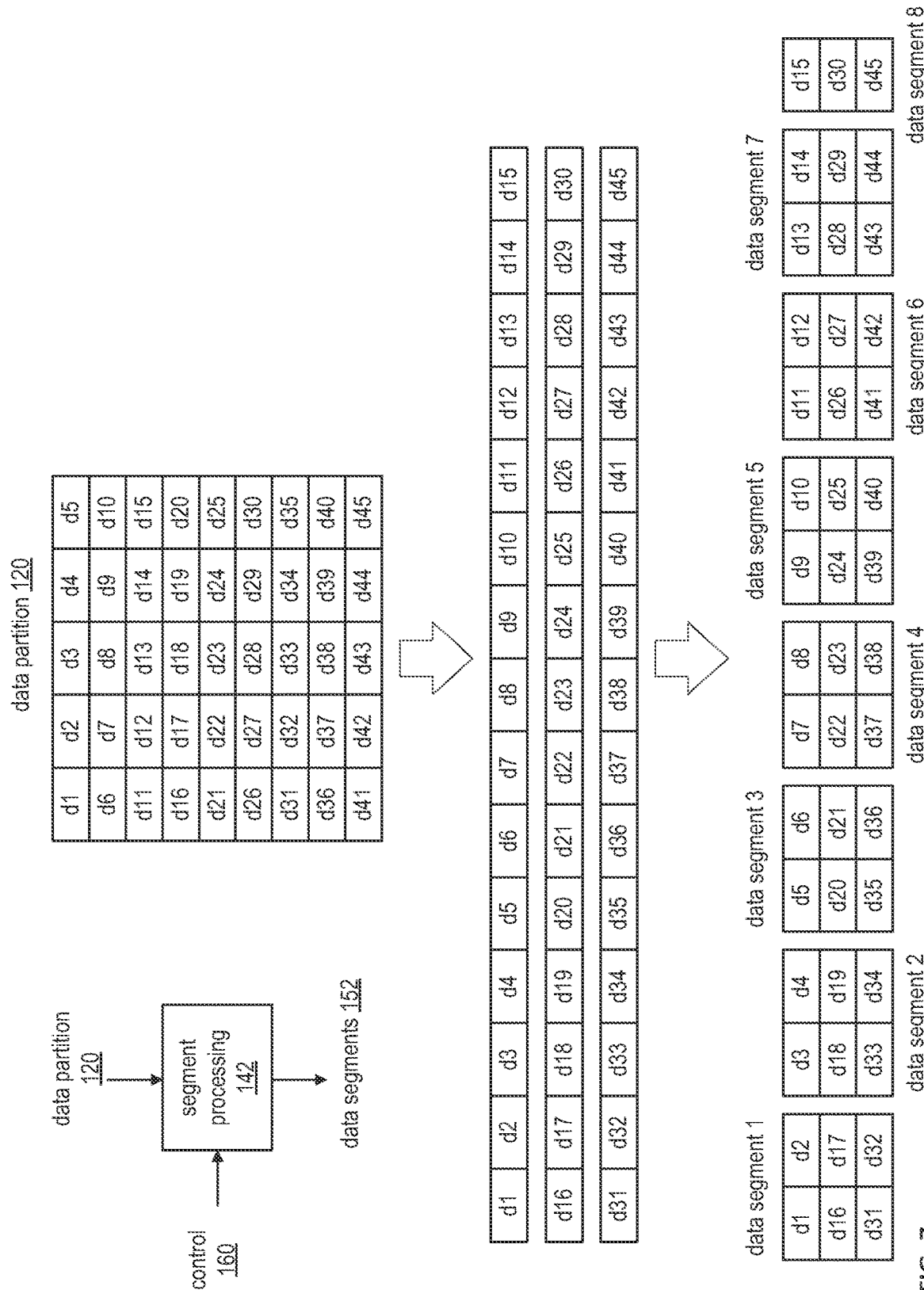
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
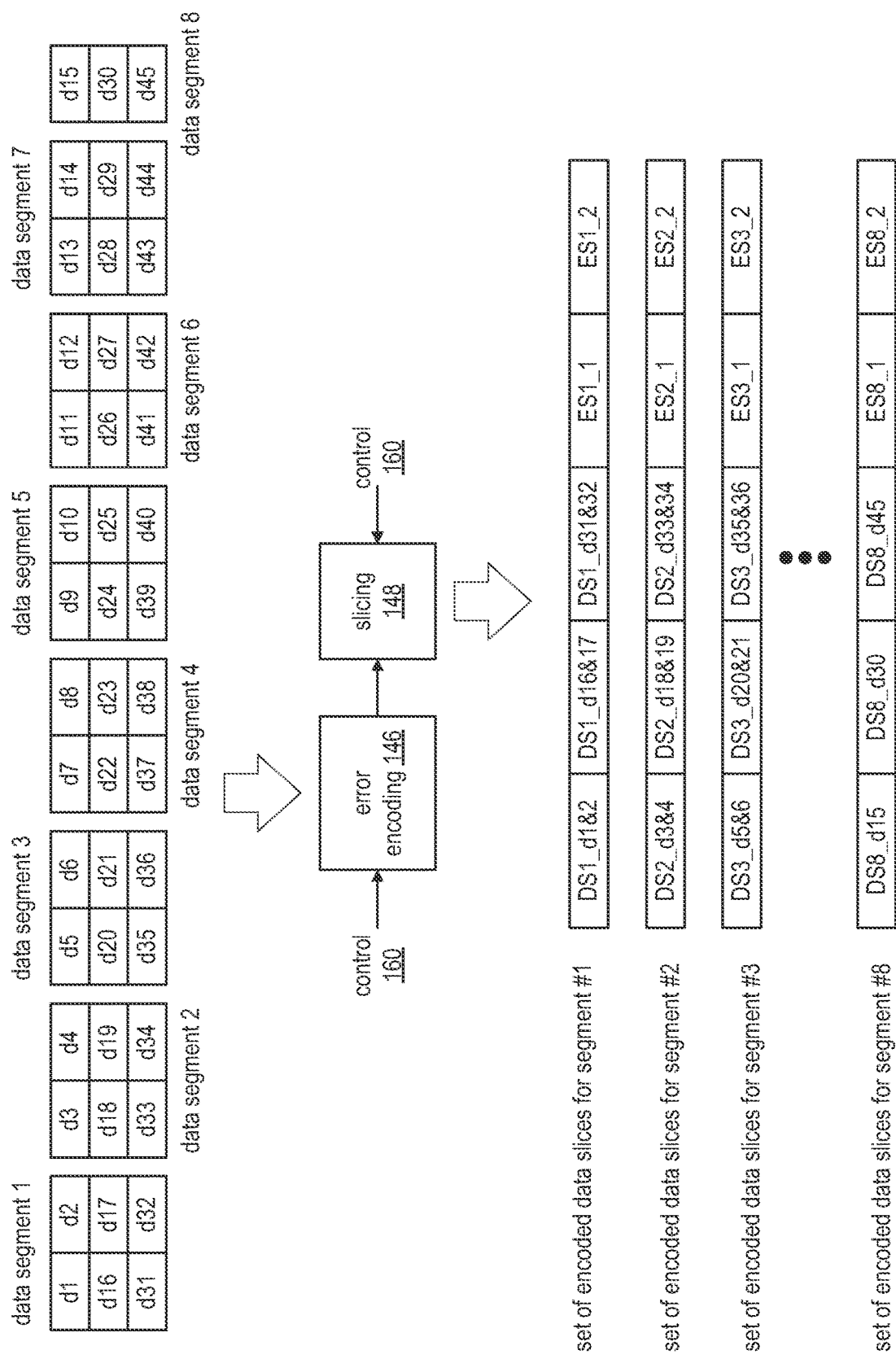
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first—third words of the first data segment. With such an encoding and slicing scheme, retrieving any three of the five encoded data slices allows the data segment to be accurately reconstructed.

The encoding and slices of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first—third words of the second data segment.

Figure 9:
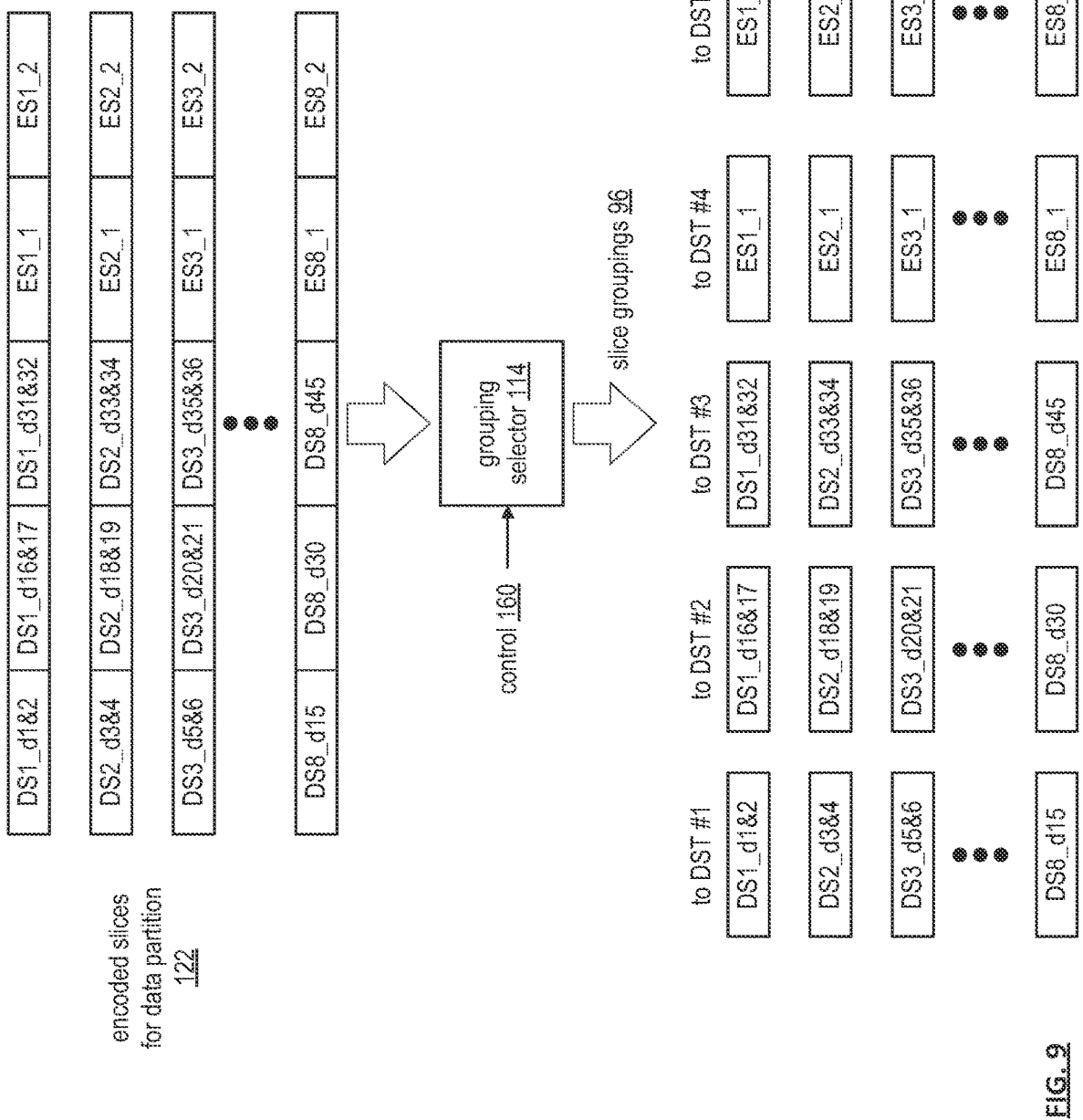
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selection module 114 organizes the encoded data slices into five slice groupings (e.g., one for each DST execution unit of a distributed storage and task network (DSTN) module). As a specific example, the grouping selection module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selection module 114 also creates a second slice grouping for a DST execution unit #2, which includes second encoded slices of each of the sets of encoded slices. As such, the second DST execution unit receives encoded data slices corresponding to data blocks 16-30. The grouping selection module 114 further creates a third slice grouping for DST execution unit #3, which includes third encoded slices of each of the sets of encoded slices. As such, the third DST execution unit receives encoded data slices corresponding to data blocks 31-45.

The grouping selection module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selection module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
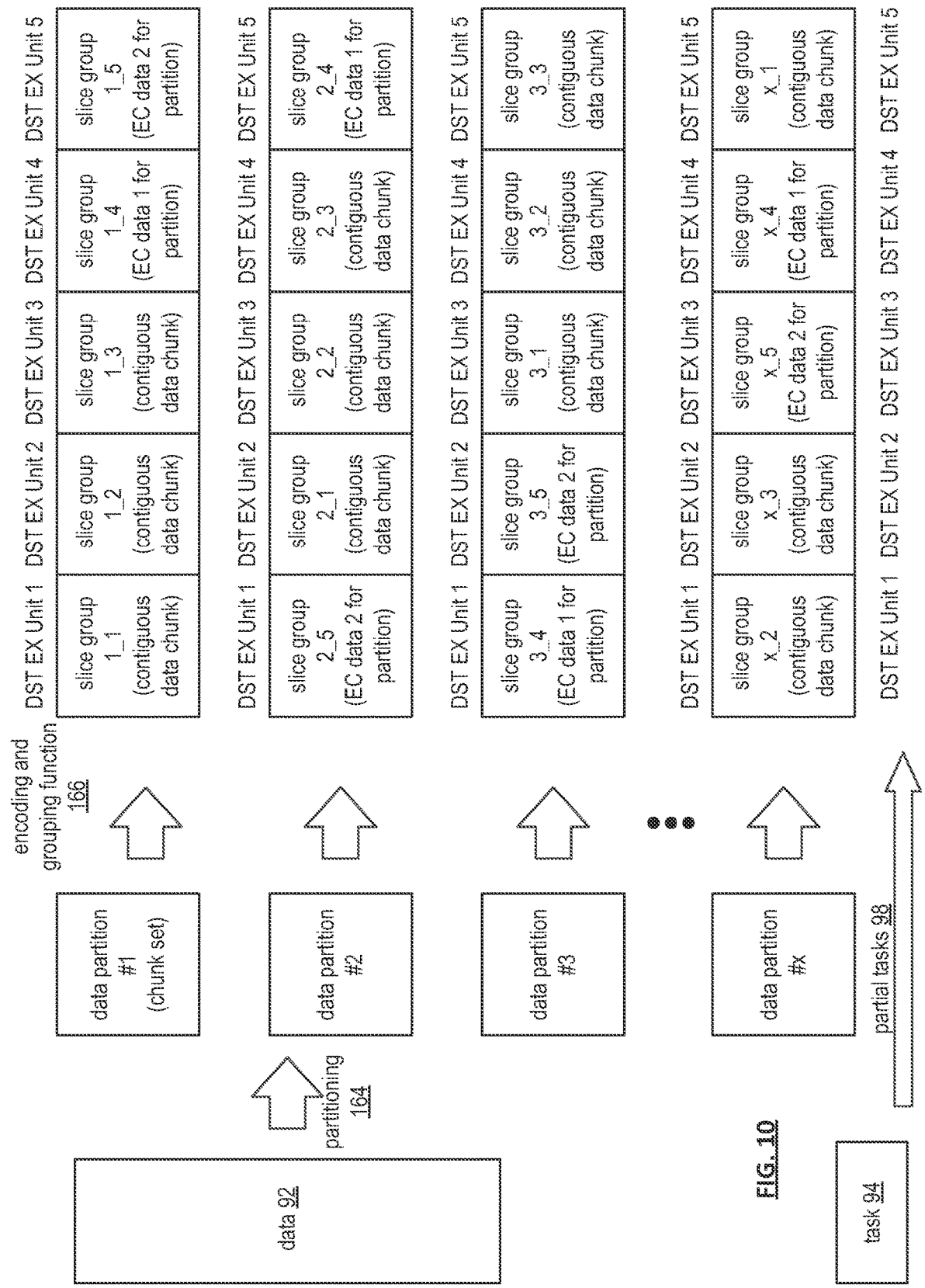
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
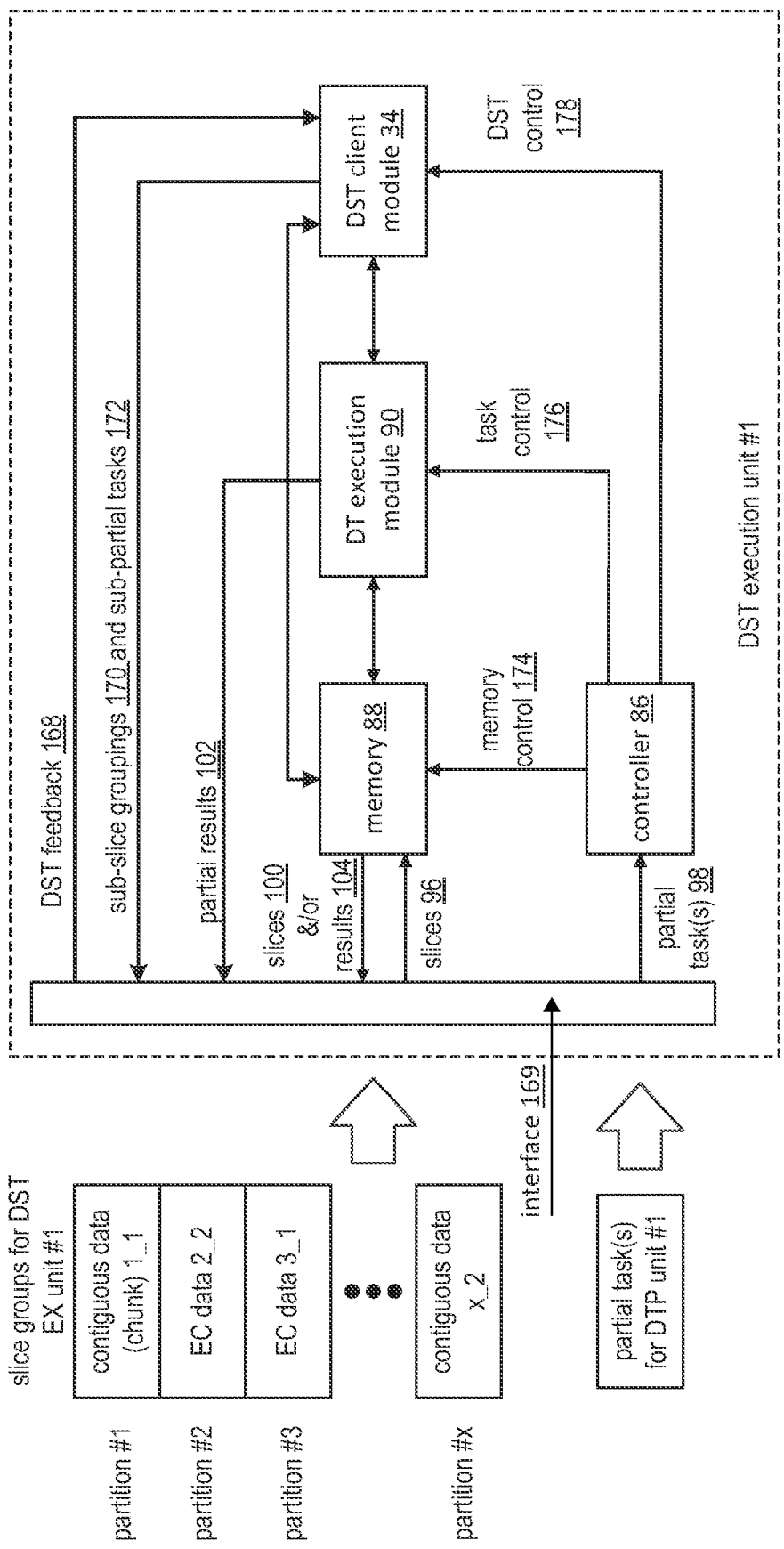
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 and the memory 88. For example, when the partial task 98 includes a retrieval request, the controller 86 outputs the memory control 174 to the memory 88 to facilitate retrieval of slices 100 and/or results 104.

Figure 12:
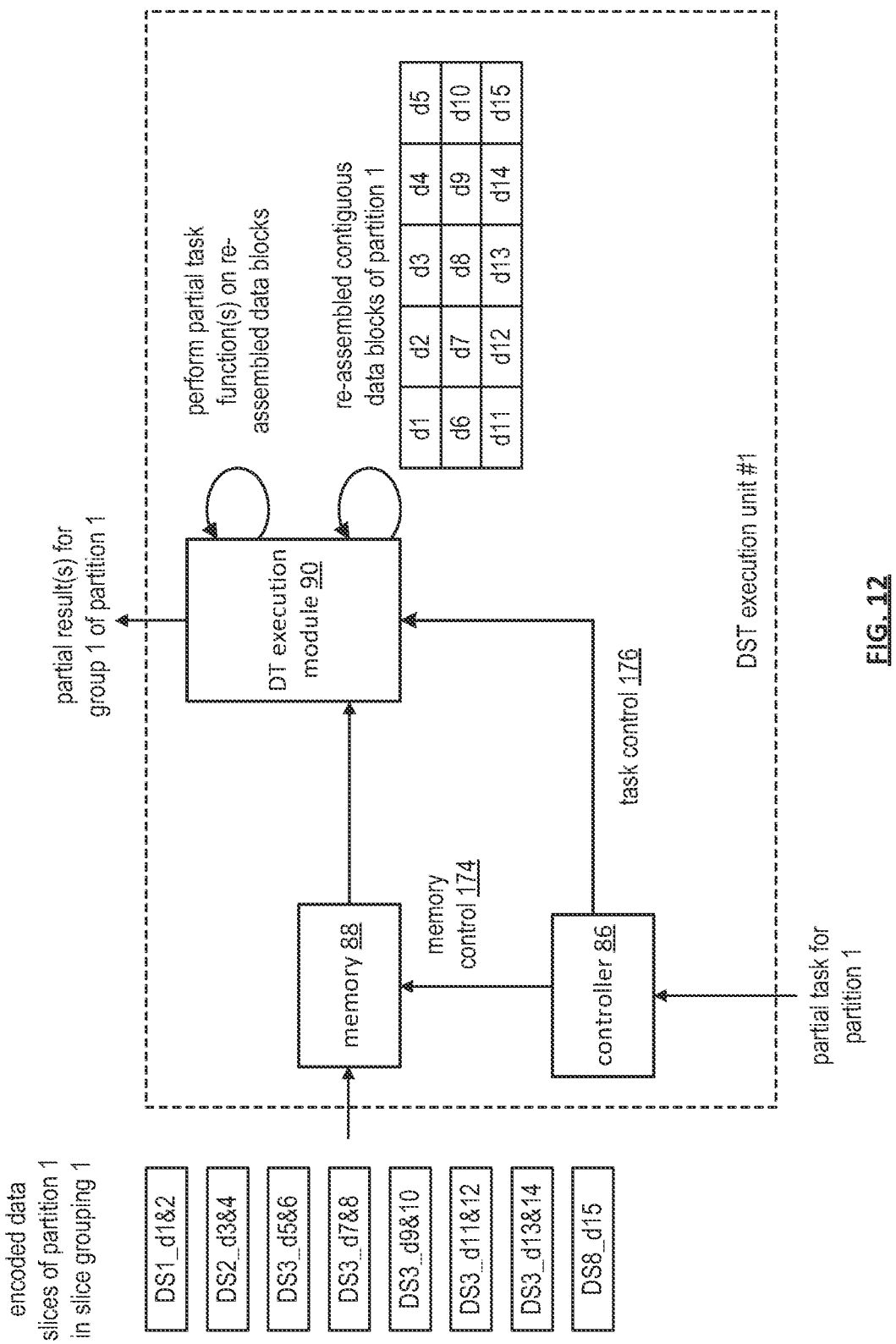
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
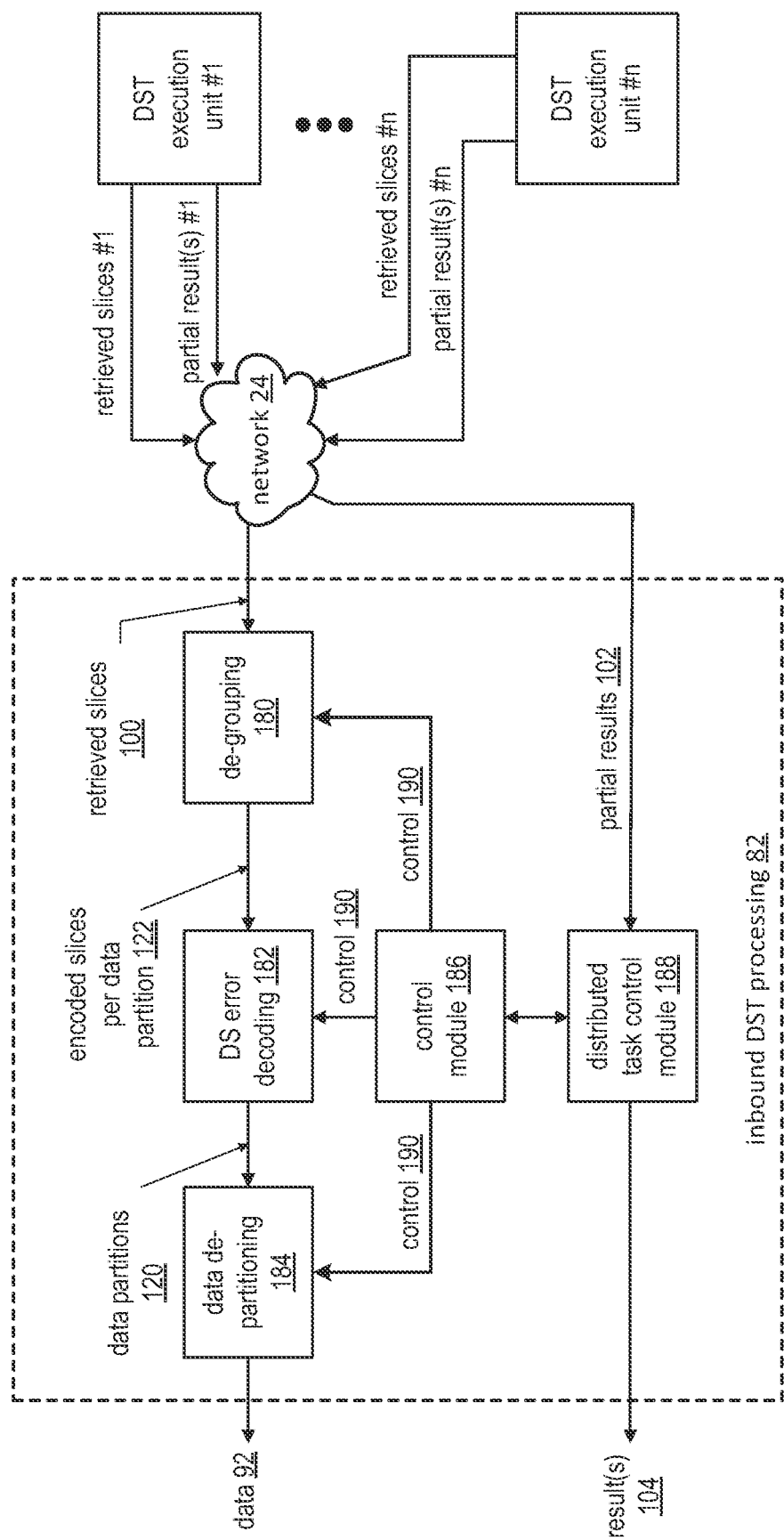
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieve slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
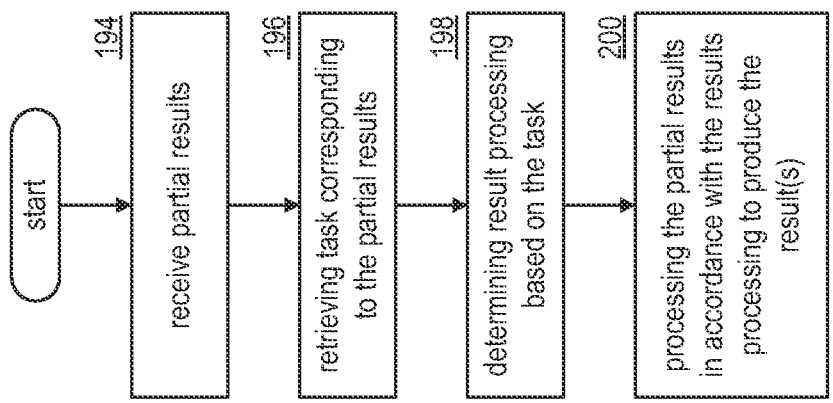
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
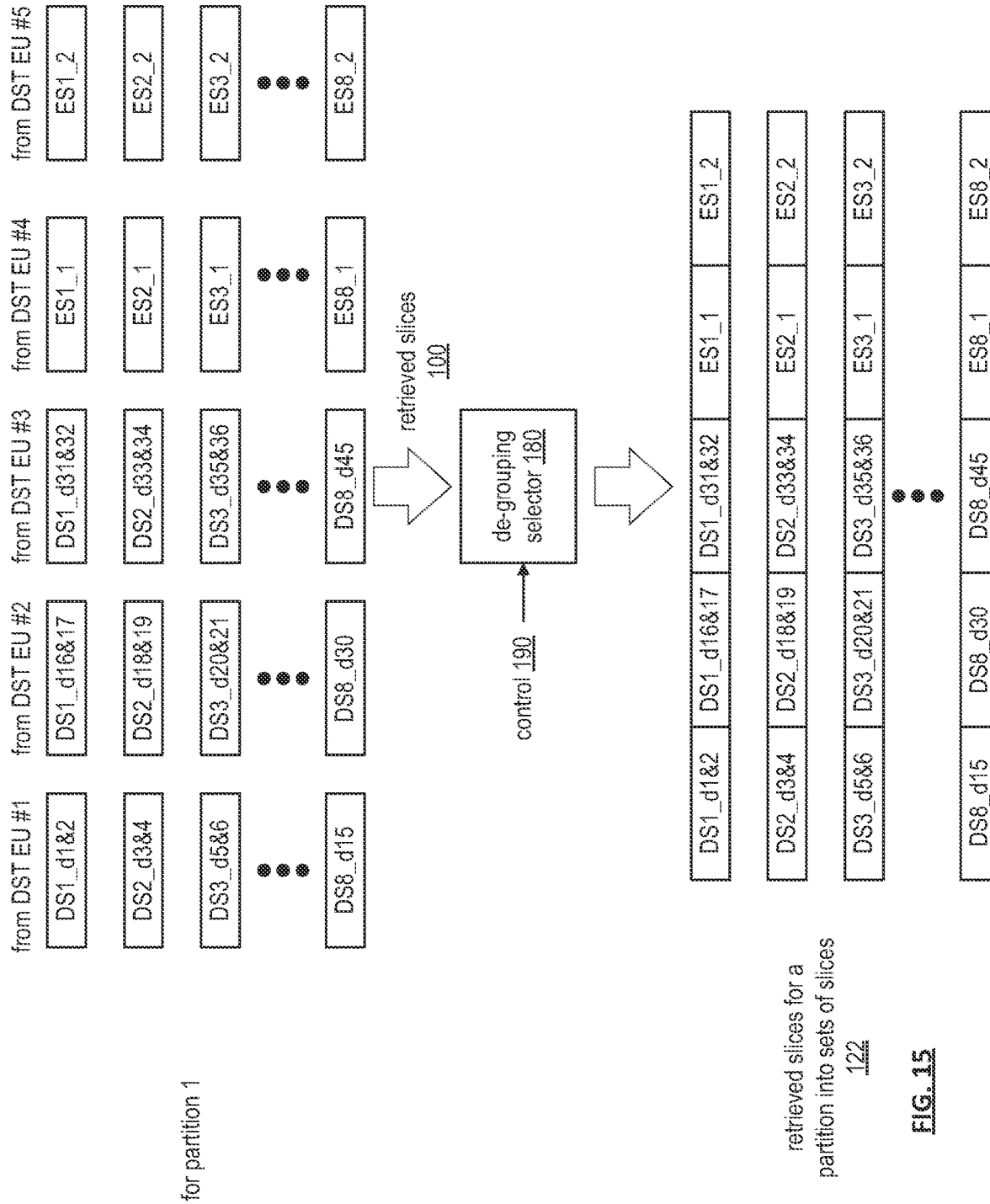
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
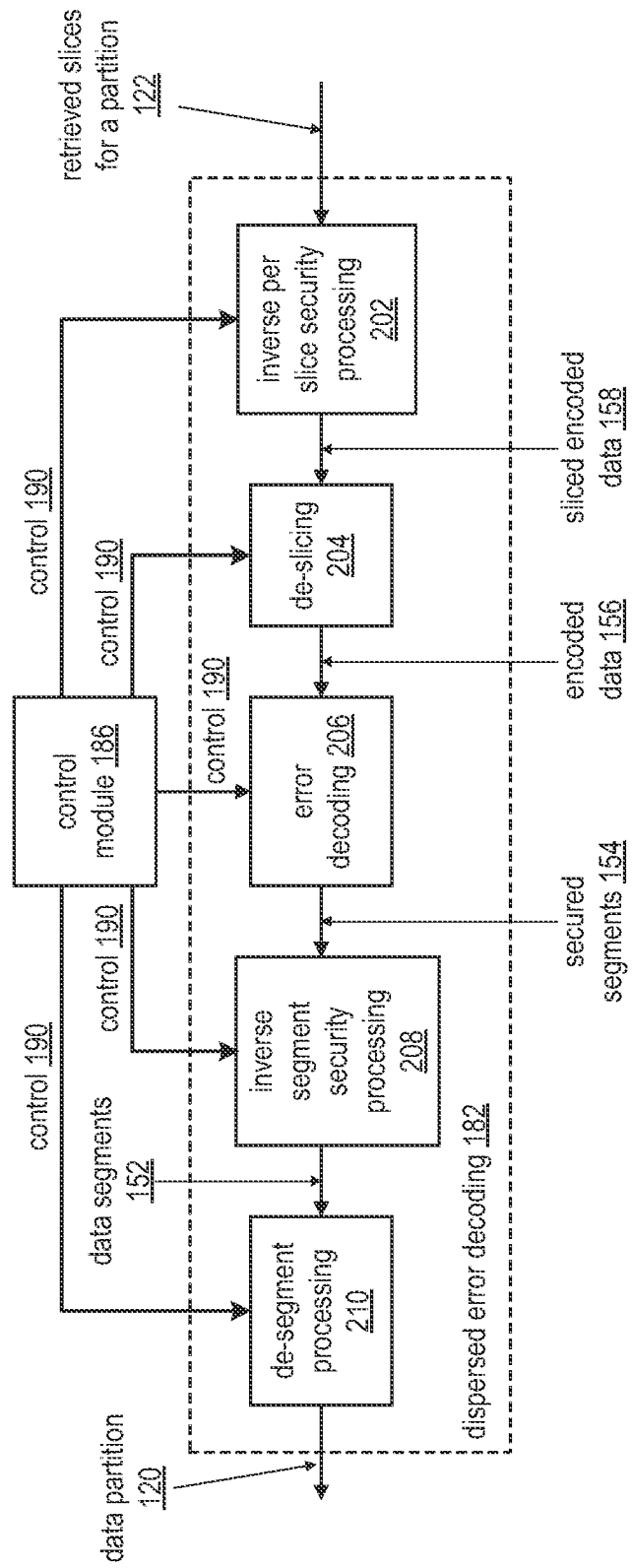
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
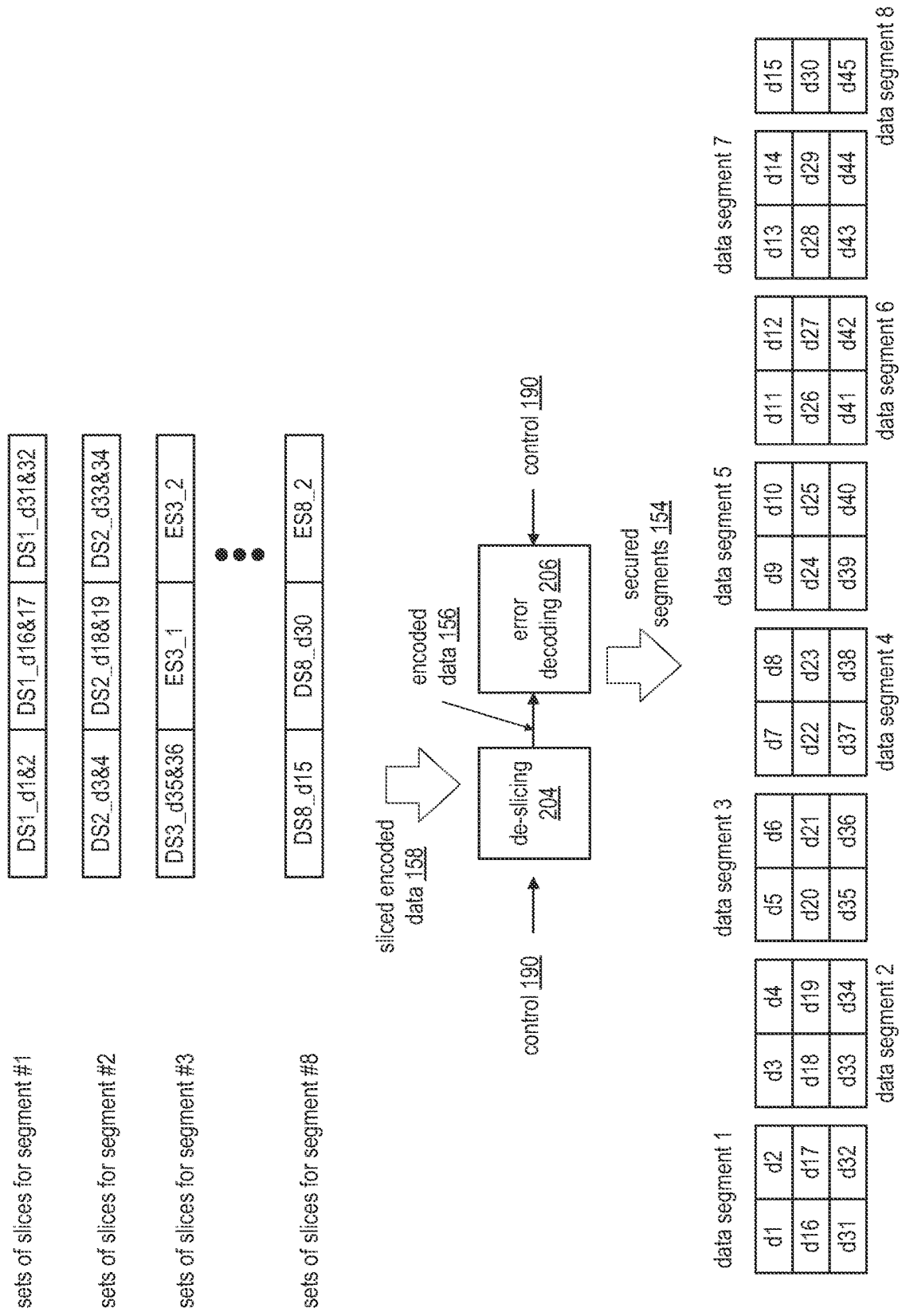
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_$d$1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
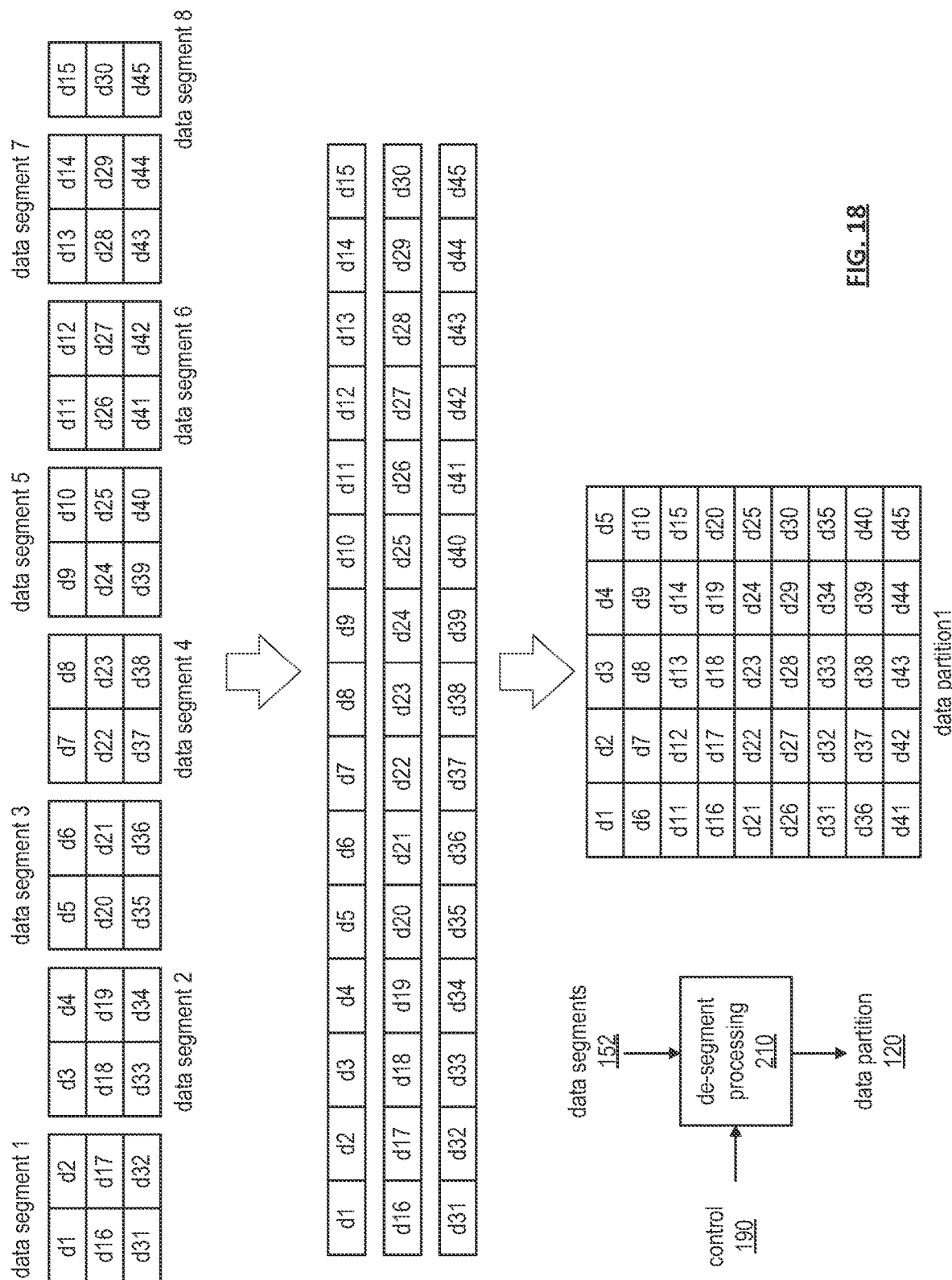
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
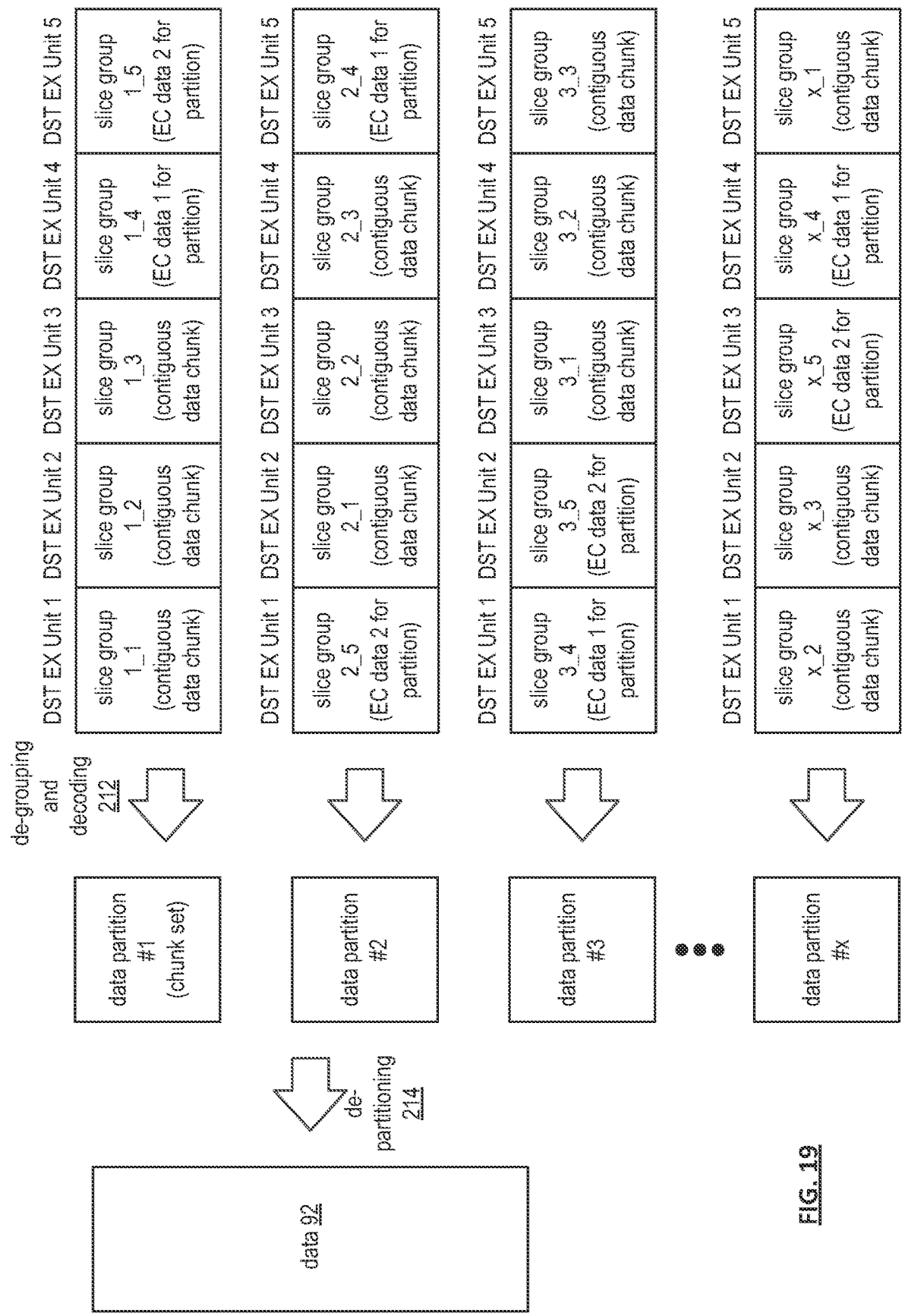
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
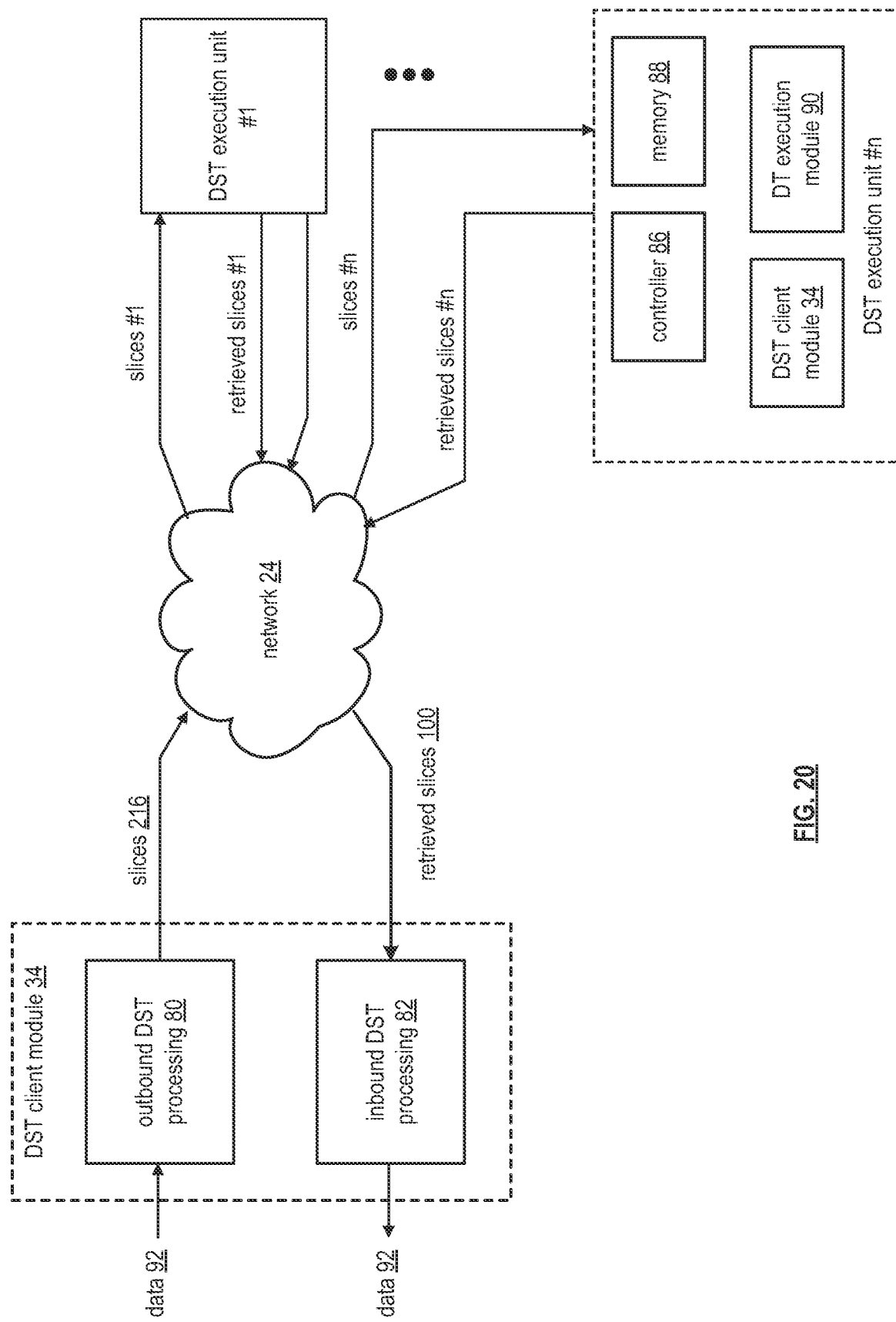
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
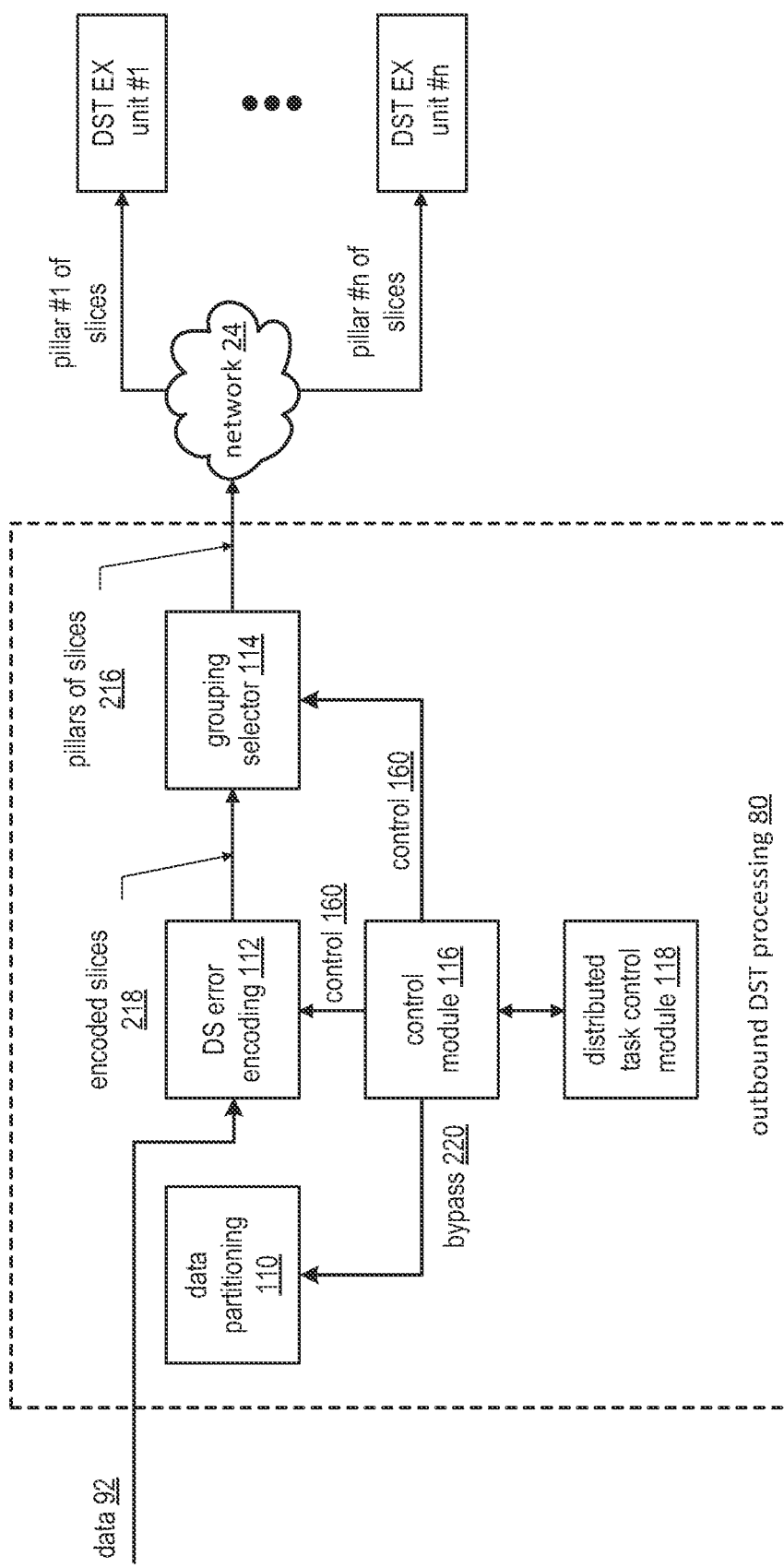
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
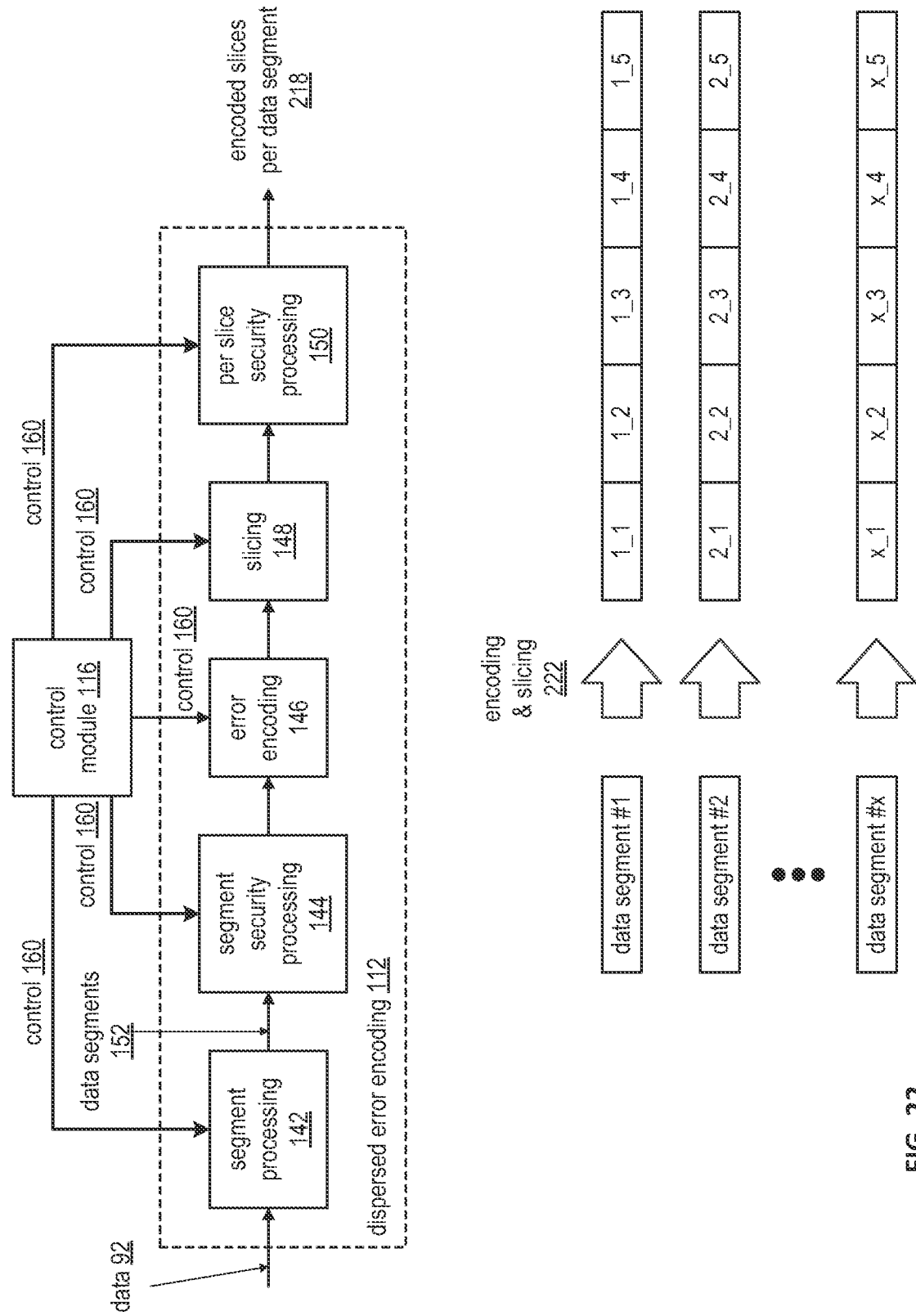
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
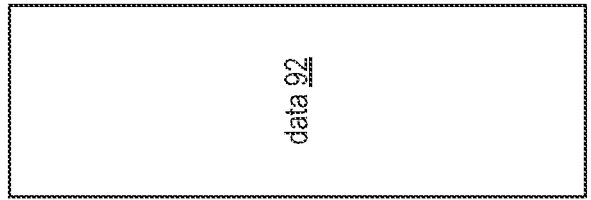
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed, the data 92 is encoded and sliced into a plurality of sets of encoded data slices; one set per data segment. The grouping selection module organizes the sets of encoded data slices into pillars of data slices. In this example, the DS error encoding parameters include a pillar width of 5 and a decode threshold of 3. As such, for each data segment, 5 encoded data slices are created.

The grouping selection module takes the first encoded data slice of each of the sets and forms a first pillar, which may be sent to the first DST execution unit. Similarly, the grouping selection module creates the second pillar from the second slices of the sets; the third pillar from the third slices of the sets; the fourth pillar from the fourth slices of the sets; and the fifth pillar from the fifth slices of the set.

Figure 24:
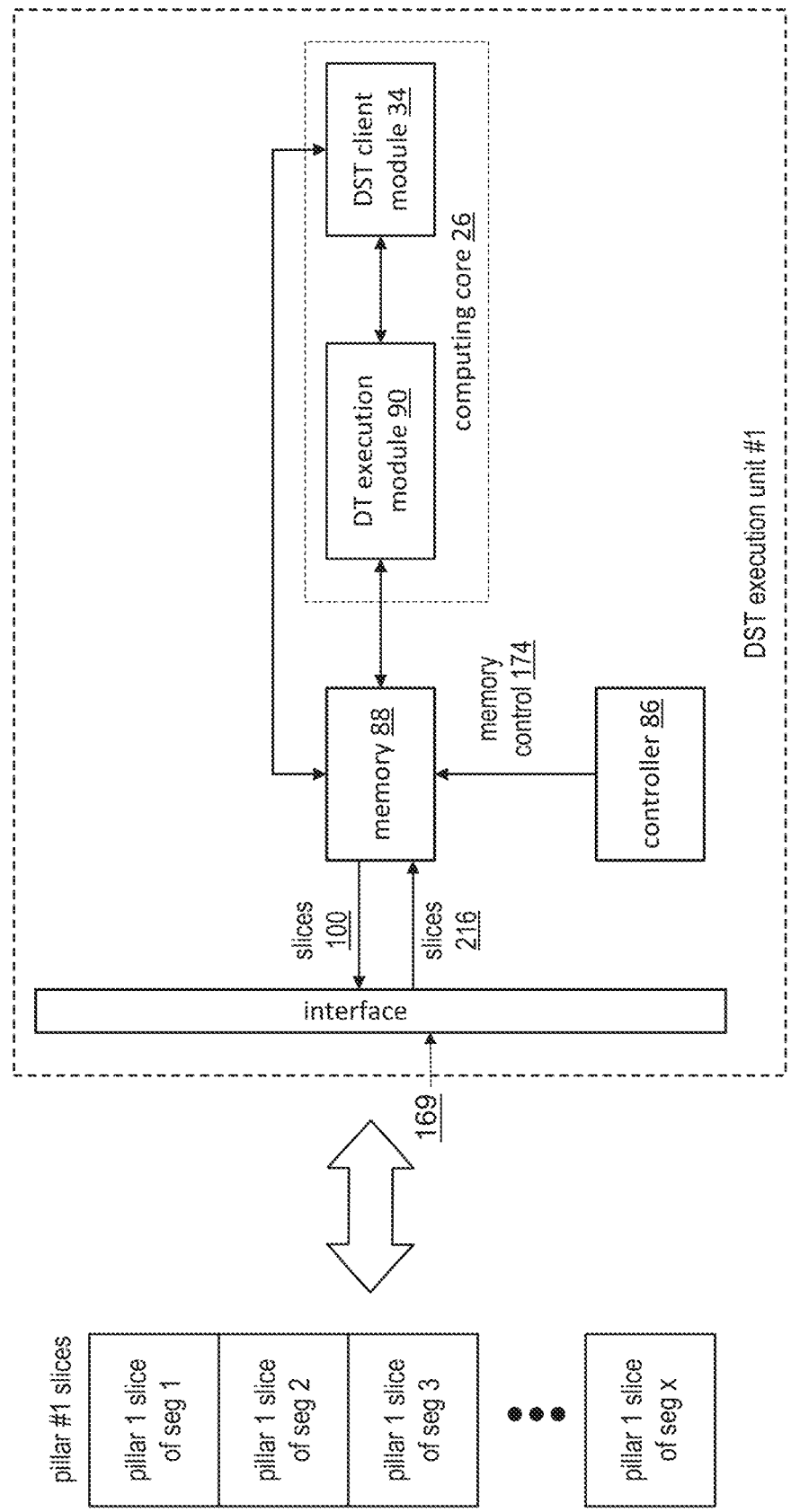
FIG. 24 is a schematic block diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
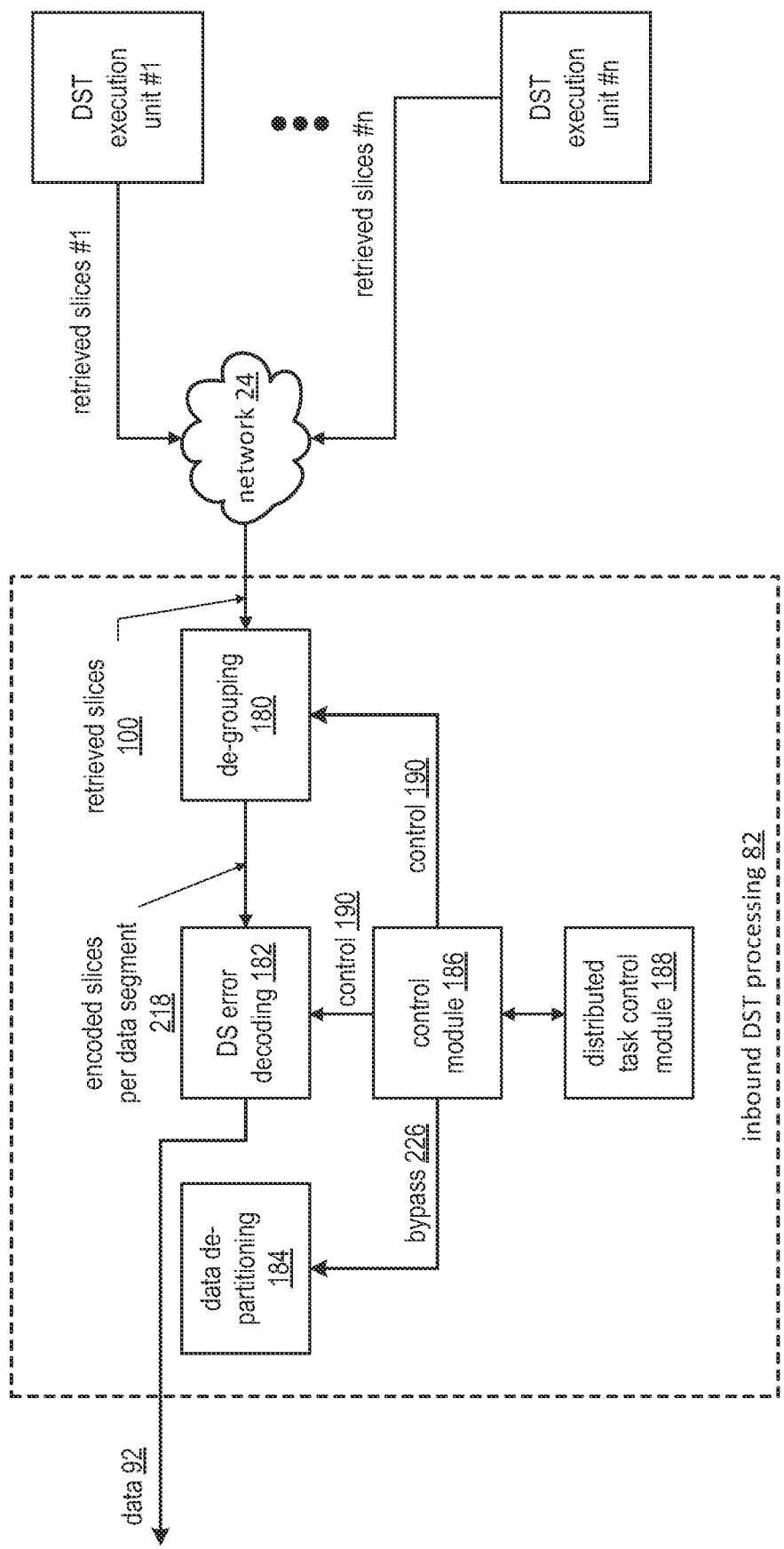
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
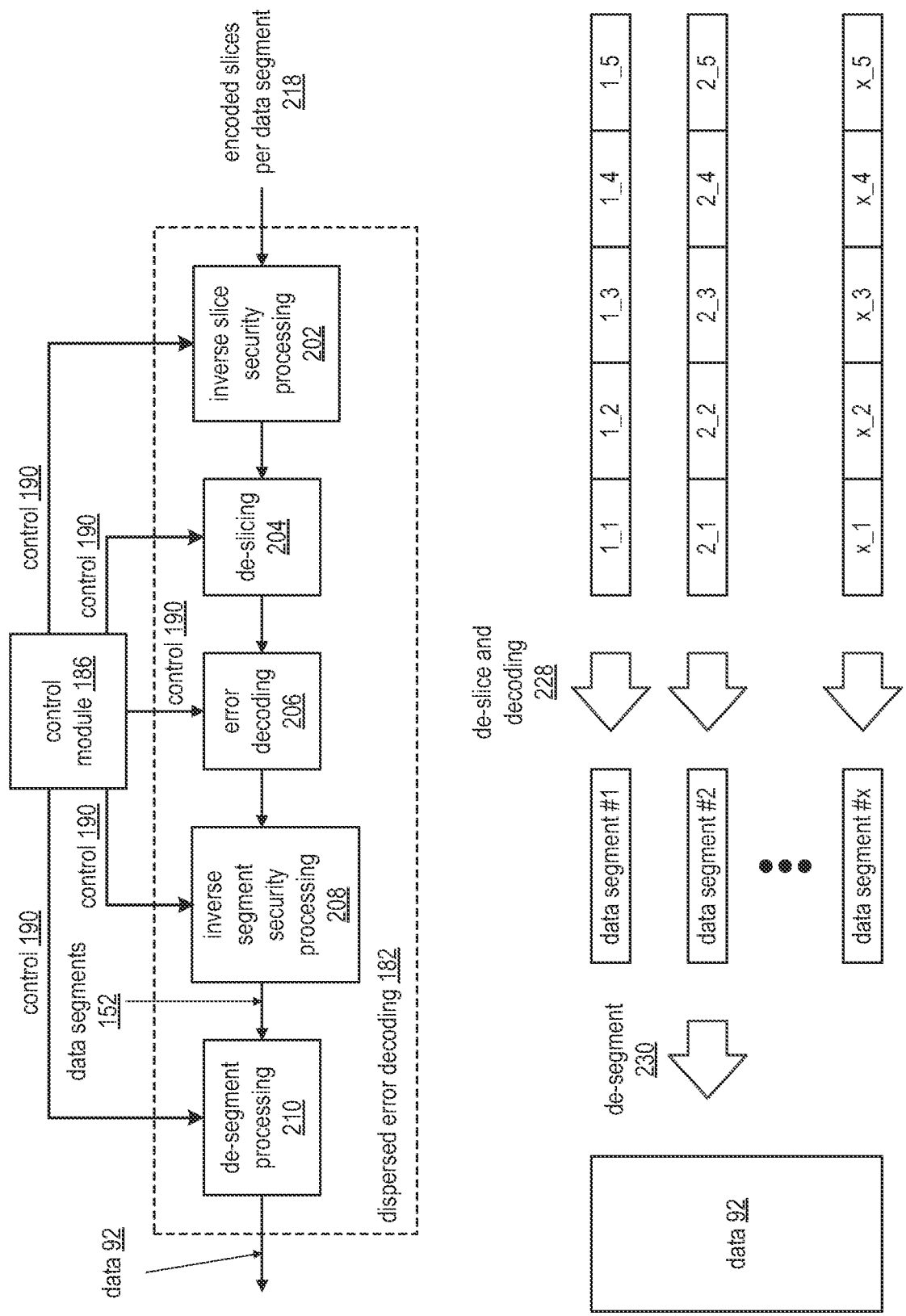
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
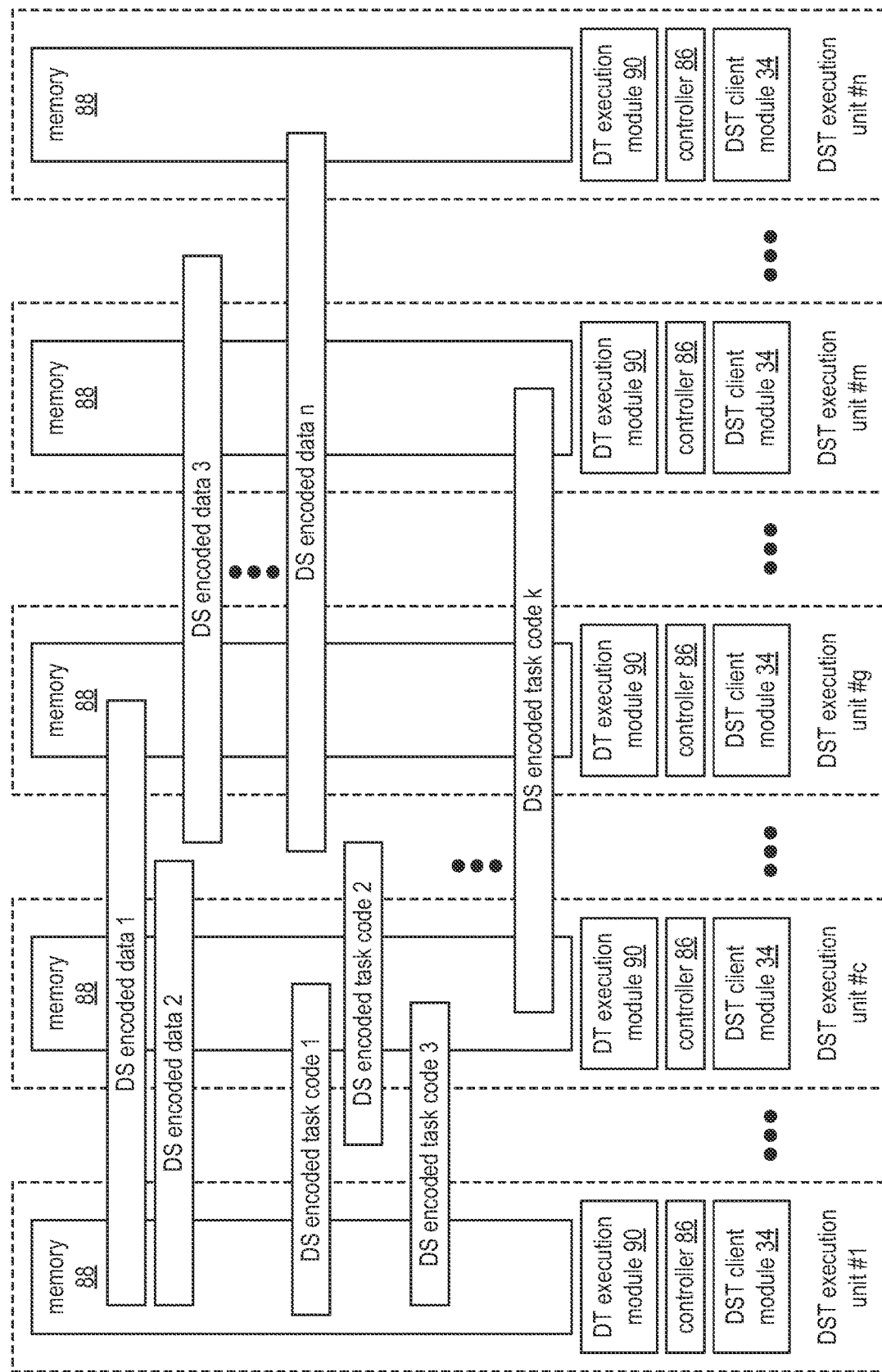
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
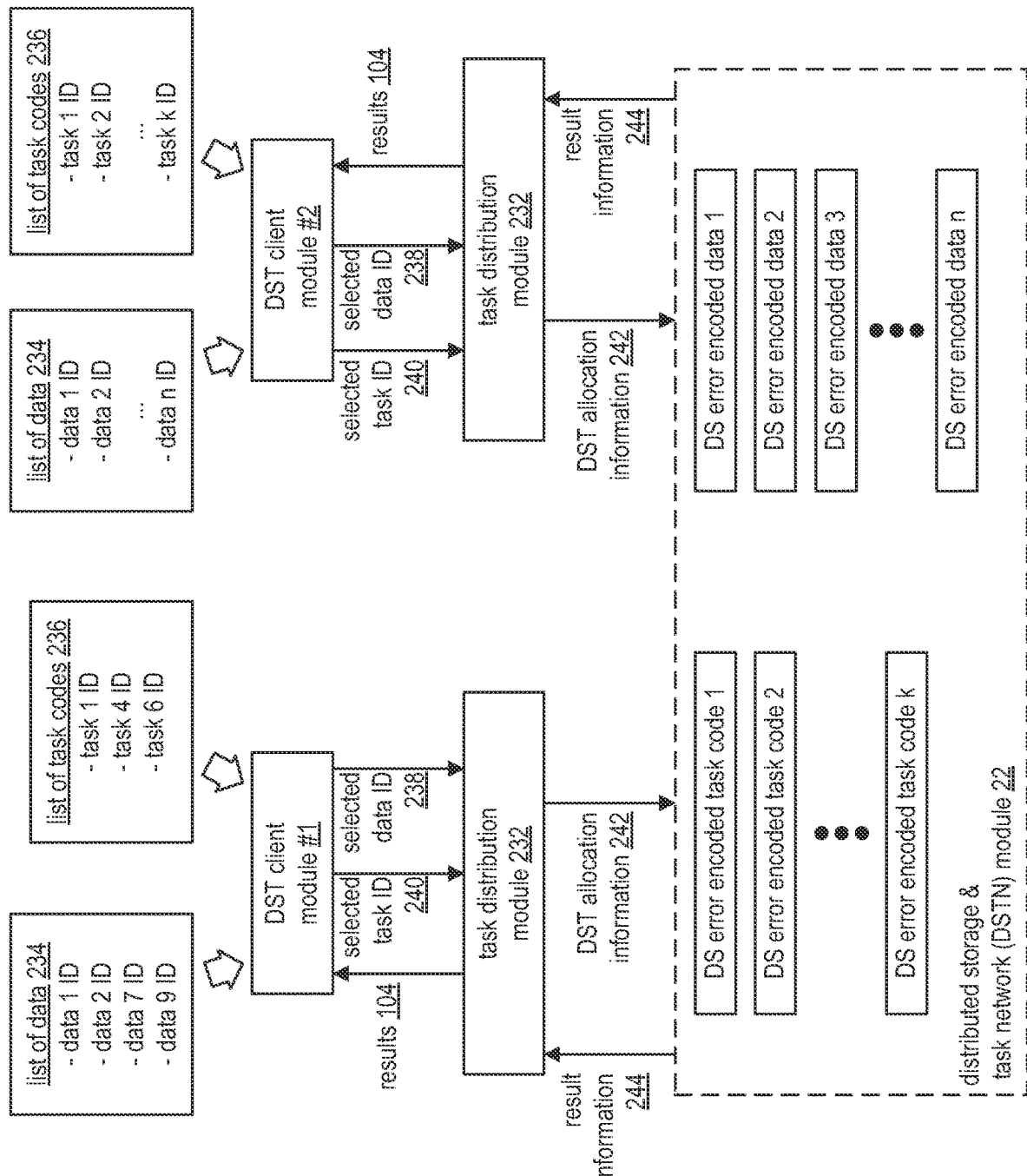
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
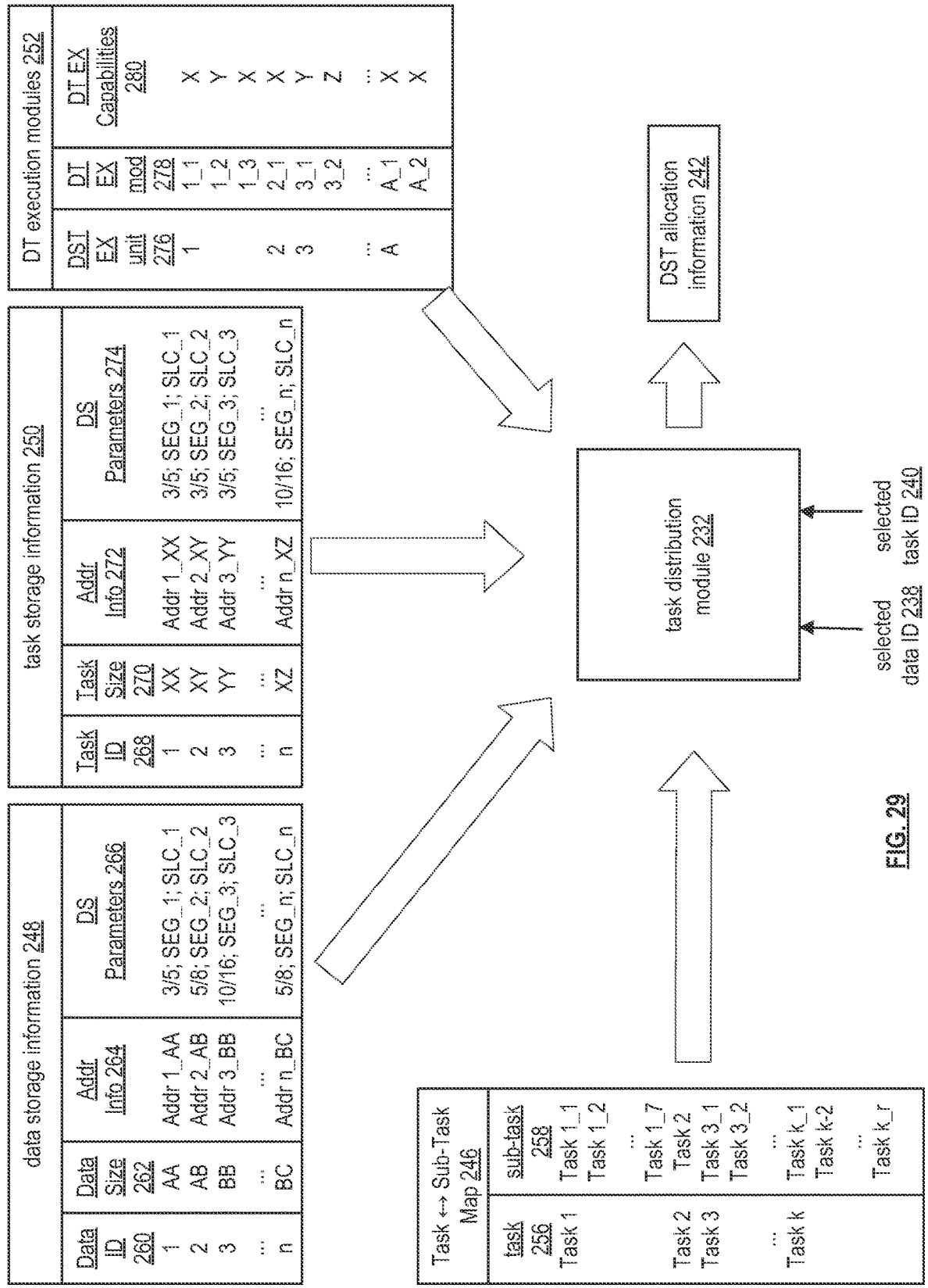
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task⇔sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/ pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task⇔sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
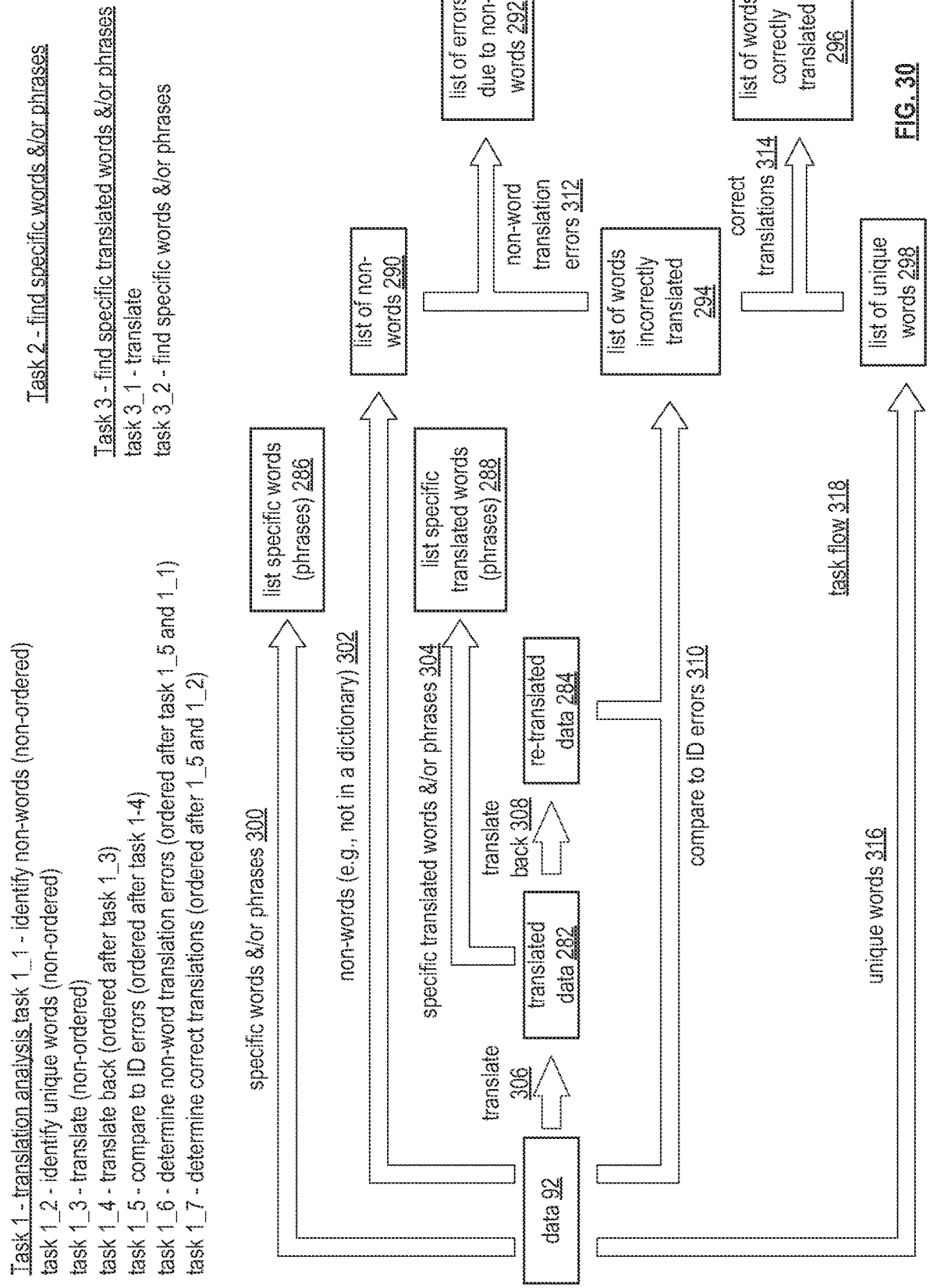
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1— identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
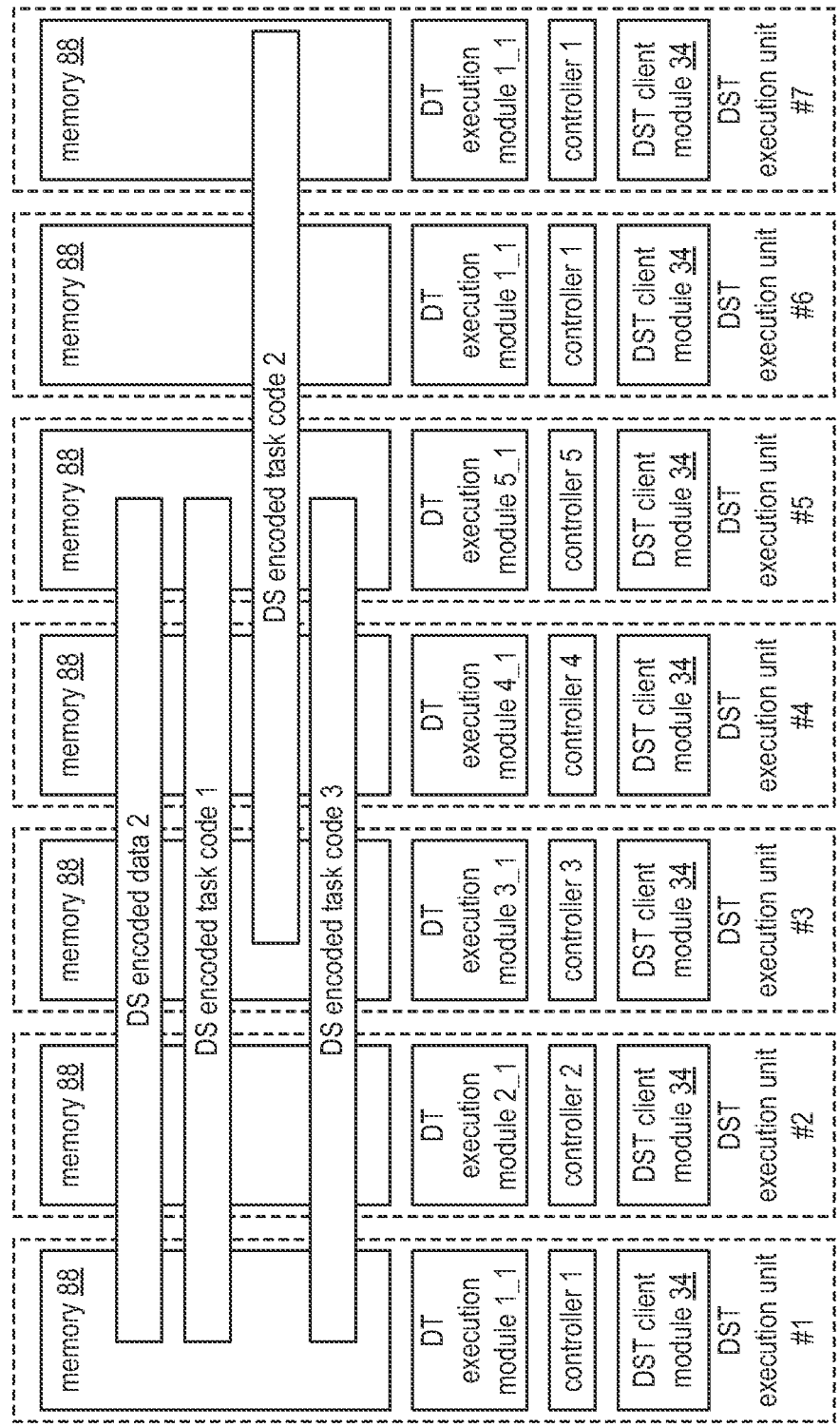
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1— 5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of ⅗ for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done the by DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition. As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., 1st through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., 1st through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., 1st through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
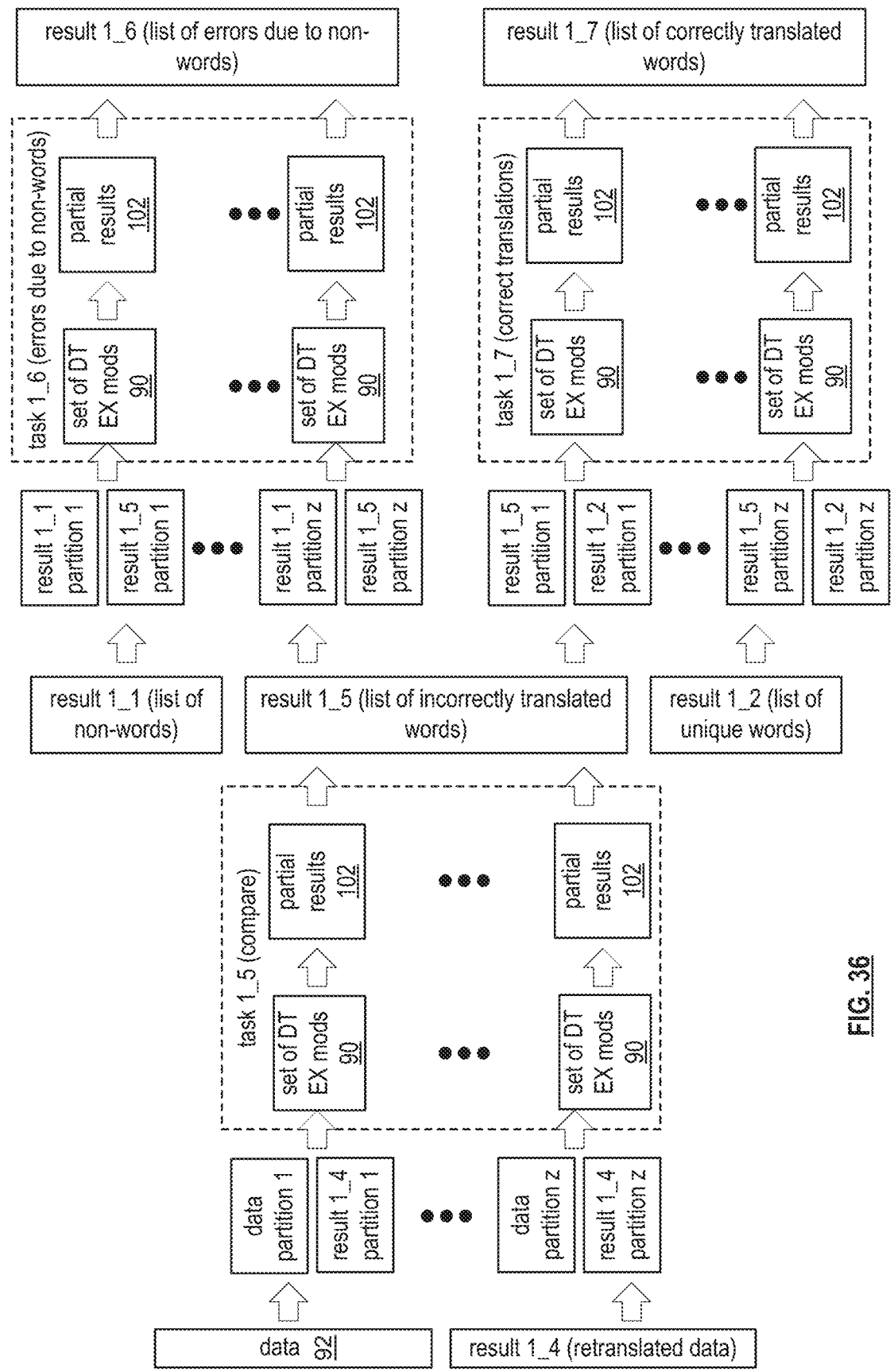

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., 1st through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., 1st through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., 1st through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., 1st through "zth") of specific words and/or phrases found in the data partitions. As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., 1st through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

Figure 40A:
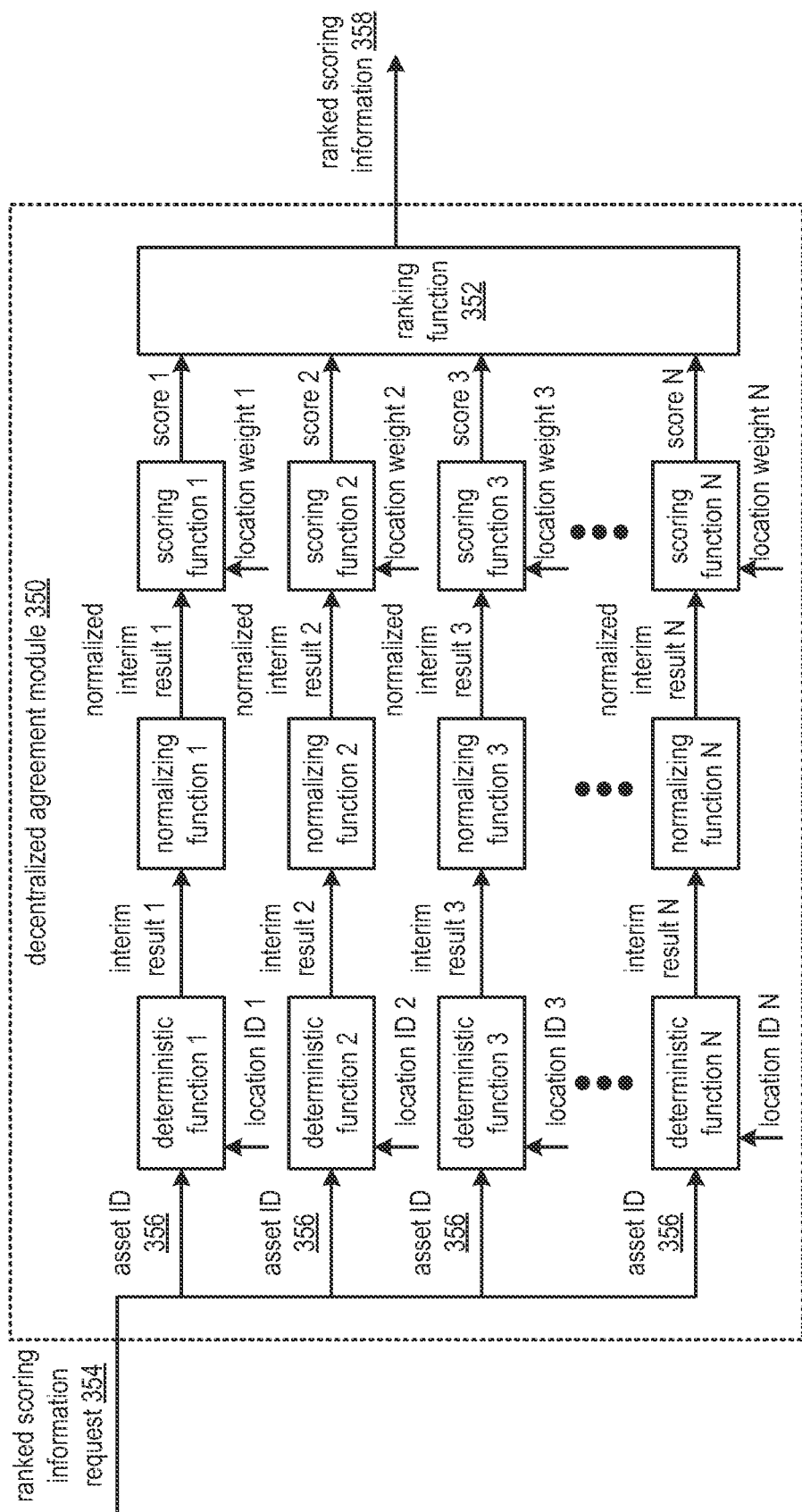
FIG. 40A is a schematic block diagram of an embodiment of a decentralized agreement module in accordance with the present invention.

FIG. 40A is a schematic block diagram of an embodiment of a decentralized agreement module 350 that includes a set of deterministic functions 1-N, a set of normalizing functions 1-N, a set of scoring functions 1-N, and a ranking function 352. Each of the deterministic function, the normalizing function, the scoring function, and the ranking function 352, may be implemented utilizing the processing module 84 of FIG. 3. The decentralized agreement module 350 may be implemented utilizing any module and/or unit of a dispersed storage network (DSN). For example, the decentralized agreement module is implemented utilizing the distributed storage and task (DST) client module 34 of FIG. 1.

The decentralized agreement module 350 functions to receive a ranked scoring information request 354 and to generate ranked scoring information 358 based on the ranked scoring information request 354 and other information. The ranked scoring information request 354 includes one or more of an asset identifier (ID) 356 of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 356 of the asset includes one or more of a data name, a data record identifier, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DST client module 34 of FIG. 1, a DST processing unit 16 of FIG. 1, a DST integrity processing unit 20 of FIG. 1, a DSTN managing unit 18 of FIG. 1, a user device 12 of FIG. 1, and a user device 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module 350 to produce ranked scoring information 358 with regards to selection of a memory device of the set of memory devices for accessing a particular encoded data slice (e.g., where the asset ID includes a slice name of the particular encoded data slice).

The decentralized agreement module 350 outputs substantially identical ranked scoring information for each ranked scoring information request that includes substantially identical content of the ranked scoring information request. For example, a first requesting entity issues a first ranked scoring information request to the decentralized agreement module 350 and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module 350 to determine substantially identical ranked scoring information. As a specific example, the first requesting entity selects a first storage pool of a plurality of storage pools for storing a set of encoded data slices utilizing the decentralized agreement module 350 and the second requesting entity identifies the first storage pool of the plurality of storage pools for retrieving the set of encoded data slices utilizing the decentralized agreement module 350.

In an example of operation, the decentralized agreement module 350 receives the ranked scoring information request 354. Each deterministic function performs a deterministic function on a combination and/or concatenation (e.g., add, append, interleave) of the asset ID 356 of the ranked scoring information request 354 and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 (e.g., a DST EX unit pool 2 of FIG. 40C) to a source name as the asset ID to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 352 performs a ranking function on the set of scores 1-N to generate the ranked scoring information 358. The ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information 358, the decentralized agreement module 350 outputs the ranked scoring information 358 to the requesting entity.

Figure 40B:
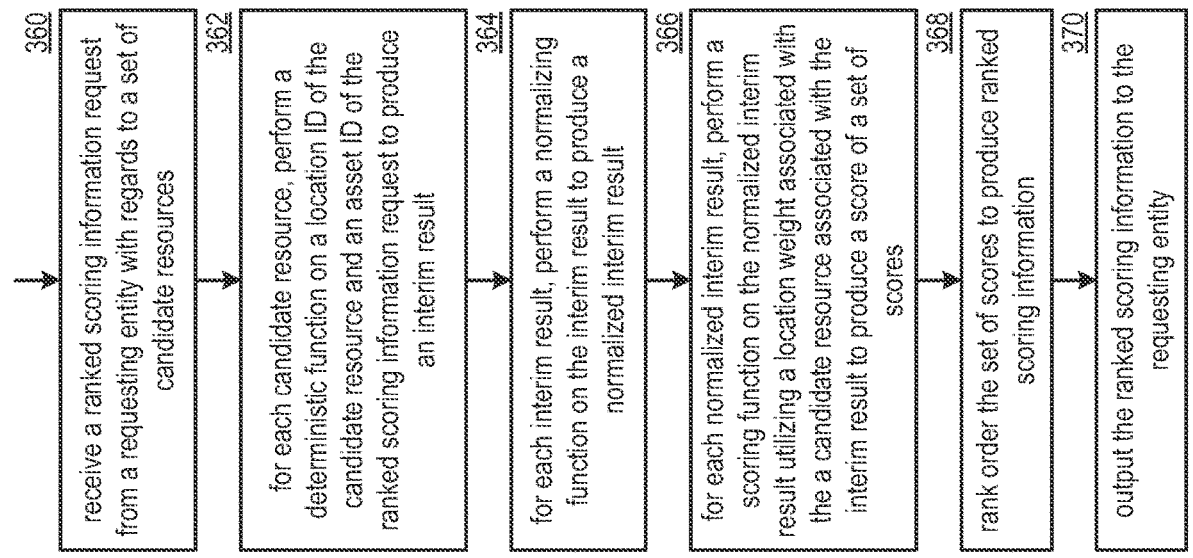
FIG. 40B is a flowchart illustrating an example of selecting the resource in accordance with the present invention.

FIG. 40B is a flowchart illustrating an example of selecting a resource. The method begins or continues at step 360 where a processing module (e.g., of a decentralized agreement module) receives a ranked scoring information request from a requesting entity with regards to a set of candidate resources. For each candidate resource, the method continues at step 362 where the processing module performs a deterministic function on a location identifier (ID) of the candidate resource and an asset ID of the ranked scoring information request to produce an interim result. As a specific example, the processing module combines the asset ID and the location ID of the candidate resource to produce a combined value and performs a hashing function on the combined value to produce the interim result.

For each interim result, the method continues at step 364 where the processing module performs a normalizing function on the interim result to produce a normalized interim result. As a specific example, the processing module obtains a permutation value associated with the deterministic function (e.g., maximum number of permutations of output of the deterministic function) and divides the interim result by the permutation value to produce the normalized interim result (e.g., with a value between 0 and 1).

For each normalized interim result, the method continues at step 366 where the processing module performs a scoring function on the normalized interim result utilizing a location weight associated with the candidate resource associated with the interim result to produce a score of a set of scores. As a specific example, the processing module divides the location weight by a negative log of the normalized interim result to produce the score.

The method continues at step 368 where the processing module rank orders the set of scores to produce ranked scoring information (e.g., ranking a highest value first). The method continues at step 370 where the processing module outputs the ranked scoring information to the requesting entity. The requesting entity may utilize the ranked scoring information to select one location of a plurality of locations.

Figure 40C:
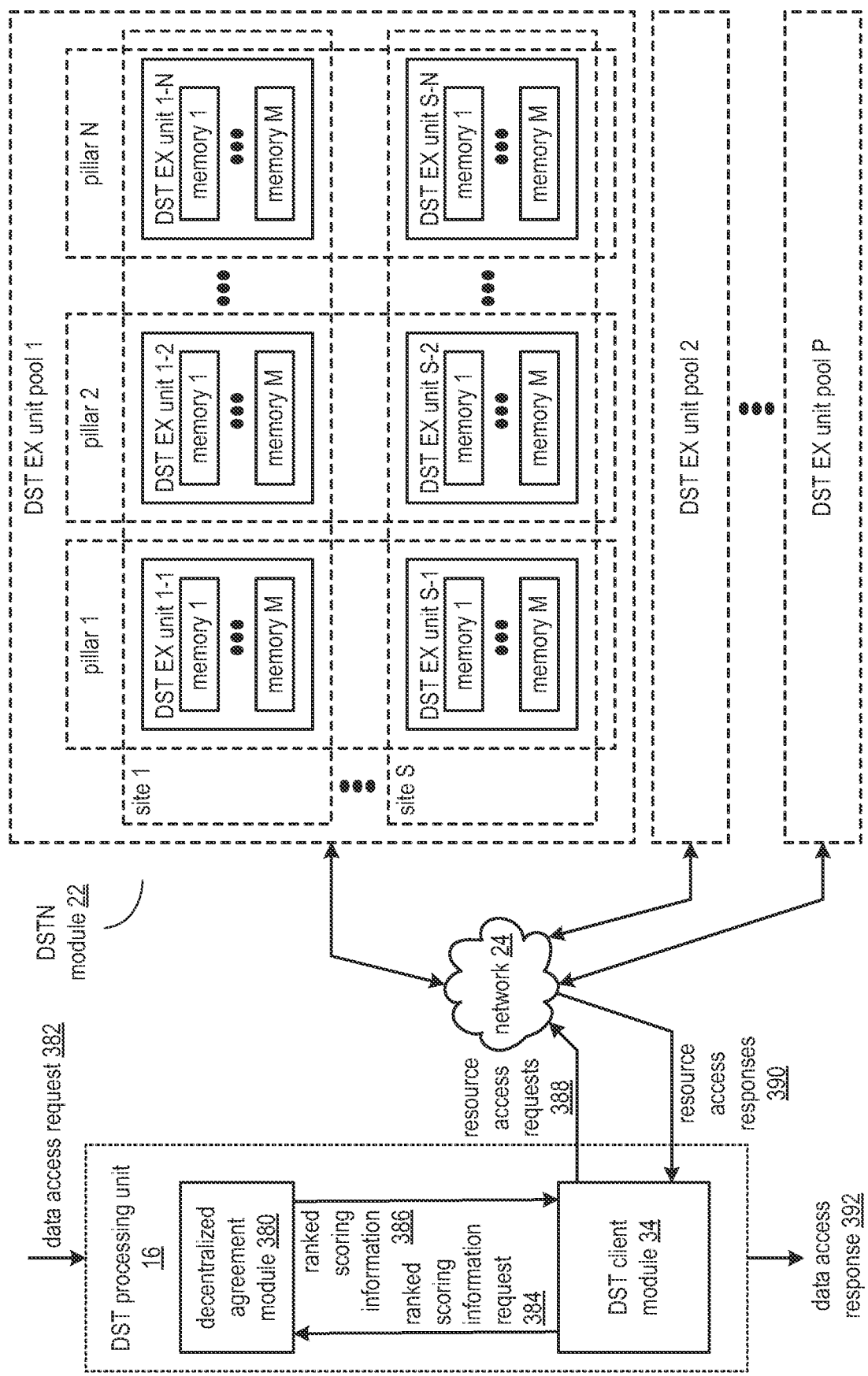
FIG. 40C is a schematic block diagram of an embodiment of a dispersed storage network (DSN) in accordance with the present invention.

FIG. 40C is a schematic block diagram of an embodiment of a dispersed storage network (DSN) that includes the distributed storage and task (DST) processing unit 16 of FIG. 1, the network 24 of FIG. 1, and the distributed storage and task network (DSTN) module 22 of FIG. 1. Hereafter, the DSTN module 22 may be interchangeably referred to as a DSN memory. The DST processing unit 16 includes a decentralized agreement module 380 and the DST client module 34 of FIG. 1. The decentralized agreement module 380 be implemented utilizing the decentralized agreement module 350 of FIG. 40A. The DSTN module 22 includes a plurality of DST execution (EX) unit pools 1-P. Each DST execution unit pool includes a one or more sites 1-S. Each site includes one or more DST execution units 1-N. Each DST execution unit may be associated with at least one pillar of N pillars associated with an information dispersal algorithm (IDA), where a data segment is dispersed storage error encoded using the IDA to produce one or more sets of encoded data slices, and where each set includes N encoded data slices and like encoded data slices (e.g., slice 3's) of two or more sets of encoded data slices are included in a common pillar (e.g., pillar 3). Each site may not include every pillar and a given pillar may be implemented at more than one site. Each DST execution unit includes a plurality of memories 1-M. Each DST execution unit may be implemented utilizing the DST execution unit 36 of FIG. 1. Hereafter, a DST execution unit may be referred to interchangeably as a storage unit and a set of DST execution units may be interchangeably referred to as a set of storage units and/or as a storage unit set.

The DSN functions to receive data access requests 382, select resources of at least one DST execution unit pool for data access, utilize the selected DST execution unit pool for the data access, and issue a data access response 392 based on the data access. The selecting of the resources includes utilizing a decentralized agreement function of the decentralized agreement module 380, where a plurality of locations are ranked against each other. The selecting may include selecting one storage pool of the plurality of storage pools, selecting DST execution units at various sites of the plurality of sites, selecting a memory of the plurality of memories for each DST execution unit, and selecting combinations of memories, DST execution units, sites, pillars, and storage pools.

In an example of operation, the DST client module 34 receives the data access request 382 from a requesting entity, where the data access request 382 includes at least one of a store data request, a retrieve data request, a delete data request, a data name, and a requesting entity identifier (ID). Having received the data access request 382, the DST client module 34 determines a DSN address associated with the data access request. The DSN address includes at least one of a source name (e.g., including a vault ID and an object number associated with the data name), a data segment ID, a set of slice names, and a plurality of sets of slice names. The determining includes at least one of generating (e.g., for the store data request) and retrieving (e.g., from a DSN directory, from a dispersed hierarchical index) based on the data name (e.g., for the retrieve data request).

Having determined the DSN address, the DST client module 34 selects a plurality of resource levels (e.g., DST EX unit pool, site, DST execution unit, pillar, memory) associated with the DSTN module 22. The determining may be based on one or more of the data name, the requesting entity ID, a predetermination, a lookup, a DSN performance indicator, and interpreting an error message. For example, the DST client module 34 selects the DST execution unit pool as a first resource level and a set of memory devices of a plurality of memory devices as a second resource level based on a system registry lookup for a vault associated with the requesting entity.

Having selected the plurality resource levels, the DST client module 34, for each resource level, issues a ranked scoring information request 384 to the decentralized agreement module 380 utilizing the DSN address as an asset ID. The decentralized agreement module 380 performs the decentralized agreement function based on the asset ID (e.g., the DSN address), identifiers of locations of the selected resource levels, and location weights of the locations to generate ranked scoring information 386.

For each resource level, the DST client module 34 receives corresponding ranked scoring information 386. Having received the ranked scoring information 386, the DST client module 34 identifies one or more resources associated with the resource level based on the ranked scoring information 386. For example, the DST client module 34 identifies a DST execution unit pool associated with a highest score and identifies a set of memory devices within DST execution units of the identified DST execution unit pool with a highest score.

Having identified the one or more resources, the DST client module 34 accesses the DSTN module 22 based on the identified one or more resources associated with each resource level. For example, the DST client module 34 issues resource access requests 388 (e.g., write slice requests when storing data, read slice requests when recovering data) to the identified DST execution unit pool, where the resource access requests 388 further identify the identified set of memory devices. Having accessed the DSTN module 22, the DST client module 34 receives resource access responses 390 (e.g., write slice responses, read slice responses). The DST client module 34 issues the data access response 392 based on the received resource access responses 390. For example, the DST client module 34 decodes received encoded data slices to reproduce data and generates the data access response 392 to include the reproduced data.

Figure 40D:
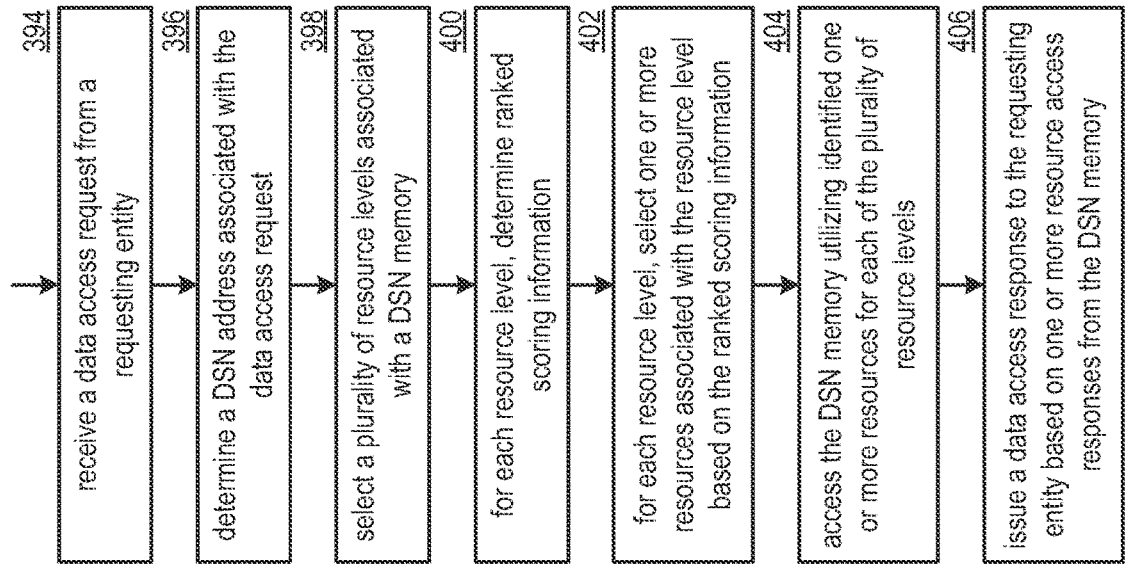
FIG. 40D is a flowchart illustrating an example of accessing a dispersed storage network (DSN) memory in accordance with the present invention.

FIG. 40D is a flowchart illustrating an example of accessing a dispersed storage network (DSN) memory. The method begins or continues at step 394 where a processing module (e.g., of a distributed storage and task (DST) client module) receives a data access request from a requesting entity. The data access request includes one or more of a storage request, a retrieval request, a requesting entity identifier, and a data identifier (ID). The method continues at step 396 where the processing module determines a DSN address associated with the data access request. For example, the processing module generates the DSN address for the storage request. As another example, the processing module performs a lookup for the retrieval request based on the data identifier.

The method continues at step 398 where the processing module selects a plurality resource levels associated with the DSN memory. The selecting may be based on one or more of a predetermination, a range of weights associated with available resources, a resource performance level, and a resource performance requirement level. For each resource level, the method continues at step 400 where the processing module determines ranked scoring information. For example, the processing module issues a ranked scoring information request to a decentralized agreement module based on the DSN address and receives corresponding ranked scoring information for the resource level, where the decentralized agreement module performs a decentralized agreement protocol function on the DSN address using the associated resource identifiers and resource weights for the resource level to produce the ranked scoring information for the resource level.

For each resource level, the method continues at step 402 where the processing module selects one or more resources associated with the resource level based on the ranked scoring information. For example, the processing module selects a resource associated with a highest score when one resource is required. As another example, the processing module selects a plurality of resources associated with highest scores when a plurality of resources are required.

The method continues at step 404 where the processing module accesses the DSN memory utilizing the selected one or more resources for each of the plurality of resource levels. For example, the processing module identifies network addressing information based on the selected resources including one or more of a storage unit Internet protocol address and a memory device identifier, generates a set of encoded data slice access requests based on the data access request and the DSN address, and sends the set of encoded data slice access requests to the DSN memory utilizing the identified network addressing information.

The method continues at step 406 where the processing module issues a data access response to the requesting entity based on one or more resource access responses from the DSN memory. For example, the processing module issues a data storage status indicator when storing data. As another example, the processing module generates the data access response to include recovered data when retrieving data.

FIGS. 41A-F are a schematic block diagram of another embodiment of a dispersed storage network (DSN) that includes the distributed storage and task (DST) integrity processing unit 20 of FIG. 1, the network 24 of FIG. 1, and a plurality of storage unit sets 1-3. The DST integrity processing unit 20 includes a decentralized agreement module 410 and the DST client module 34 of FIG. 1. The decentralized agreement module 410 may be implemented utilizing the decentralized agreement module 350 of FIG. 40A. Each storage unit set includes a set of DST execution units 1-*n*. Each DST execution unit may be implemented utilizing the DST execution unit 36 of FIG. 1. Hereafter, each DST execution unit may be interchangeably referred to as a storage unit, a storage unit set may be interchangeably referred to as a set of storage units and/or a storage pool, and the plurality of storage unit sets may be interchangeably referred to as a DSN memory and/or a plurality of storage pools The DSN functions to recover an encoded data slice, where a data object is divided into a plurality of N data segments, where each data segment is dispersed storage error encoded to produce a set of encoded data slices 1-*n*, and where each set of encoded data slices is stored in at least one set of DST execution units. For example, the DST client module 34 dispersed storage error encodes the data object to produce a first set of encoded data slices 1-1 through n-1, a second set of encoded data slices 1-2 through n-2, a third set of encoded data slices 1-3 through n-3, etc., through an Nth set of encoded data slices 1-N through n-N, selects the storage unit set 1 for storage of the plurality of sets of encoded data slices in accordance with a scoring function (e.g., by identifying a storage unit set 1 as a highest ranked storage unit set of the plurality of storage unit sets for the data object utilizing the decentralized agreement module 410), and facilitates storage of the plurality of sets of encoded data slices in the DST execution units 1-*n* of the storage unit set 1.

FIG. 41A illustrates steps of an example of operation of the recovering of the encoded data slice where the DST integrity processing unit 20 receives a DSN retrieval request regarding the data object. The DSN retrieval request includes one of a variety of DSN retrieval request components. A first DSN retrieval request component includes a read request for reading the data object from the DSN memory, where a favorable response to a corresponding one of a set of retrieval requests includes sending a corresponding portion of the data object. A second DSN retrieval request component includes a list request for storage information regarding the data object, where the favorable response to a corresponding one of the set of retrieval requests includes sending storage information (e.g., a slice name, a DSN address, a revision level, etc.) regarding the corresponding portion of the data object. A third DSN retrieval request component includes an individual read request regarding the corresponding portion of the data object, where the favorable response includes sending the corresponding portion of the data object and wherein the set of primary storage units only includes the primary storage unit. A fourth DSN retrieval request component includes an individual list request regarding the corresponding portion of the data object, where the favorable response includes sending the storage information of the corresponding portion of the data object and wherein the set of primary storage units only includes the primary storage unit.

Having received the DSN retrieval request, the DST integrity processing unit 20 performs a scoring function using one or more properties of the DSN retrieval request (e.g., a DSN address, a source name, a slice name) and one or more properties of the DSN memory of the DSN (e.g., identities of the storage pools, identities of the storage units, weighting factors of the storage pools, weighting factors of the storage units) to produce a storage scoring resultant, where the DSN memory includes a plurality of storage units that are logically arranged into the plurality of storage pools.

The performing the scoring function includes a variety of approaches. In a first scoring function approach, the DST client module 34 selects a resource level and selects the one or more properties of the DSN memory from a plurality of properties of the DSN memory based on the selected resource level. The DST client module 34 issues a ranked scoring information request 412 to the decentralized agreement module 410, where the ranked scoring information request 412 includes one or more of the selected resource level, the one or more properties of the DSN memory, and the one or more properties of the DSN retrieval request. The decentralized agreement module 410 calculates, based on the selected resource level, a plurality of storage values (e.g., a score associated with each storage pool) based on the one or more properties of the DSN retrieval request and the one or more properties of DSN memory. Having calculated the plurality of storage values, the decentralized agreement module 410 performs a ranking function on the plurality of storage values to produce the storage scoring resultant and sends ranked scoring information 414, that includes the storage scoring resultant, to the DST client module 34.

In a second scoring function approach, the performing the scoring function includes the DST client module 34 selecting a storage pool level indication as the resource level and selecting a storage pool identifier and a storage pool weighting factor for each of the plurality of storage pools to produce a plurality of storage pool identifiers and a plurality of storage pool weighting factors, where the one or more properties of DSN memory includes the plurality of storage pool identifiers and the plurality of storage pool weighting factors. The DST client module 34 selects the source name of the DSN retrieval request as the one or more properties of the DSN retrieval request. The decentralized agreement module 410 performs a series of functions on the source name based on the plurality of storage pool identifiers and the plurality of storage pool weighting factors to produce the plurality of storage values and performs a ranking function on the plurality of storage values to produce the storage scoring resultant. For example, a series of the series of functions includes a deterministic function of the source name and one of the storage pool identifiers to produce an interim result, a normalizing function of the interim result to produce a normalized interim result, and a scoring function of the normalized interim result and a corresponding one of the storage pool weighting factors to produce a storage value of the plurality of storage values (e.g., the ranked scoring information 414).

In a third scoring function approach, the performing the scoring function includes the DST client module 34 selecting a storage unit level indication as the resource level and selecting a storage site-storage unit identifier and a storage site-storage weighting factor for each of the plurality of storage units to produce a plurality of storage site-storage unit identifiers and a plurality of storage site-storage unit weighting factors, where the one or more properties of DSN memory includes the plurality of storage site-storage unit identifiers and the plurality of storage site-storage unit weighting factors. The DST client module 34 selects the source name of the DSN retrieval request as the one or more properties of the DSN retrieval request. The decentralized agreement module 410 performs the series of functions on the source name based on the plurality of storage site-storage unit identifiers and the plurality of storage site-storage unit weighting factors to produce the plurality of storage values and performs the ranking function on the plurality of storage value to produce the storage scoring resultant (e.g., the ranked scoring information 414).

Having performed the scoring function to produce the storage scoring resultant, the DST client module 34 identifies a set of primary storage units of the plurality of storage units based on the storage scoring resultant. For example, the DST client module 34 identifies the storage units of the storage unit set 1 as the set of primary storage units when the storage scoring resultant indicates that the storage unit set 1 is associated with a highest of the ranked scores of the storage scoring resultant.

Having identified the set of primary storage units, the DST client module 34 sends, via the network 24, a set of retrieval requests to the set of primary storage units regarding the DSN retrieval request. For example, the DST client module 34, issues list slice requests to the DST execution units of the storage unit set 1 and receives a slice availability information 1 from the storage unit set 1 in response, where the slice availability information 1 indicates whether a storage error (e.g., a missing encoded data slice, a corrupted encoded data slice) has occurred with regards to one or more encoded data slices of at least some of the plurality of sets of encoded data slices of the data object.

When a primary storage unit of the set of primary storage units does not provide a favorable response to a corresponding one of the set of retrieval requests regarding a corresponding portion of the data object, the DST client module 34 indicates the storage error for the corresponding portion of the data object. For example, the DST client module 34 interprets the slice availability information 1 from the DST execution units of the storage unit set 1 to determine that the storage error has occurred with regards to the encoded data slice 2-3 from the primary storage unit (e.g., DST execution unit 2 of the storage unit set 1).

FIG. 41B illustrates further steps of the example of operation of the recovering of the encoded data slice where, the DST client module 34, when the primary storage unit of the set of primary storage units does not provide the favorable response, uses the storage scoring resultant to identify an alternative storage unit of the plurality of storage units regarding the corresponding portion of the data object. For example, the DST client module 34 selects the DST execution unit 2 of the storage unit set 3 as the alternative storage unit when the slice availability information 1 indicates the unfavorable response (e.g., a missing encoded data slice 2-3 from primary storage unit DST execution unit 2 of the storage unit set 1), the storage scoring resultant (e.g., ranked scoring information 414) indicates that the storage unit set 3 is associated with a next highest score, and slice availability information from the DST execution unit 2 of the storage unit set 3 indicates that the encoded data slice 2-3 is available (e.g., verifying encoded data slice availability as part of the identifying of the alternative storage unit).

When the alternative storage unit is selected, the DST client module 34 sends, via the network 24, the corresponding one of the set of retrieval requests to the alternative storage unit. For example, the DST client module 34 sends a slice availability information request to the DST execution unit 2 of the storage unit set 3, where the slice availability information request is with regards to the encoded data slice 2-3. The alternative storage unit issues, via the network 24, a corresponding slice availability information response to the DST client module 34 with regards to the corresponding one of the set of retrieval requests. Alternatively, or in addition to, the DST client module 34 sends the corresponding one of the set of retrieval requests to more than one alternative storage unit in accordance with the storage scoring resultant (e.g., next highest scores). For example, the DST client module 34 receives, via the network 24, slice availability information 2-3 from two or more alternative storage units of the storage unit sets 3 and 2 indicating whether the encoded data slice 2-3 is available and indicates that the DST execution unit 2 of the storage unit set 3 is verified as the identified alternative storage unit.

FIG. 41C illustrates further steps of the example of operation of the recovering of the encoded data slice where the DST client module 34, when the alternative storage unit is identified (e.g., DST execution unit 2 of the storage unit set 3 holds encoded data slice 2-3 as available), facilitates transfer of the corresponding portion of the data object from the alternative storage unit to the primary storage unit when the primary storage unit is available. For example, the DST client module 34 issues, via the network 24, a transfer request for encoded data slice 2-3 to the DST execution unit 2 of the storage unit set 3, where the DST execution unit 2 of the storage unit set 3 sends, via the network 24, the encoded data slice 2-3 to the DST execution unit 2 of the storage unit set 1 for storage.

FIG. 41D illustrates steps of another example of operation of the recovering of the encoded data slice where the DST integrity processing unit 20, having received the DSN retrieval request regarding the data object, performs the scoring function using the one or more properties of the DSN retrieval request and the one or more properties of the DSN memory to produce the storage scoring resultant. Having produced the storage scoring resultant, the DST client module 34 identifies the set of primary storage units based on the storage scoring resultant. For example, the DST client module 34 identifies the DST execution units of the storage unit set 1 as the primary storage units when the storage pool level has been selected as the resource level.

Having identified the primary storage units, the DST client module 34 sends, via the network 24, the set of retrieval requests to the set of primary storage units regarding the DSN retrieval request. For example, the DST client module 34 issues slice availability information requests (e.g., list slice request) for substantially all of the plurality of sets of encoded data slices to the set of DST execution units of the storage unit set 1. Having sent the retrieval requests, the DST client module 34 receives slice availability information from at least some of the storage units of the set of primary storage units. For example, the DST client module 34 receives slice availability information 1 from DST execution units 1, 3-*n*.

Having received the slice availability information, the DST client module 34 indicates whether a primary storage unit of the set of primary storage units provides a favorable response to a corresponding one of the set of retrieval requests regarding a corresponding portion of the data object. For example, the DST client module 34 indicates that the primary storage unit (e.g., DST execution unit 2) did not provide the favorable response when encoded data slices 2-1, 2-2, 2-3, through 2-N are associated with a storage error (e.g., missing slices) when not receiving any response from the DST execution unit 2 (e.g., DST execution unit 2 is unavailable).

FIG. 41E illustrates further steps of the other example of operation of the recovering of the encoded data slice. When the primary storage unit of the set of primary storage units does not provide the favorable response to a corresponding one of the set of retrieval requests regarding the corresponding portion of the data object, the DST client module 34 uses the storage scoring resultant to identify the alternative storage unit of the plurality of storage units regarding the corresponding portion of the data object. For example, the DST client module 34 interprets the ranked scoring information 414 to select the storage unit set 3 as a next highest ranked storage pool (e.g., rank 2) and the storage unit set 2 has a further next highest ranked (e.g., rank 3) storage pool.

Having selected the alternative storage unit, the DST client module 34 sends the corresponding one of the set of retrieval requests for the alternative storage unit. For example, the DST client module 34 sends slice availability information requests to the storage unit sets 3-2, receives slice availability information 2-3 in response, and does not identify the alternative storage unit, where the received slice availability information indicates that the encoded data slices 2-1, 2-2, 2-3, through 2-N are not available from the storage unit sets 2-3.

FIG. 41F illustrates further steps of the other example of operation of the recovering of the encoded data slice where the DST client module 34, when the alternative storage unit is not identified, issues a rebuilding function for the corresponding portion of the data object, where a rebuilt corresponding portion of the data object is to be stored in the alternative storage unit (e.g., DST execution unit 2 of the storage unit set 3). For example, the DST client module 34 issues rebuilding slices requests 416 (e.g., read slice requests) to at least a decode threshold number of storage units of the set of primary storage units, receives rebuilding slices 418 from at least some of the storage units, regenerates the corresponding portion of the data object (e.g., rebuilds the encoded data slices 2-1, 2-2, 2-3, through 2-N) utilizing the rebuilding slices 418, and sends the rebuilt slices 420 as the corresponding portion of the data object to a highest ranked available storage unit (e.g., DST execution unit 2 of the storage unit set 3) for storage.

FIG. 41G is a flowchart illustrating an example of recovering an encoded data slice. In particular, a method is presented for use in conjunction with one or more functions and features described in conjunction with FIGS. 1-39, 41A-F, and also FIG. 41G. The method begins or continues at step 430 where a processing module of a computing device of one or more computing devices of a dispersed storage network (DSN) receives a DSN retrieval request regarding a data object. The method continues at step 432 where the processing module performs a scoring function using one or more properties of the DSN retrieval request and one or more properties of DSN memory of the DSN to produce a storage scoring resultant, where the DSN memory includes a plurality of storage units that are logically arranged into a plurality of storage pools. The performing the scoring function includes a variety of approaches. In a first scoring function approach, the performing the scoring function includes the processing module selecting a resource level, selecting the one or more properties of the DSN memory from a plurality of properties of the DSN memory based on the selected resource level, calculating, based on the selected resource level, a plurality of storage values based on the one or more properties of the DSN retrieval request and the one or more properties of DSN memory, and performing a ranking function on the plurality of storage values to produce the storage scoring resultant.

In a second scoring function approach, the performing the scoring function includes the processing module selecting a storage pool level indication as a resource level, selecting a storage pool identifier and a storage pool weighting factor for each of the plurality of storage pools to produce a plurality of storage pool identifiers and a plurality of storage pool weighting factors, where the one or more properties of DSN memory includes the plurality of storage pool identifiers and the plurality of storage pool weighting factors, selecting a source name of the DSN retrieval request as the one or more properties of the DSN retrieval request, performing a series of functions on the source name based on the plurality of storage pool identifiers and the plurality of storage pool weighting factors to produce a plurality of storage values, and performing a ranking function on the plurality of storage values to produce the storage scoring resultant.

In a third scoring function approach, the performing the scoring function includes the processing module selecting a storage unit level indication as a resource level, selecting a storage site-storage unit identifier and a storage site-storage weighting factor for each of the plurality of storage units to produce a plurality of storage site-storage unit identifiers and a plurality of storage site-storage unit weighting factors, where the one or more properties of DSN memory includes the plurality of storage site-storage unit identifiers and the plurality of storage site-storage unit weighting factors, selecting a source name of the DSN retrieval request as the one or more properties of the DSN retrieval request, performing a series of functions on the source name based on the plurality of storage site-storage unit identifiers and the plurality of storage site-storage unit weighting factors to produce a plurality of storage values, and performing a ranking function on the plurality of storage value to produce the storage scoring resultant.

The method continues at step 434 where the processing module identifies a set of primary storage units of the plurality of storage units based on the storage scoring resultant (e.g., a set of storage units associated with a highest score of the storage scoring resultant). The method continues at step 436 where the processing module sends a set of retrieval requests to the set of primary storage units regarding the DSN retrieval request. When a primary storage unit of the set of primary storage units does not provide a favorable response to a corresponding one of the set of retrieval requests regarding a corresponding portion of the data object, the method continues at step 438 where the processing module uses the storage scoring resultant to identify an alternative storage unit of the plurality of storage units regarding the corresponding portion of the data object. When the alternative storage unit is not identified, the method branches to step 442. When the alternative storage unit is identifying, the method continues to step 440.

When the alternative storage unit is identified, the method continues at step 440 where the processing module sends the corresponding one of the set of retrieval requests to the alternative storage unit. When the alternative storage unit is not identified, the method continues at step 442 where the processing module issues a rebuilding function for the corresponding portion of the data object, where a rebuilt corresponding portion of the data object is to be stored in the alternative storage unit. The method continues at step 444 where the processing module determines whether the primary storage unit is available for storing the rebuilt corresponding portion of the data object. When the primary storage unit is available for storing the rebuilt corresponding portion of the data object, the method continues at step 446 where the processing module transfers the rebuilt corresponding portion of the data object from the alternative storage unit to the primary storage unit.

The method described above in conjunction with the processing module can alternatively be performed by other modules of the dispersed storage network or by other devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

FIGS. 42A and 42C are a schematic block diagram of another embodiment of a dispersed storage network (DSN) that includes a storage unit set 460, the network 24 of FIG. 1, and a plurality of distributed storage and task (DST) integrity processing units 1-R. The storage unit set 460 includes a set of DST execution (EX) units 1-*n*. Each DST execution unit may be implemented utilizing the DST execution unit 36 of FIG. 1. Each DST execution unit may be interchangeably referred to as a storage unit and the storage unit set 460 may be interchangeably referred to as a set of storage units. Each DST integrity processing unit includes a decentralized agreement module 462 and the DST client module 34 of FIG. 1. The decentralized agreement module 462 may be implemented utilizing the decentralized agreement module 350 of FIG. 40A. Each DST integrity processing unit may be implemented utilizing the DST integrity processing unit 20 of FIG. 1. Hereafter, the DST integrity processing unit may be interchangeably referred to as a DSN unit and the plurality of DST integrity processing units may be interchangeably referred to as a plurality of DSN units. The DSN functions to identify a task execution resource of the DSN. For example the DSN identifies a particular DST integrity processing unit to rebuild an encoded data slice associated with a storage error (e.g., missing, corrupted), where a data object is divided into a plurality of data segments and each data segment is dispersed storage error encoded to produce a plurality of sets of encoded data slices that are stored in the storage unit set 460.

FIG. 42A illustrates steps of an example of operation of the identifying of the task execution resource and in particular steps of an example of operation of the rebuilding of the encoded data slice where the plurality of DSN units determines to perform a DSN level task for a range of DSN addresses. The DSN level task includes one of a rebuilt scan function, a rebuilding encoded data slices function (e.g., scanning for errors, rebuilding encoded data slices when errors are detected), a storage unit utilization analysis (e.g., storage unit capacity, a storage unit failure rate, a storage unit efficiency level, a storage unit speed of access level, a storage unit availability level, a storage unit replacement schedule, and storage unit expansion, etc.), data migration (e.g., transferring encoded data slices from the storage unit set 460 another storage unit set), and a distributed computing partial task. For example, the DST client module 34 of the plurality of DST integrity processing units (e.g., the plurality of DSN units) determines to perform the DSN level task for a DSN address range 1 is associated with the set of DST execution units of the storage unit set 460, where a DSN address range is associated with the storage unit set 460 and where the DSN address range includes the DSN address range 1.

The determining to perform the DSN level task for the range of DSN addresses includes the plurality of DSN units accessing a centralized system registry that includes DSN level tasks, scheduling information regarding the DSN level tasks, and ranges of DSN address regarding the DSN level tasks, and, based on the scheduling information, determining that the DSN level task for the range of DSN addresses is to be performed. For example, each DST client module 34 of each DST integrity processing unit interprets the scheduling information regarding the DSN level tasks from the centralized system registry to determine that timing of performing a DSN level task to scan for storage errors associated with either corrupted or missing stored encoded data slices for the range of DSN addresses is favorable (e.g., in accordance with a schedule of the scheduling information).

Having determined to perform the DSN level task, each of the plurality of DSN units executes a scoring function using one or more properties of the range of DSN addresses (e.g., individual DSN address, some or all of the DSN addresses, a source name, a range of source names, an individual slice name, a range of slice names) and one or more properties of each of the plurality of DSN units (e.g., weighting factors and identifiers) to produce a scoring resultant. The one or more properties of the range of DSN addresses includes one of an individual DSN address, at least some DSN addresses in the range of DSN addresses, a source name corresponding to a data object, a set of source names corresponding to a set of data objects, an individual slice name, and a range of slice names. The one or more properties of each of the plurality of DSN units includes a plurality of identifiers for the plurality of DSN units (e.g., identifiers of DST integrity processing units 1-R), and a plurality of weighting factors for the plurality of DSN units, where the plurality of weighting factors are specific for the DSN level task (e.g., weighting factors for each of the DST integrity processing units with regards to rebuilding encoded data slices as extracted from the system registry).

The executing of the scoring function includes the DST client module 34 accessing the centralized system registry that includes a plurality of DSN level tasks, a plurality of DSN unit identifiers, and pluralities of weighting factors corresponding to the plurality of DSN level tasks, where, the plurality of weighting factors of the pluralities of weighting factors are specific for the DSN level task of the plurality of DSN level tasks. The executing of the scoring function further includes the decentralized agreement module 462 of each of the DSN units generating a score for each of the DSN units to produce a plurality of scores and ranking the plurality of scores to produce ranked scoring information 466 that includes the scoring resultant. For example, the DST client module 34 issues a ranked scoring information request 464 to the decentralized agreement module 462 and receives the ranked scoring information 466 from the decentralized agreement module 462. The ranked scoring information request 464 includes one or more of the one or more properties of the range of DSN addresses (e.g., a sub-DSN address range of the DSN address range of the set of DST execution units) and the one or more properties of each of the plurality of DSN units (e.g., weighting factors of the DST integrity processing units and identifiers of the DST integrity processing units).

Having produced the scoring resultant, each DSN unit identifies a DSN unit of the plurality of DSN units to execute the DSN level task based on the scoring resultant. For example, each DST client module 34 interprets the scoring resultant to identify a DST integrity processing unit associated with a highest score of the plurality of scores as the identified DSN unit. For instance, each DST integrity processing unit identifies the DST integrity processing unit 2 as the identified DSN unit to perform the DSN level task that includes the scanning of the stored encoded data slices associated with the DSN address range 1.

Having identified the DSN unit of the plurality of DSN units to execute the DSN level task, the identified DSN unit executes the DSN level task for the range of DSN addresses. For example, the DST integrity processing unit 2 executes the scanning task by issuing, via the network 24, error detection requests 468 (e.g., list slice requests) to the set of DST execution units, receiving, via the network 24, from at least some of the DST execution units error detection responses 470 (e.g., list slice responses), and interpreting the error detection responses 470 to identify one or more slice names associated with one or more storage errors 472. For instance, the DST client module 34 of the DST integrity processing unit 2 identifies a slice name of a missing encoded data slice when the list slice responses includes slice names of other encoded data slices a set of encoded data slices that includes the missing encoded data slice but not the slice name of the missing encoded data slice.

When executing the DSN level task for the range of DSN addresses that includes scanning for storage errors, the DST client module 34 of the identified DSN unit issues the storage error 472 to include the one or more slice names (e.g., a list of slice names of encoded data slices for a subsequent rebuilding DSN level task) associated with the one or more detected storage errors. The issuing may include one or more of sending, via the network 24, the storage error 472 to at least some of the other DST integrity processing units, and storing the storage error 472 as at least one set of encoded storage error slices within the storage unit set 460 enabling subsequent recovery of the storage error 472 by each of the other DST integrity processing units.

FIGS. 42B and 42D are a schematic block diagram of another embodiment of a distributed storage and task (DST) integrity processing unit that includes the DST client module 34 of FIG. 1 and the decentralized agreement module 462 of FIG. 42A. The decentralized agreement module 462 includes a plurality of deterministic functions 1-R, a plurality of normalizing functions 1-R, a plurality of scoring functions 1-R, and a ranking function 474. Each deterministic function may be implemented utilizing the deterministic function of FIG. 40A. Each normalizing function may be implemented utilizing the normalizing functions of FIG. 40A. Each scoring function may be implemented utilizing the scoring function of FIG. 40A. The ranking function 474 may be implemented utilizing the ranking function 352 of FIG. 40A.

FIG. 42B illustrates further steps of the example of operation of the identifying of the task execution resource including further steps of the example of operation of the rebuilding of the encoded data slice with regards to the operation of the DST integrity processing unit 2 of FIG. 42A. The further steps of the example of operation includes the DST integrity processing unit 2 executing the scoring function, where, for each of the plurality of DSN units (e.g., DST integrity processing units 1-R) the DST client module 34 obtains an error scan message (MSG) 476 (e.g., a scan request, and interpretation of a scanning schedule, an interpretation of an error message, the range of DSN addresses, etc.) and generates the ranked scoring information request 464 to include one or more of a sub-DSN address range 478 as the one or more properties of the range of DSN addresses (e.g., the DSN address range 1 associated with the scanning DSN level task), identifiers of a plurality of rebuilders 1-R as the plurality of DSN units (e.g., the DST integrity processing units 1-R), and the weighting factors for the plurality of DSN units (e.g., rebuilders 1-R weights). Having produced the ranked scoring information request 464, the DST client module 34 sends the ranked scoring information request 464 to the decentralized agreement module 462.

Having received the ranked scoring information request 464, a deterministic function of the plurality of deterministic functions 1-R performs a first function (e.g., a deterministic function) based on an identifier of one of the plurality of DSN units and the one or more properties of the range of DSN addresses (e.g., the sub-DSN address 478) to produce an interim result. For example, the deterministic function 3 performs the deterministic function on the sub-DSN address 478 and the rebuilder 3 identifier to produce an interim result 3.

With the interim result produced, a normalizing function of the plurality of normalizing functions 1-R normalizes the interim result to produce a normalized result. For example, the normalizing function 3 performs the normalizing function on the interim result 3 to produce a normalized interim result 3. With the normalized interim result produced, a scoring function of the plurality of scoring functions 1-R performs a second function (e.g., a scoring function) based on the normalized result and a weighting factor for the one of the plurality of DSN units to produce a score. For example, scoring function 3 performs the scoring function on the normalized interim result 3 using the rebuilder 3 weight to produce a score 3. With the scores 1-R produced, the ranking function 474 ranks the scores for each of the plurality of DSN units (e.g., scores 1-R) to produce the scoring resultant (e.g., the ranked scoring information 466). For example, the ranked scoring information 466 indicates that a highest ranked score is associated with rebuilder 2 (e.g., DST integrity processing unit 2).

With the ranked scoring information 466 produced, the DST client module 34 interprets the ranked scoring information 466 to identify the DST integrity processing unit 2 as the identified DSN unit to execute the DSN level task (e.g., the scanning for errors task). Having identified the DST integrity processing unit 2 as the identify DSN unit, the DST client module 34 issues the error detection request 468 to the DST execution units, receives the error detection responses 470, and issues the storage error 472 to include the slice names associated with the storage errors.

FIG. 42C illustrates further steps of the example of operation of the identifying of the task execution resource including further steps of the example of operation of the rebuilding of the encoded data slice where the plurality of DSN units (e.g., the DST integrity processing units 1-R) determines to perform the DSN level task the range of DSN addresses (e.g., individual slice names of DSN address range 1). For example, the DST integrity processing unit 1 determines to perform the rebuilding encoded data slice function as the DSN level task. For instance, the DST client module 34 of the DST integrity processing unit 1 determines that the DST integrity processing unit 1 has available capacity for performing the rebuilding encoded data slices function.

When one or more DSN units are available to perform the rebuilding encoded data slices function, the determining to perform the DSN level task for the range of DSN addresses includes the one or more DSN units of the plurality of DSN units receiving a rebuild list of encoded data slices (e.g., the storage error 472) and in response to receiving the rebuild list, determines that the DSN level task is rebuilding is to be performed. For example, DST integrity processing units 1-5 determine to perform the DSN level task for the range of DSN addresses (e.g., slice names of the rebuild list) when receiving the rebuild list of encoded data slices.

Having determined to perform the DSN level task, each of the one or more DSN units of the plurality of DSN units executes the scoring function using the one or more properties of the range of DSN addresses (e.g., the one or more slice names of the encoded data slices associated with the one or more storage errors) and the one or more properties of each of the plurality of DSN units (e.g., weighting factors of the DST integrity processing units and identifiers of the DST integrity processing units) to produce a scoring resultant for the rebuilding DSN level task. The executing of the scoring function includes the DSN unit (e.g., the DST client module 34 of the DST integrity processing unit 1) accessing the centralized system registry to obtain the plurality of DSN unit identifiers and the plurality of weighting factors of the plurality of DSN units and issuing the ranked scoring information request 464 to the decentralized agreement module 462. The decentralized agreement module 462 generates a score for each of the DSN units to produce a plurality of scores for each slice name of the rebuild list of encoded data slices and ranks the plurality of scores to produce the ranked scoring information 466 as the scoring resultant.

With the scoring resultant produced, each DSN unit identifies a DSN unit of the plurality of DSN units to execute the rebuilding DSN level task based on the scoring resultant. For example, each DST client module 34 of the plurality of DST integrity processing units identifies the DST integrity processing unit 1 as the identified DSN unit when the DST integrity processing unit 1 is associated with a highest score of the plurality of scores. Having identified the DSN unit to execute the rebuilding DSN level task, the identified DSN unit executes the rebuilding DSN level task for the range of DSN addresses. For example, the DST client module 34 of the DST integrity processing unit 1 issues, via the network 24, rebuilding slice requests to the set of DST execution units, receives rebuilding slices 480, dispersed storage error decodes the received rebuilding slices 480 to produce one or more rebuilt encoded data slices 482, and sends, via the network 24, the one or more rebuilt encoded data slices 482 to one or more associated DST execution units of the storage unit set 460 for storage FIG. 42D illustrates further steps of the example of operation of the identifying of the task execution resource including further steps of the example of operation of the rebuilding of the encoded data slice with regards to the operation of the DST integrity processing unit 1 of FIG. 42C. The further steps of the example of operation includes the DST client module 34 obtaining a repair error message (MSG) 484, where the repair error message 484 includes one or more of a rebuilding request, an interpretation of a list of slice names of encoded data slice to be rebuilt, and an interpretation of an error message. For example, the DST client module 34 accesses a dispersed hierarchical index that includes the list of slice names of encoded data slices to be rebuilt.

Having obtained the list of slice names, the DST client module 34 issues the ranked scoring information request 464 to the decentralized agreement module 462, where the ranked scoring information request 464 includes one or more of a slice name 486 of the list of slice names, a rebuilding task identifier, the identifiers of the rebuilders 1-R, and the weighting factors of the rebuilders 1-R associated with the rebuilding DSN level task.

Each of the deterministic functions 1-R performs the first function on the identifier of one of the plurality of DSN units and the one or more properties of the range of DSN addresses to produce an interim result. For example, the deterministic function 2 performs the deterministic function on the slice name 486 and the rebuilder 2 identifier to produce an interim result 2 of interim results 1-R. Each normalizing function performs a normalizing function on the interim result to produce a normalized result. For example, the normalizing function 2 performs the normalizing function on the interim result 2 to produce a normalized interim result 2 of normalized interim results 1-R. Each scoring function performs second function (e.g., the scoring function) based on the normalized result and a weighting factor for the one of the plurality of DSN units to produce a score.

For example, the scoring function 2 performs the scoring function on the normalized interim result 2 using the rebuilder 2 weight to produce a score 2 of scores 1-R.

With the scores 1-R produced, the ranking function 474 ranks the scores for each of the plurality of DSN units to produce the ranked scoring information 466 as the scoring resultant. For example, the ranking function 474 identifies a highest score associated with rebuilder 1 (e.g., DST integrity processing unit 1). Having produced the ranked scoring information 466, the decentralized agreement module 462 sends the ranked scoring information 466 to the DST client module 34.

The DST client module 34 determines that the DST integrity processing unit 1 is the identified DSN unit when the score associated with the DST integrity processing unit 1 is the highest score of the ranked scoring information 466. When the DST integrity processing unit 1 is identified DSN unit, the DST client module 34 issues rebuilding slice requests 488 to the DST execution units, receives the rebuilding slices 480, dispersed storage error decodes the rebuilding slices 480 produce the one or more encoded data slices as the rebuilt slice 482, and facilitates storage of the rebuilt slice 482 in an associated storage unit.

FIG. 42E is a flowchart illustrating an example of identifying a task execution resource. In particular, a method is presented for use in conjunction with one or more functions and features described in conjunction with FIGS. 1-39, 42A-D, and also FIG. 42E. The method begins or continues at step 500 where a processing module of a computing device of one or more computing devices (e.g., a plurality of DSN units) of a dispersed storage network (DSN) determines to perform a DSN level task for a range of DSN addresses (e.g., a storage error scanning function, a rebuilding encoded data slices function). For example, when scanning, the processing module determines to perform the DSN level task for the range of DSN addresses by accessing a centralized system registry that includes DSN level tasks, scheduling information regarding the DSN level tasks, and ranges of DSN address regarding the DSN level tasks, and, based on the scheduling information, determines that the DSN level task for the range of DSN addresses is to be performed. As another example, when rebuilding encoded data slices, the processing module determines to perform the DSN level task for the range of DSN addresses by receiving a rebuild list of encoded data slices, and in response to receiving the rebuild list, determines that the DSN level task is rebuilding is to be performed.

The method continues at step 502 where the processing module executes a scoring function using one or more properties of the range of DSN addresses and one or more properties of each of a plurality of DSN units to produce a scoring resultant. For example, the processing module accesses the centralized system registry that includes a plurality of DSN level tasks, a plurality of DSN unit identifiers, and pluralities of weighting factors corresponding to the plurality of DSN level tasks, where, the plurality of weighting factors of the pluralities of weighting factors are specific for the DSN level task of the plurality of DSN level tasks; generates, by each of the DSN units, a score for each of the DSN units to produce a plurality of scores; and ranks the plurality of scores to produce the scoring resultant. As another example, the processing module performs a first function (e.g., a deterministic function) based on an identifier of one of the plurality of DSN units and the one or more properties of the range of DSN addresses to produce an interim result, normalizes (e.g., utilizing the normalizing function) the interim result to produce a normalized result, performs a second function (e.g., a scoring function) based on the normalized result and a weighting factor for the one of the plurality of DSN units to produce a score, and ranks the scores for each of the plurality of DSN units to produce the scoring resultant.

The method continues at step 504 where the processing module identifies a DSN unit of the plurality of DSN units to execute the DSN level task based on the scoring resultant. For example, the processing module identifies a highest score of the scoring resultant and selects a DSN unit associated with the highest score as the identified DSN unit. The method continues at step 506 where the identified DSN unit executes the DSN level task for the range of DSN addresses. The method described above may utilize two or more iterations to perform a related to or more DSN level tasks. For example, the plurality of DSN units determines to scan for storage errors in a first iteration and determines to rebuild encoded data slices associated with the storage errors in a second iteration.

The method described above in conjunction with the processing module can alternatively be performed by other modules of the dispersed storage network or by other devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

FIG. 43A is a schematic block diagram of another embodiment of a dispersed storage network (DSN) that includes the distributed storage and task (DST) processing unit 16 of FIG. 1, the network 24 of FIG. 1, and a DST execution (EX) unit set 510. The DST processing unit 16 includes the DST client module 34 of FIG. 1. The DST execution unit set 510 includes a set of DST execution units 1-*n*. Each DST execution unit may be implemented utilizing the DST execution unit 36 of FIG. 1. Each DST execution unit includes a plurality of memory devices 1-M.

The DSN functions to select a set of memory devices for storage of data, where a data segment of the data is dispersed storage error encoded to produce a set of encoded data slices for storage in the selected set of memory devices. In an example of operation of selecting the set of memory devices, each DST execution unit temporarily associates each memory device of the plurality of memory devices of the DST execution unit to a sub-DSN address range based on one or more attributes of the memory device, where each DST execution unit is associated with a common DSN address range (e.g., source name range).

For example, DST execution unit 1 identifies common attributes of a given memory device of the DST execution unit 1 with a corresponding memory device of each of the other DST execution units. For instance, each DST execution unit identifies a memory device of a first sub-DSN address range as a first memory device when each of the first memory devices shares a common group of attributes (e.g., same manufacture, same model memory device, same software version, similar hardware options.

Having associated the memory devices, the DST execution unit receives an access request 512 (e.g., write request, a read request, delete request, a list request, etc.) from the DST client module 34, where the access request 512 includes a slice name. Having received the access request 512, the DST execution unit identifies a sub-DSN address range of a plurality of sub-DSN address ranges, where the identified sub-DSN address range includes the slice name.

Having identified the sub-DSN address range, the DST execution unit generates an offset sub-DSN address range based on the identified sub-DSN address range and an upset function. The offset function may include incrementing the sub-DSN address range by a pillar index number of the slice name. For example, DST execution unit 2 utilizes a pillar index of 2, DST execution unit 3 utilizes a pillar index of 3.

Having generated the offset sub-DSN address range, the DST execution unit identifies a memory device associated with the offset sub-DSN address range. For example, DST execution unit 2 identifies memory device 2 when the offset sub-DSN address range is a second sub-DSN address range. As such, each DST execution unit of the set of DST execution units selects memory devices with different attributes which may provide a system performance improvement from diversity of memory device attributes types (e.g., avoiding potential correlated failures).

Having identified the memory device, the DST execution unit executes the access request 512 using identify memory device and issues an access response 514 to the DST client module 34. For example, when the access request 512 includes a storage request, the DST execution unit stores a received encoded data slice in the identified memory device and issues an access response 514 indicating successful storage. For instance, DST execution unit 1 stores a first encoded data slice of the set of encoded data slices in memory device 1 of the DST execution unit 1, DST execution unit 2 stores a second encoded data slice of the set of encoded data slices in memory device 2 of the DST execution unit 2, etc.

FIG. 43B is a flowchart illustrating an example of selecting a memory device. The method begins or continues at step 516 where a processing module (e.g., of a storage unit) coordinates, with other storage units of a set of storage units that includes the storage unit, association of common attribute memory devices by sub-DSN address range of a DSN address range associated with a set of storage units. The coordination may include one or more of interpreting a common system registry, receiving configuration information, and exchange and configuration information.

The method continues at step 518 where the processing module receives an encoded data slice access requests that includes a slice name. The method continues at step 520 where the processing module identifies a sub-DSN address range that includes the slice name. The identifying includes at least one of interpreting a slice name to DSN address range table, performing a deterministic function on the slice name to produce an identifier of the sub-DSN address range, initiating a query, and receiving a query response.

The method continues at step 522 where the processing module generates an offset sub-DSN address range based on the identified sub-DSN address range and in offset function of the storage unit. For example, the processing module identifies the access function and utilizes the offset function on the identified sub-DSN address range to produce the offset sub-DSN address range. For instance, the processing module adds a pillar index of the storage unit to the sub-DSN address range to produce the offset sub-DSN address range.

The method continues at step 524 of the processing module identifies a memory device associated with the offset sub-DSN address range. For example, the processing module interprets a sub-DSN address range to memory device identifier table using the offset sub-DSN address range to produce an identifier of the memory device. The method continues at step 526 where the processing module facilitates the access request using the identified memory device.

For example, the processing module causes execution of the access request and generation of an access response.

FIG. 44A is a schematic block diagram of another embodiment of a dispersed storage network (DSN) that includes the distributed storage and task (DST) processing unit 16 of FIG. 1, the network 24 of FIG. 1, and a DST execution (EX) unit set 530. The DST processing unit 16 includes the DST client module 34 of FIG. 1. The DST execution unit set 530 includes a set of DST execution units 1-n. Each DST execution unit may be implemented utilizing the DST execution unit 36 of FIG. 1. Each DST execution unit includes a plurality of memory devices 1-M.

The DSN functions to rebuild an encoded data slice associated with an unavailable (e.g., failed, off-line) memory device, where a data segment of data is dispersed storage error encoded to produce a set of encoded data slices that includes the encoded data slice and where the set of encoded data slices is stored in a set of memory devices of the set of DST execution units. Each set of memory devices includes memory devices associated with one or more common attributes. For example, each memory device 1 of each DST execution unit is associated with a common manufacturer and common model number, each memory device 2 of each DST execution unit is associated with another common manufacturer and another common model number etc.

In an example of operation of the rebuilding of the encoded data slice, the DST client module 34, or any other module or unit capable of rebuilding encoded data slices, detects a storage error associated with an unavailable memory device of a DST execution unit. The detecting includes at least one of receiving a failed memory message, interpreting a memory test result, and detecting a missing slice. For example, the DST client module 34 receives a message indicating that memory device 2 of DST execution unit 2 has failed.

Having detected the storage error, the DST client module 34 determines attributes of the unavailable memory device. The attributes includes at least one of a manufacture, a model number, a serial number, a software version, a hardware configuration version, an estimated end-of-life timeframe, and available capacity level, a performance level, and an age timeframe. The determining includes at least one of initiating a query, interpreting a query response, interpreting system registry information, and receiving an attributes list.

Having determined the attributes of the unavailable memory device, the DST client module 34 determines attributes of the other memory devices. For example, the DST client module 34 determines attributes of remaining memory devices of the DST execution unit 2. As another example, the DST client module 34 determines attributes of memory devices of other DST execution units. For instance, the DST client module 34 determines attributes of memory devices 1-M of DST execution unit 1.

Having determined the attributes of the other memory devices, the DST client module 34 selects another memory device based on the attributes of the other memory device and the attributes of the unavailable memory device. For example, the DST client module 34 selects the other memory device when the other memory devices associated with attributes that compare favorably (e.g., substantially the same) with the attributes of the available memory device. For instance, the DST client module selects a memory device 2 of the DST execution unit 1 when the attributes of the memory device to the DST execution unit 1 compare favorably to the memory device 2 of the DST execution unit 2.

Having selected the other memory device, the DST client module 34 rebuilds at least one encoded data slice associated with the storage error to produce one or more rebuilt encoded data slices. For example, the DST client module 34 issues, via the network 24, rebuild requests 532 to recover encoded data slices of a set of encoded data slices B-1 through B-n, where encoded data slice B-2 requires rebuilding, receives, via the network 24, rebuilding responses 534 that includes a decode threshold number of encoded data slices of the set of encoded data slices, dispersed storage error decodes the decode threshold number of encoded data slices to produce the recovered data segment, and dispersed storage error encodes the recovered data segment to produce a rebuilt encoded data slice B-2.

Having produced the one or more rebuilt encoded data slices, the DST client module 34 facilitates storage of the one or more rebuilt encoded data slices in the selected other memory device. For example, the DST client module 34 issues, via the network 24, another rebuilding request 532 to the DST execution unit 1 that includes the rebuilt encoded data slice B-2 for storage in the memory device 2 of the DST execution unit 1. Having facilitated the storage of the one or more rebuilt encoded data slices, the DST client module 34 associates slice names of the one or more rebuilt encoded data slices with the selected other memory device and disassociates the slice names from the unavailable memory device. For example, the DST client module 34 updates a dispersed hierarchical index to indicate that rebuilt encoded data slice B-2 is available at memory device 2 of DST execution unit 1 and is not available from DST execution unit 2.

FIG. 44B is a flowchart illustrating another example of selecting a memory device. The method begins or continues at step 536 where a processing module (e.g., of a distributed storage and task (DST) client module) detects a storage error associated with an unavailable memory device of a storage unit of a set of storage units, where a data segment of data is dispersed storage error encoded to produce a set of encoded data slices that is stored in a set of memory devices of the set of storage units. The set of memory devices includes the unavailable memory device.

The method continues at step 538 where the processing module identifies attributes of the unavailable memory device. The identifying includes at least one of interpreting a system registry, interpreting a memory device list, initiating a query, and interpreting a received query response. The method continues at step 540 where the processing module identifies attributes of other memory devices. The identifying includes identifying other memory devices associated with the set of storage units and identifying attributes of the identified other memory devices.

The method continues at step 542 where the processing module selects one of the other memory devices based on the attributes of the other memory devices and the attributes of the unavailable memory device. For example, the processing module identifies a memory device associated with attributes that compare favorably to the attributes of the unavailable memory device. For instance, the processing module selects the other memory device that includes a common software version with the unavailable memory device.

The method continues at step 544 where the processing module rebuilds at least one encoded data slice associated with the storage error to produce one or more rebuilt encoded data slices. As a specific example, for each encoded data slice to be rebuilt, the processing module obtains a decode threshold number of encoded data slices of the set of encoded data slices that includes the at least one encoded data slice associated with the storage error, dispersed storage error decodes the decode threshold number of obtained encoded data slices to produce a recovered data segment, and dispersed storage error encodes the recovered data segment to produce a rebuilt encoded data slice.

The method continues at step 546 where the processing module facilitates storage of the one or more rebuilt encoded data slices in the selected one of the other memory devices. For example, the processing module issues a write slice request to another storage unit associated with the selected one of the other memory devices, where the write slice request includes the rebuilt encoded data slice when utilizing the memory device of the other storage unit. As another example, the processing module stores the rebuilt encoded data slice in the selected other memory device when the selected other memory devices associated with the storage unit of the unavailable memory device.

The method continues at step 548 where the processing module associates slice names of the one or more rebuilt encoded data slices with the selected one of the other memory devices. As a specific example, the processing module updates a dispersed hierarchical index to associate the slice names with the selected memory device and disassociates the slice names from the unavailable memory device.

FIG. 45A is a schematic block diagram of another embodiment of a dispersed storage network (DSN) that includes the distributed storage and task (DST) processing unit 16 of FIG. 1, the network 24 of FIG. 1, and a DST execution (EX) unit pool 550. The DST processing unit 16 includes the DST client module 34 of FIG. 1. The DST execution unit pool 550 includes a plurality of DST execution units. For example, the DST execution unit pool hundred and 50 includes a set of DST execution units 1, 2A, 2B, 3, 4, etc., through DST EX unit n. Each DST execution unit may be implemented utilizing the DST execution unit 36 of FIG. 1. Each DST execution unit includes a plurality of memory devices 1-M.

The DSN functions to migrate encoded data slices associated with one or more memory devices of a DST execution unit being de-commissioned, where a data segment of data is dispersed storage error encoded to produce a set of encoded data slices and where the set of encoded data slices is stored in a set of memory devices of the plurality of DST execution units. In an example of operation of the migrating, the DST client module 34 identifies a DSN address range associated with encoded data slices stored in one or more memory devices to be de-commissioned. The identifying includes at least one of interpreting a test result, receiving a manager input, interpreting an end of life schedule, and detecting storage errors. For example, the DST client module 34 interprets the end of life schedule indicating de-commissioning of DST execution unit 2A (e.g., and each memory device of the plurality of memory devices 1-M) and performs a DSN address range look up corresponding to the DST execution unit 2A to produce an identified DSN address range.

Having identified the DSN address range, the DST client module 34 identifies one or more replacement memory devices. The identifying includes at least one of receiving a commissioning message, interpreting a new configuration, interpreting a system registry, receiving a manager input, and interpreting a replacement schedule. For example, the DST client module 34 detects DST execution unit 2B is available as being commissioned to replace DST execution unit 2A and identifies at least some of the memory devices 1-M of the DST execution unit 2B.

When a favorable number of other memory devices are available of a set of memory devices that includes the one or more memory devices to be decommissioned, the DST client module 34 facilitates disabling the DSN address range. For example, the DST client module 34 determines that a write threshold number of memory devices are available amongst the plurality of DST execution units, where the write threshold number of memory devices does not include the one or more memory devices to be decommissioned. The disabling includes at least one of establishing a status indicator indicating that the DSN address ranges disabled, issuing a write slice request to each of the set of memory devices (e.g., without issuing a commit request to produce a lock on slice names associated with the DSN address range), and issuing a deactivation request to the DST execution unit being de-commissioned.

Having disabled the DSN address range, the DST client module 34 facilitates migration of the encoded data slices from the one or more memory devices to be de-commissioned to the replacement memory devices. For example, the DST client module 34 issues, via the network 24, migration requests 552 to the DST execution unit 2A to facilitate transfer of the encoded data slices from the memory devices 1-M to the DST execution unit 2B for storage. The DST execution unit 2B issues, via the network 24, migration responses to the DST client module 34 indicating a status of the migration. As another example, the DST client module 34 issues other migration requests 552 to the DST execution unit 2A to recover the encoded data slices, receives migration responses 554 that includes the encoded data slices, and issues further migration requests to the DST execution unit 2B that include the encoded data slices for storage.

When the encoded data slices have been successfully migrated, the DST client module 34 enables the DSN address range. The enabling includes at least one of disabling the one or more memory devices, updating at least one of the system registry, a DSN directory, and a dispersed hierarchical index to associate the DSN address range with the replacement memory devices and to disassociate the DSN address range with the one or more memory devices.

FIG. 45B is a flowchart illustrating an example of migrating encoded data slices. The method begins or continues at step 556 where a processing module (e.g., of a distributed storage and task (DST) client module) identifies a dispersed storage network (DSN) address range associated with encoded data slices stored in one or more memory devices to be decommissioned. The identifying includes one or more of interpreting a test, receiving a managing unit input, interpreting an end-of-life schedule, detecting storage errors greater than a storage error level, and performing a slice name in DSN address range to memory device table lookup.

The method continues at step 558 where the processing module identifies one or more replacement memory devices. The identifying includes at least one of receiving a commissioning message, interpreting a new DSN configuration, interpreting a system registry, receiving a manager input, and interpreting a replacement schedule. When a favorable number of other memory devices are available of a set of memory devices that includes the one or more memory devices to be decommissioned, the method continues at step 560 where the processing module disables the DSN address range. The disabling includes one or more of determining that at least a threshold number of available other memory devices are available, issuing a status indicator, issuing a write slice requests without sending a commit transaction request for slice names associated with the DSN address range, and issuing a deactivation request.

The method continues at step 562 where the processing module facilitates migration of the encoded data slices from the one or more memory devices to be decommissioned to the replacement memory devices. For example, the processing module recovers encoded data slices from the one or more memory devices and stores the recovered encoded data slices in the replacement memory devices. As another example, the processing module issues a migration request to at least one of a storage unit associated with the one or more memory devices to be decommissioned and at least one storage unit associated with the replacement memory devices.

When the encoded data slices have been successfully migrated, the method continues at step 564 where the processing module enables the DSN address range. The enabling includes one or more of detecting that the encoded data slices have been successfully migrated, issuing an updated status indicator, updating one or more of a system registry, a DSN directory, and a DSN index to indicate association of the DSN address range with the replacement memory devices and to disassociate the DSN address range from the one or more memory devices to be decommissioned.

FIG. 46A is a schematic block diagram of another embodiment of a dispersed storage network (DSN) that includes the distributed storage and task (DST) processing unit 16 of FIG. 1, the network 24 of FIG. 1, and at least two DST execution (EX) unit sets 1 and 2. The DST processing unit 16 includes the DST client module 34 of FIG. 1. Each DST execution unit set includes a set of DST execution units 1-*n* utilized to store sets of encoded data slices, where a data segment of data is dispersed storage error encoded to produce a set of encoded data slices for storage in the DST execution unit set.

The DSN functions to temporarily store rebuilt encoded data slices. In an example of operation of the temporary storage of the rebuilt encoded data slices, the DST client module 34 detects a failed storage unit. The detecting includes at least one of receiving an error message, interpreting a test result, and receiving a request. For example, the DST client module 34 detects failure of DST execution unit 2 of the DST execution unit set 1 when receiving an error message indicating storage unit failure. Having detected the failed storage unit, the DST client module 34 identifies a DSN address range associated with the failed storage unit (e.g., a lookup).

Having identified the DSN address range, the DST client module 34 selects a plurality of storage units for storage of rebuilt encoded data slices 576. The selecting includes at least one of initiating a query, receiving a query response, performing a lookup, and interpreting storage unit availability information. For example, the DST client module 34 selects the DST execution units 1-*n* of the DST execution unit set 2 for the storage of the rebuilt encoded data slices 576 when a storage unit availability information for the DST execution unit set 2 is favorable compared to an availability threshold level.

For each storage unit of the selected plurality of storage units, the DST client module 34 allocates a portion of the DSN address range in accordance with an allocation approach. The allocation approach includes one of equal allocation, allocation in proportion to available storage capacity, allocation in proportion to available processing capacity. For example, the DST client module 34 allocates portions of the DSN address range that includes slice names of two slices to each DST execution unit of the DST execution unit set 2. For instance, the DST client module 34 allocates slices A-2-1 and A-2-2 to DST execution unit 1 of the DST execution unit set 2, allocates slices A-2-3 and A-2-4 to DST execution unit 2 of the DST execution unit set 2, etc.

Having allocated the portion of the DSN address range, for each storage unit of the selected plurality of storage units, the DST client module 34 rebuilds encoded data slices associated with the portion of the DSN address range to produce rebuilt encoded data slices. For example, the DST client module 34 retrieves a decode threshold number of encoded data slices 572 from other storage units associated with the failed storage unit, dispersed storage error decodes the decode threshold number of encoded data slices to produce a recovered data segment, and dispersed storage error encodes the recovered data segment to produce the rebuilt encoded data slice 576. For instance, the DST client module 34 issues, via the network 24, rebuild requests 570 to the DST execution unit set 1 to recover slices 572, receives rebuilding responses 574 that includes slices A-1-1, A-3-1, A-4-1, etc., decodes the decode threshold number of encoded data slices to produce a first recovered data segment, and dispersed storage error encodes the first recovered data segment to produce rebuilt encoded data slice A-2-1.

Having produced the rebuilt encoded data slices 576, the DST client module 34, for each storage unit of the plurality of storage units, facilitates temporary storage of the rebuilt encoded data slices 576. For example, the DST client module 34 sends, via the network 24, rebuilding requests, that includes the rebuilt encoded data slices 576, to the DST execution units of the DST execution unit set 2. For instance, the DST client module 34 sends rebuilt encoded data slice A-2-1 to the DST execution unit 1 of the DST execution unit set 2 in accordance with the allocated portion of the DSN address range.

Having facilitated the temporary storage of the rebuilt encoded data slices 576, for each storage unit of the plurality of storage units, the DST client module 34 facilitates access to the stored rebuilt encoded data slices. For example, the processing module associates the portion of the DSN address range with the storage unit and facilitates processing of access requests.

FIG. 46B is a flowchart illustrating an example of temporarily storing rebuilt encoded data slices. The method begins or continues at step 578 where a processing module (e.g., of a distributed storage and task (DST) client module) detects a failed storage unit of a set of storage units that stores the set of encoded data slices. The detecting includes at least one of interpreting an error message, interpreting a test result, and receiving a storage unit status indicator. The method continues at step 580 where the processing module identifies a dispersed storage network (DSN) address range associated with the failed storage unit. For example, the processing module interprets a DSN address to physical location table.

The method continues at step 582 where the processing module selects a plurality of storage units for storage of rebuilt encoded data slices. The selecting includes at least one of initiating a query, receiving a query response, performing a lookup, and interpreting storage unit availability information. The selecting may include selecting one or more storage units of the set of storage units.

For each storage unit of the selected plurality of storage units, the method continues at step 584 where the processing module allocates a portion of the DSN address range to the storage unit. The allocation may be in accordance with an allocation approach. The allocation approaches includes one of evenly dividing the DSN address range by a number of storage units of the selected plurality of storage units, allocating in accordance with storage unit capacity, and allocating in accordance with storage unit processing capacity.

For each storage unit of the selected plurality of storage units, the method continues at step 586 where the processing module rebuilds encoded data slices associated with the portion of the DSN address range to produce rebuilt encoded data slices. For example, the processing module acquires a decode threshold number of encoded data slices of the set of encoded data slices, dispersed storage error decodes the decode threshold number of encoded data slices to produce the recovered data segment, and dispersed storage error encodes the recovered data segment to produce the rebuilt encoded data slice.

For each storage unit of the plurality of storage units, the method continues at step 588 where the processing module facilitates temporary storage of the rebuilt encoded data slices. For example, the processing module issues a write slice request that includes the encoded data slice to the storage unit of the selected plurality of storage units. For each storage unit of the selected plurality of storage units, the method continues at step 590 where the processing module facilitates access to the stored rebuilt encoded data slices. The facilitating includes one or more of associating the portion of the DSN address range with the storage unit, executing a received access request to produce an access response, and sending the access response to a requesting entity.

FIG. 47A is a schematic block diagram of another embodiment of a dispersed storage network (DSN) that includes the distributed storage and task (DST) processing unit 16 of FIG. 1, the network 24 of FIG. 1, and a DST execution (EX) unit set 600. The DST processing unit 16 includes the DST client module 34 of FIG. 1. The DST execution unit set 600 includes a set of DST execution units 1-*n*. Each DST execution unit may be implemented utilizing the DST execution unit 36 of FIG. 1.

The DSN functions to test a DST execution unit. In an example of operation of the testing of the DST execution unit, the DST client module 34 identifies the DST execution unit for isolation testing, where the DST execution unit set 600 includes the DST execution unit for isolation testing. The identifying includes at least one of interpreting an error message, interpreting a previous test result, interpreting a performance level, receiving a request, and interpreting a test schedule. For example, the DST client module 34 identifies DST execution unit 1 for the isolation testing when the task until indicates that DST execution unit 1 requires the isolation testing. As another example, the DST client module 34 identifies DST execution units 1 and 2 for the isolation testing when receiving a request to test DST execution units 1 and 2.

Having identified the storage unit for the isolation testing, the DST client module 34 determines whether a sufficient number of favorably performing other DST execution units of the DST execution unit set are available. For example, the DST client module 34 identifies the threshold number (e.g., based on a lookup), identifies favorably performing DST execution units, and compares the number of favorably performing other DST execution units to the threshold number. For instance, the DST client module 34 indicates that the sufficient number is available when 13 other DST execution units are available and the threshold number is 13.

When the sufficient number of favorably performing other storage units are available, the DST client module 34 initiates the isolation testing of the identified storage unit. The initializing of the isolation testing includes at least one of updating a status for the identified DST execution unit to indicate an unavailable status, inhibiting issuing access requests to the identified DST execution unit, and issuing one or more isolation testing tasks to the identified DST execution unit. For example, the DST client module 34 issues, via the network 24, test requests 602 to the DST execution unit 1, where the test requests 602 includes one or more isolation testing tasks, and receives test responses 604 from the DST execution unit 1. The test responses 604 includes one or more results from performing the one or more isolation testing tasks.

When the isolation testing has been completed, the DST client module 34 updates the status for the identified DST execution unit to indicate available. The DST client module 34 generates an isolation testing report based on the received test responses. The isolation testing report may include one or more of a memory utilization level, a memory fragmentation level, a number of vaults supported, a number of namespace ranges supported, a number of encoded data slices stored, a software revision number, data storage statistics, data retrieval statistics, and test failure rates.

FIG. 47B is a flowchart illustrating an example of testing a storage unit. The method begins or continues at step 606 where a processing module (e.g., of a distributed storage and task (DST) client module) identifies a storage unit for isolation testing, where a set of storage units includes a storage unit. The identifying includes at least one of receiving a request, interpreting a schedule, interpreting an error message, interpreting a previous test result, and interpreting a monitored performance level.

The method continues at step 608 where the processing module determines whether a sufficient number of favorably performing other storage units of the set of storage units are available during the isolation testing. For example, the processing module obtains a threshold number, identifies the favorably performing storage units, compares the number of favorably performing other storage units to the threshold number, and indicates the sufficient number are available when the number of favorably performing other storage units compares favorably to the threshold number (e.g., greater than or equal to).

When the sufficient number of favorably performing other storage units are available, the method continues at step 610 where the processing module initiates the isolation testing of the identified storage unit. The initializing includes at least one of updating a status for the storage unit two indicate unavailable, issuing one or more test tasks to the storage unit, and receiving test results. When the isolation testing has been completed, the method continues at step 612 where the processing module updates the status for the storage unit to indicate available. The method continues at step 614 where the processing module generates an isolation testing report. For example, the processing module interprets the received test results to produce the testing report.

FIG. 48A is a schematic block diagram of another embodiment of a dispersed storage network (DSN) that includes the distributed storage and task (DST) processing unit 16 of FIG. 1, the network 24 of FIG. 1, and a meta-vault 620. The DST processing unit 16 includes the DST client module 34 of FIG. 1. The meta-vault 620 includes one or more sub-vaults 1-3. Each sub-vault is associated with a set of DST execution units 1-n. Each DST execution unit may be implemented utilizing the DST execution unit 36 of FIG. 1.

The DSN functions to access data stored in the meta-vault 620. In an example of operation of the accessing of the data, the DST client module 34 obtains a data object for storage in the meta-vault 620. The DST client module 34 selects one sub-vault of the meta-vault for storage of the data object in accordance with a selection scheme. The selection scheme includes at least one of a round robin approach, a DST execution unit availability-based selection, a DST execution unit performance level-based selection, and a DST execution unit available storage level-based selection.

Having selected the sub-vault, the DST client module 34 facilitates storage of the data object in the selected sub-vault. For example, the DST client module 34 encodes the data object to produce a plurality of sets of encoded data slices, issues, via the network 24, one or more sets of write slice requests as access requests 622 to the set of DST execution units of the selected sub-vault, where the one or more sets of write slice requests includes the plurality of sets of encoded data slices, and receives access responses 624 that includes write slice responses indicating status of storage of the data object.

Having stored the data object, the DST client module 34 associates the data object with the selected sub-vault. The associating includes the DST client module 34 updating at least one of a DSN directory and a dispersed hierarchical index to associate a name of the data object with an identifier of the selected sub-vault.

When retrieving the data object, the DST client module 34 receives a request to recover the data object, where the request includes the name of the data object. Having received the request, the DST client module 34 identifies a vault based on the received name of the data object. The identifying includes accessing at least one of the DSN directory and the dispersed hierarchical index using the name of the data object to recover the identifier of the vault.

When the identified vault is a meta-vault (e.g., is indicated by and indicator such as a system registry, the DSN directory, and the dispersed hierarchical index), the DST client module 34 identifies a sub-vault for the requested data object. For example, the DST client module 34 accesses a dispersed hierarchical index associated with the meta-vault to recover an identifier of the sub-vault associated with storage of the data object.

Having identified the sub-vault, the DST client module 34 facilitates recovery of the data object from the identified sub-vault. For example, the DST client module 34 issues access requests 622, via the network 24, to the DST execution units of the identified sub-vault, where the access requests 622 includes read slice requests, receives access responses 624 that includes read slice responses, and dispersed storage error decodes a decode threshold number of encoded data slices for each set of encoded data slices of the plurality of sets of encoded data slices to reproduce the data object.

FIG. 48B is a flowchart illustrating an example of utilizing a vault structure in a dispersed storage network (DSN). The method begins or continues at step 626 where a processing module (e.g., of a distributed storage and task (DST) client module) receives a data object for storage in a meta-vault that includes at least two sub-vaults. The receiving includes receiving the data object and a data name of the data object. The receiving may further include determining that the data object is associated with the meta-vault based on a lookup.

The method continues at step 628 where the processing module selects one of the at least two sub-vaults for storage of the data object. The processing module selects the sub-vault based on a selection scheme. The method continues at step 630 where the processing module facilitates storage of the data object in the selected sub-vault. For example, the processing module dispersed storage error encodes the data object to produce encoded data slices and sends the encoded data slices to a set of storage units associated with the selected sub-vault.

The method continues at step 632 where the processing module associates the data object with the selected sub-vault. For example, the processing module updates at least one of a dispersed storage network directory and a dispersed hierarchical index to associate the data name with an identifier of the selected sub-vault.

When retrieving the data object, the method continues at step 634 where the processing module receives a request to recover the data object. The receiving includes receiving the data name of the data object. The method continues at step 636 where the processing module identifies a vault based on the received data name. For example, the processing module performs a lookup using the data name to produce an identifier of the vault.

When the identified vault is a meta-vault, the method continues at step 638 where the processing module identifies a sub-vault for the requested data object. The identifying includes determining that the vault is the meta-vault based on one or more of a system registry lookup, a table lookup, initiating a query, and receiving a query response; and performing a lookup using the data name and the identifier of the meta-vault to identify the sub-vault.

The method continues at step 640 of the processing module facilitates recovery of the data object from the identified sub-vault. For example, the processing module retrieves encoded data slices from the set of storage units associated with the identified sub-vault and dispersed storage error decodes the retrieved encoded data slices to reproduce the data object.

FIG. 49A is a schematic block diagram of another embodiment of a dispersed storage network (DSN) that includes the distributed storage and task (DST) processing unit 16 of FIG. 1, the network 24 of FIG. 1, and a plurality of DST execution (EX) unit pools 1-P. The DST processing unit 16 includes a decentralized agreement module 642 and the DST client module 34 of FIG. 1. The decentralized agreement module 642 may be implemented utilizing the decentralized agreement module 350 of FIG. 40A. Each DST execution unit pool includes a set of DST execution units 1-n. Each DST execution unit may be implemented utilizing the DST execution unit 36 of FIG. 1. Each DST execution unit includes a plurality of memory devices 1-M.

The DSN functions to receive data access requests, select resources of at least one DST execution unit pool for data access, utilize the selected DST execution unit pool for the data access, and issue a data access response based on the data access. The selecting of the resources includes utilizing a decentralized agreement function of the decentralized agreement module 642, where a plurality of storage resource locations are ranked against each other. The selecting may include selecting one storage pool of the plurality of storage pools, selecting DST execution units at various sites of a plurality of sites, selecting a memory of the plurality of memories for each DST execution unit, and selecting combinations of memories, DST execution units, sites, pillars, and storage pools.

In an example of operation, the DST client module 34 determines to perform a data access request. For example the DST client module 34 receives a data access request includes at least one of a store data request, a retrieve data request, a delete data request, a data name, and a requesting entity identifier (ID). Having determined to perform the data access request, the DST client module 34 determines a DSN address associated with the data access request. The DSN address includes at least one of a source name (e.g., including a vault ID and an object number associated with the data name), a data segment ID, a set of slice names, a plurality of sets of slice names. The determining includes at least one of generating (e.g., for the store data request) and retrieving (e.g., from a DSN directory) based on the data name (e.g., for the retrieve data request).

Having determined the DSN address, the DST client module 34 identifies a storage type associated with the data access request. The storage type includes at least one of storing a large object, storing a small object, storing a frequently accessed object, storing and infrequently accessed object, storing a high prioritized object, and storing a low prioritized object. The identifying includes at least one of interpreting an indicator of the request, comparing a size of the received data for storage to a size threshold, and accessing a historical record for the data object that indicates frequency of access. For example, the DST client module 34 identifies the frequently accessed object storage type based on interpreting the historical record of frequency of access.

Having determined the storage type, the DST client module 34 determines ranked scoring information for one or more resource levels of the plurality of DST execution unit pools based on the storage type. The determining includes identifying the one or more resource levels based on a DSN configuration, and for each level, issuing a ranked scoring information request 644 to the decentralized agreement module 642, where the request includes one or more of identifiers of storage resources associated with the level, weights of the storage resources for the storage type, and the DSN address as the asset identifier, and receiving the ranked scoring information 646. Each resource (e.g., memory device, storage unit, storage pool) has a weight value associated with each storage type. For example, memory device 1 of DST execution unit 1 of the DST execution unit pool 1 has a weight A associated with a small data object storage type, and a weight B associated with the frequently accessed data storage type, etc., through a weight Z for another data storage type. In an example of the determining the ranked scoring information 646, the DST client module 34 obtains ranked scoring information 646 for the plurality of storage pools for the frequently accessed object storage type as a first resource level, obtains ranked scoring information 646 for the DST execution units of a highest ranked storage pool as a second resource level, and obtains ranked scoring information 646 for memory devices of each DST execution unit associated with highest rankings as a third resource level.

For each of the one or more resource levels, the DST client module 34 selects a storage resource based on the ranked scoring information 646. For example, the DST client module 34 selects a storage pool associated with a highest score from the ranked scoring information of storage pools, selects a threshold number of DST execution units of the selected storage pool based on highest scores of the DST execution units from the ranked scoring information of the DST execution units of the selected storage pool, and for each selected DST execution unit, selects a memory device of the plurality of memory devices based on the highest scores of the ranked scoring information of the memory devices for the selected DST execution units.

Having selected the storage resources, the DST client module 34 accesses the selected DST execution unit pool utilizing the selected storage resources for each of the one or more resource levels. For example, the DST client module 34 issues, via the network 24, access requests 648 to the selected resources and receives access responses 650.

FIG. 49B is a flowchart illustrating an example of selecting storage resources. The method begins or continues at step 652 where a processing module (e.g., of a distributed storage and task (DST) client module) determines to perform data access in a dispersed storage network (DSN) memory. The determining includes at least one of receiving a request, determining to retrieve data, and determining to store data.

The method continues at step 654 where the processing module determines a DSN address associated with the data access. For example, the processing module performs a DSN directory lookup using a data name of the data of the data access. The method continues at step 656 where the processing module identifies a storage type associated with the data access. The identifying includes at least one of interpreting an indicator of the request, comparing a size of the received data for storage to a size threshold, and accessing a historical record for the data indicating frequency of access.

The method continues at step 658 where the processing module determines ranked scoring information for one or more resource levels of the DSN memory. The determining includes identifying one or more resource levels based on configuration information of the DSN memory, performing a decentralized agreement function on one or more of the DSN address as an asset identifier, identifiers of storage resources of the one or more resource levels, and weights of each storage resource based on the storage type.

For each of the one or more resource levels, the method continues at step 660 where the processing module selects storage resources based on the ranked scoring information. For example, the processing module identifies storage resources associated with a highest score versus peer resources of a common resource level. For example, by a storage pool, by a storage unit, and by memory devices.

The method continues at step 662 where the processing module accesses the DSN memory utilizing the selected storage resource for each of the one or more resource levels. For example, the processing module accesses selected memory devices of selected storage units of a selected storage pool.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data'). In addition, the terms "slice" and "encoded data slice" are used interchangeably.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more computing devices of a storage network, the method comprising:
    identifying a storage unit of a set of storage units for testing, wherein a data segment of data is error encoded into a set of encoded data slices that is stored in the set of storage units;
    determining whether a threshold number of favorably performing other storage units of the set of storage units will be available during the testing;
    when the threshold number of favorably performing other storage units will be available, initiating the testing of the storage unit and setting a status of the storage unit to unavailable;
    when the testing has been completed, updating the status of the storage unit to available; and
    generating a testing report regarding the testing of the storage unit.

2. The method of claim 1, wherein the identifying comprises interpreting an error message.

3. The method of claim 1, wherein the identifying comprises interpreting a previous test response.

4. The method of claim 1, wherein the identifying comprises interpreting a performance monitor.

5. The method of claim 1, wherein the determining whether the threshold number of favorably performing other storage units of the set of storage units will be available during the testing comprises:
    determining a threshold number;
    determining a number of the favorably performing other storage units;
    comparing the threshold number with the number; and
    when the number is equal to or greater than the threshold number, determining the threshold number of favorably performing other storage units will be available.

6. The method of claim 5, wherein the threshold number corresponds with a decode threshold number of encoded data slices needed to reconstruct the data segment.

7. The method of claim 1, wherein the initiating the testing comprises:
    issuing test tasks to the storage unit; and
    receiving test results from the storage unit.

8. The method of claim 7 further comprises:
    generating the testing report based on the received test results.

9. The method of claim 1, wherein the initiating the testing comprises:
    inhibiting access requests to the storage unit during the testing.

10. The method of claim 1, wherein the testing report comprises a memory utilization level of the storage unit.

11. The method of claim 1, wherein the testing report comprises a memory fragmentation level of the storage unit.

12. The method of claim 1, wherein the testing report comprises a number of vaults associated with the storage unit.

13. The method of claim 1, wherein the testing report comprises a number of namespace ranges supported by the storage unit.

14. The method of claim 1, wherein the testing report comprises a number of encoded data slices stored by the storage unit.

15. The method of claim 1, wherein the testing report comprises data storage statistics.

16. The method of claim 1, wherein the testing report comprises data retrieval statistics.

17. The method of claim 1, wherein the testing report comprises test failure rates.

18. The method of claim 1, wherein the identifying comprises receiving a request.

19. The method of claim 1, wherein the identifying comprises interpreting a schedule.

20. A computing device comprising:
    memory;
    an interface; and
    a processing module operably coupled to the memory and the interface, wherein the processing module is operable to:
        identify a storage unit of a set of storage units for testing, wherein a data segment of data is error encoded into a set of encoded data slices that is stored in the set of storage units;
        determine whether a threshold number of favorably performing other storage units of the set of storage units will be available during the testing;
        when the threshold number of favorably performing other storage units will be available, initiate the testing of the storage unit and setting a status of the storage unit to unavailable;
        when the testing has been completed, update the status to available; and
        generate a testing report regarding the testing of the storage unit.

* * * * *